US012720967B2

(12) United States Patent
Takasaki et al.

(10) Patent No.: US 12,720,967 B2
(45) Date of Patent: Aug. 25, 2026

(54) DISPLAY DEVICE AND MOTHER SUBSTRATE

(71) Applicant: Magnolia White Corporation, Tokyo (JP)

(72) Inventors: Ryota Takasaki, Tokyo (JP); Naoya Iwahashi, Tokyo (JP); Sho Yanagisawa, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 135 days.

(21) Appl. No.: 18/907,690

(22) Filed: Oct. 7, 2024

(65) Prior Publication Data

US 2025/0133912 A1 Apr. 24, 2025

(30) Foreign Application Priority Data

Oct. 18, 2023 (JP) ................................ 2023-179595

(51) Int. Cl.
*H10K 59/122* (2023.01)

(52) U.S. Cl.
CPC ................................ *H10K 59/122* (2023.02)

(58) Field of Classification Search
CPC .... H10K 59/122; H10K 59/124; H10K 59/87; H10K 59/10; H10K 59/80
See application file for complete search history.

(56) References Cited

U.S. PATENT DOCUMENTS 9,632,487 B2 * 4/2017 Kim .................... H10K 59/122
10,360,825 B1 * 7/2019 Wu ....................... H10D 86/60
12,433,097 B2 * 9/2025 Imai .................. H10K 59/1201
2004/0160170 A1 8/2004 Sato et al.
2006/0044502 A1 * 3/2006 Takagi ............. G02F 1/133377 349/129
2009/0009069 A1 1/2009 Takata
2017/0033312 A1 * 2/2017 Kim ..................... H10K 59/131
2018/0033998 A1 * 2/2018 Kim ..................... H10K 59/124
2019/0363275 A1 * 11/2019 Ochi ...................... H05B 33/02
2022/0077251 A1 3/2022 Choung et al.
2023/0232699 A1 * 7/2023 Mizukoshi ........... H10K 71/221 438/99

(Continued)

FOREIGN PATENT DOCUMENTS

JP 2000-195677 A 7/2000
JP 2004-207217 A 7/2004

(Continued)

*Primary Examiner* — Mary Ellen Bowman
(74) *Attorney, Agent, or Firm* — XSENSUS LLP

(57) ABSTRACT

According to one embodiment, a display device includes an organic insulating layer provided over a display area and a surrounding area, a lower electrode, an inorganic insulating layer, an organic layer, an upper electrode, and surrounding partitions provided in the surrounding area. Each of the surrounding partitions has a first lower portion located on the inorganic insulating layer, and a first upper portion located on the first lower portion and protruding from a side surface of the first lower portion. The organic insulating layer has a recess portion. The surrounding partitions include a first partition which overlaps the recess portion. A distance from the first upper portion of the first partition to an edge portion of the recess portion is greater than or equal to 50 μm.

20 Claims, 50 Drawing Sheets

(56) References Cited

U.S. PATENT DOCUMENTS

2023/0320178 A1* 10/2023 Park .................... H10K 59/121
257/40

FOREIGN PATENT DOCUMENTS

| | | |
|---|---|---|
| JP | 2008-135325 A | 6/2008 |
| JP | 2009-032673 A | 2/2009 |
| JP | 2010-118191 A | 5/2010 |
| WO | 2018/179308 A1 | 10/2018 |

* cited by examiner

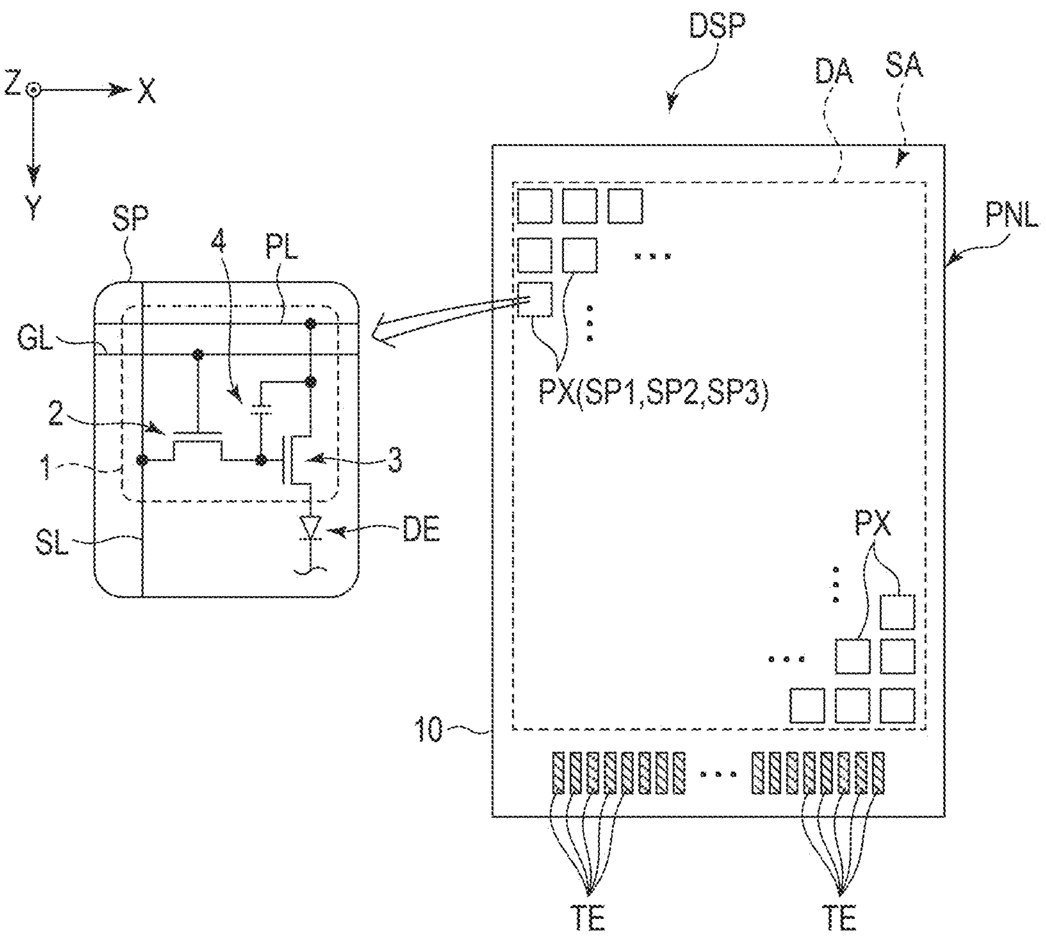
F I G. 1

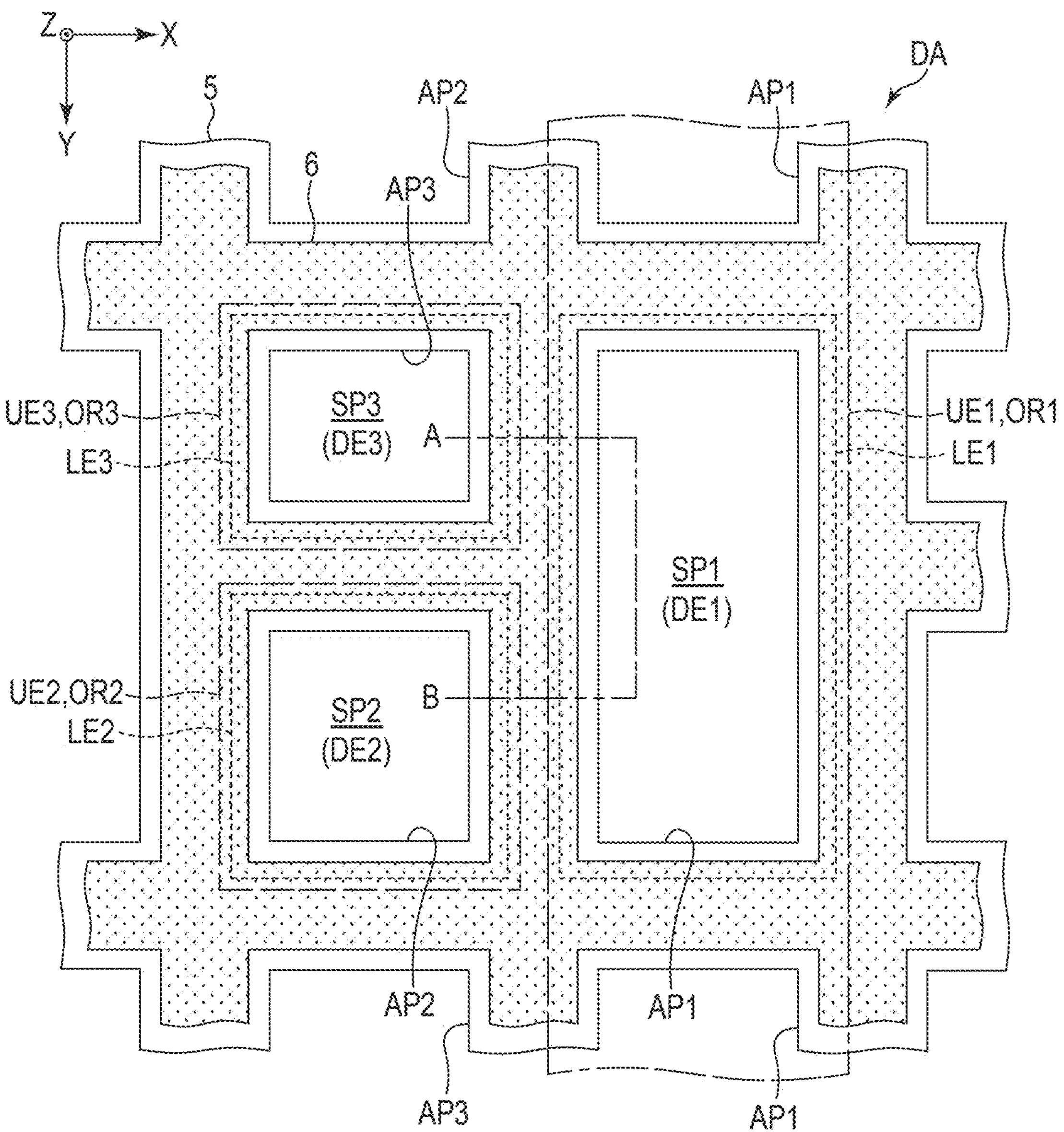
F I G. 2

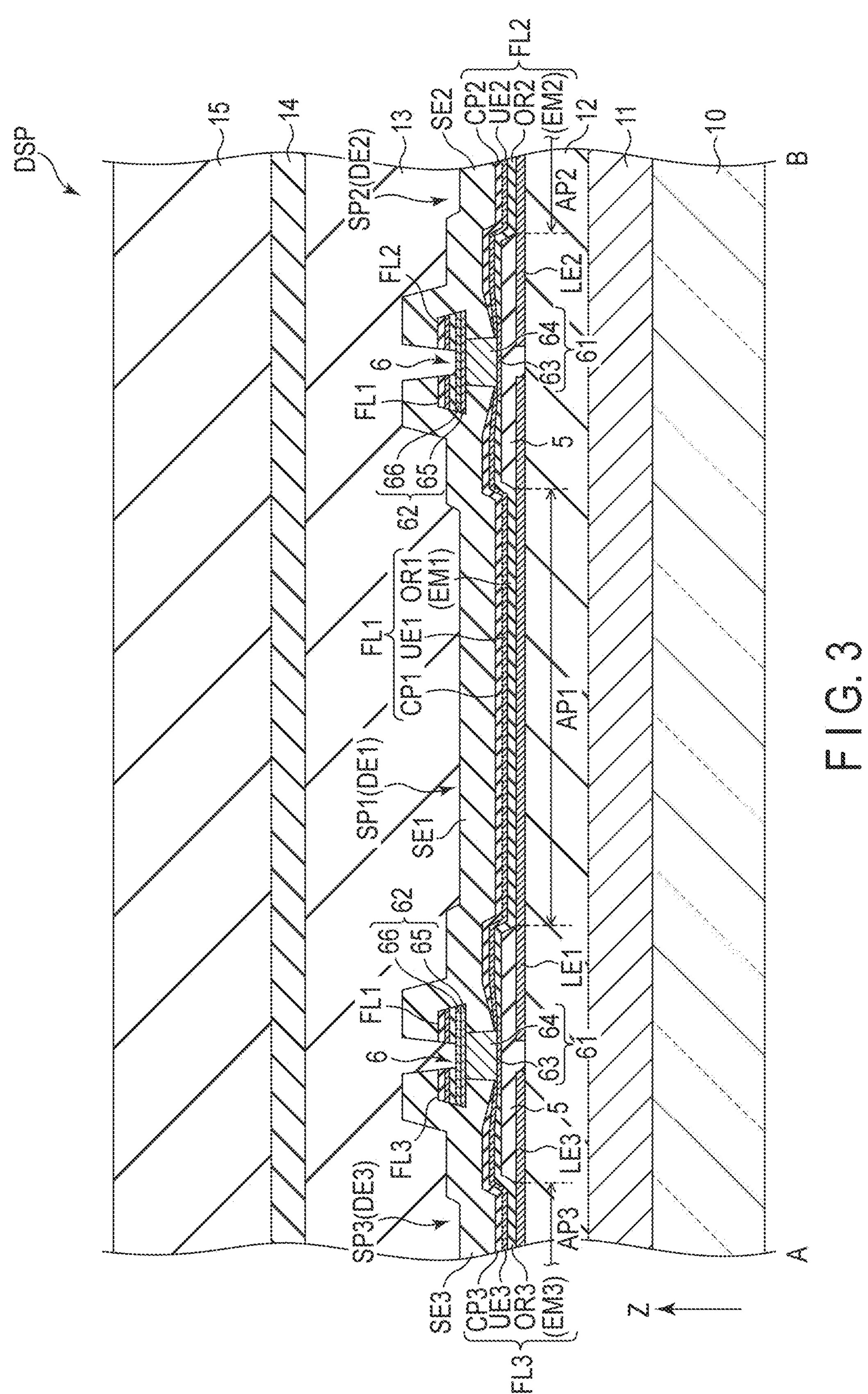
F I G. 3

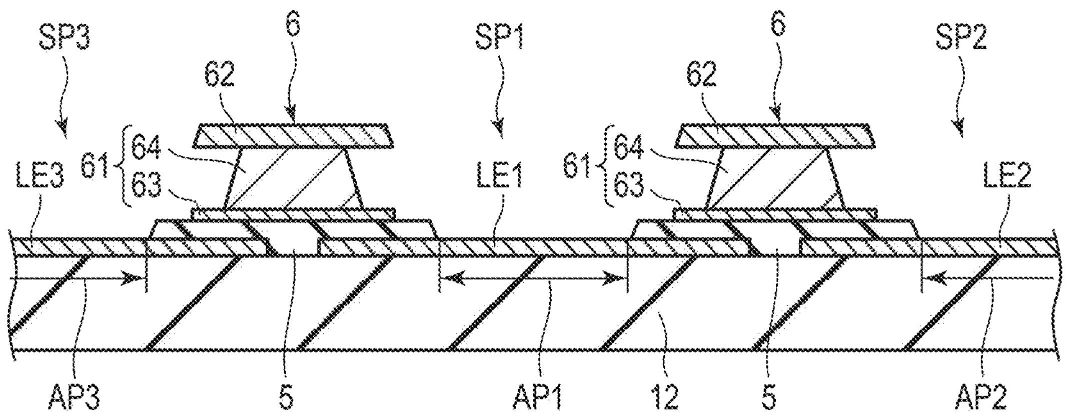
F I G. 4
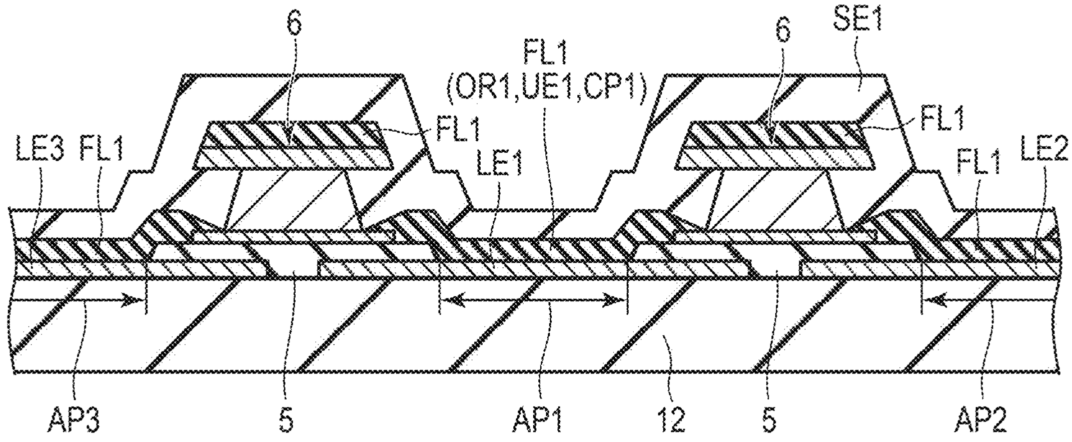
F I G. 5

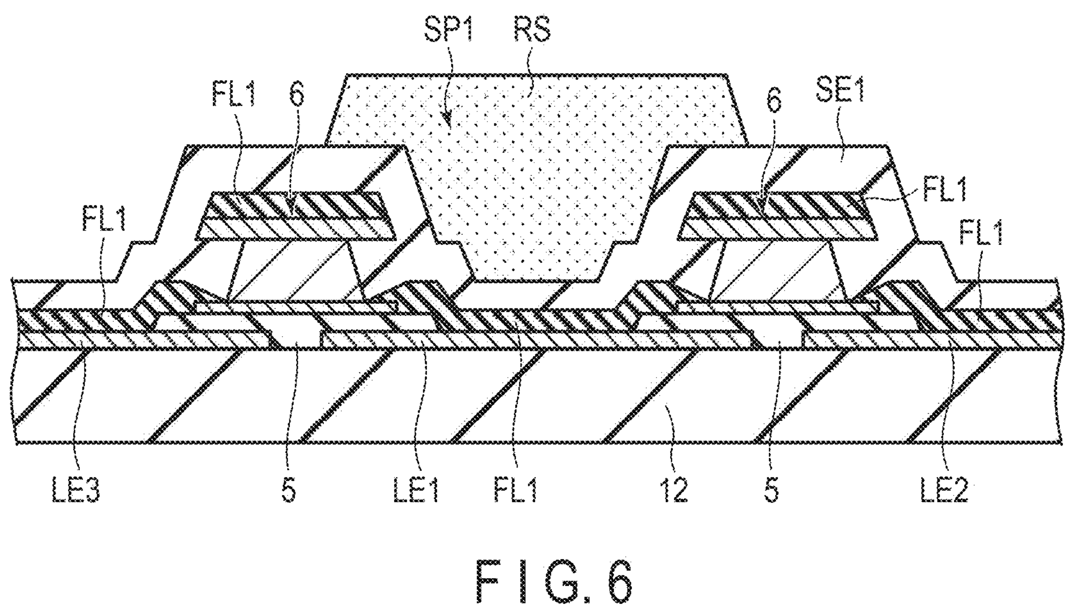
F I G. 6
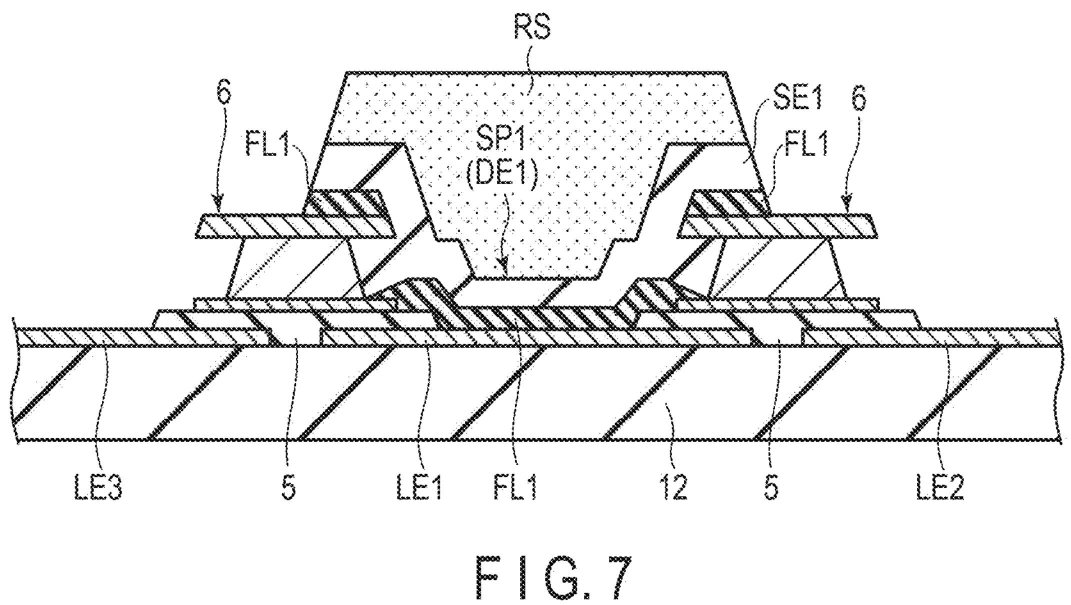
F I G. 7

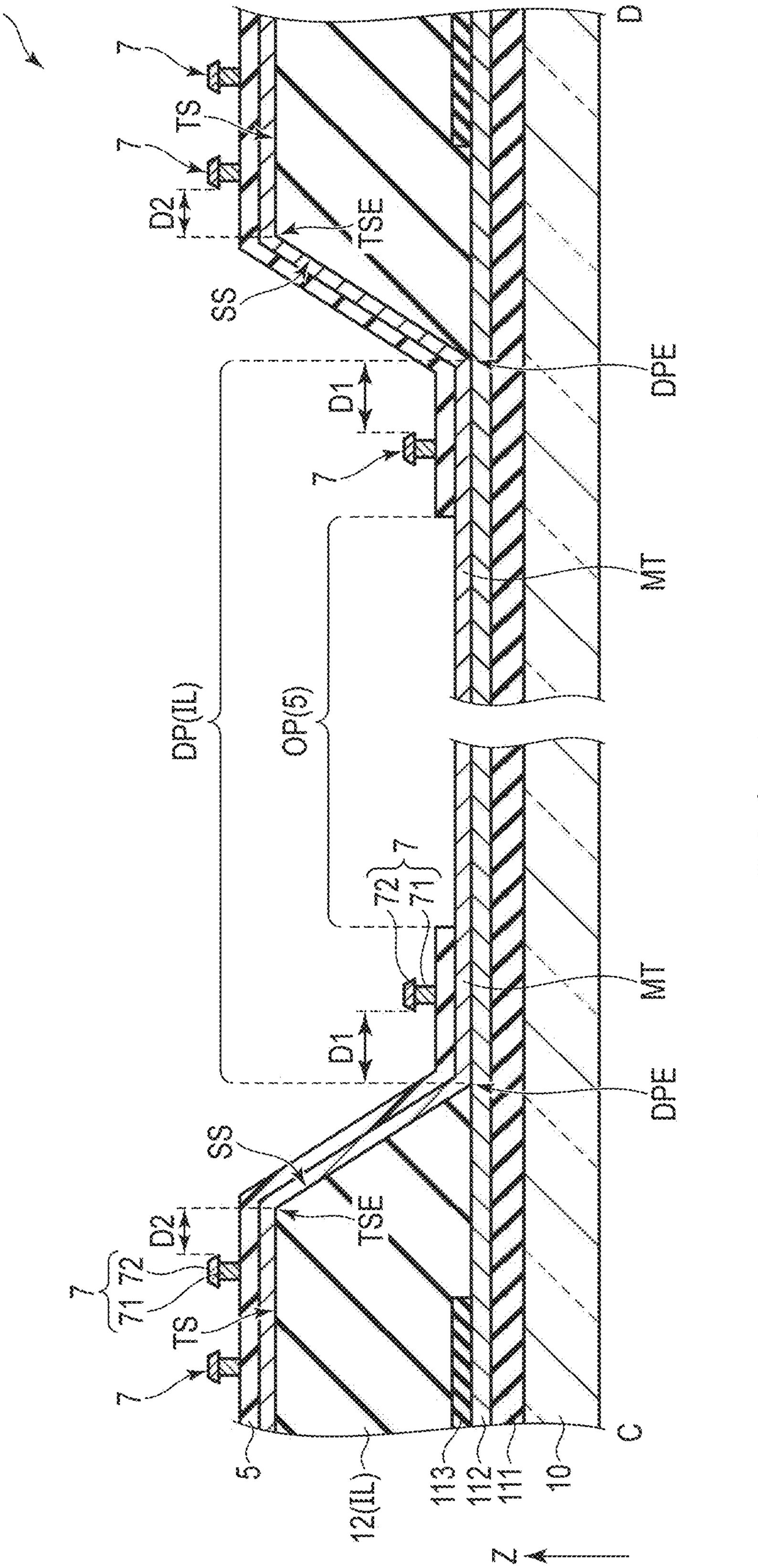
F I G. 14

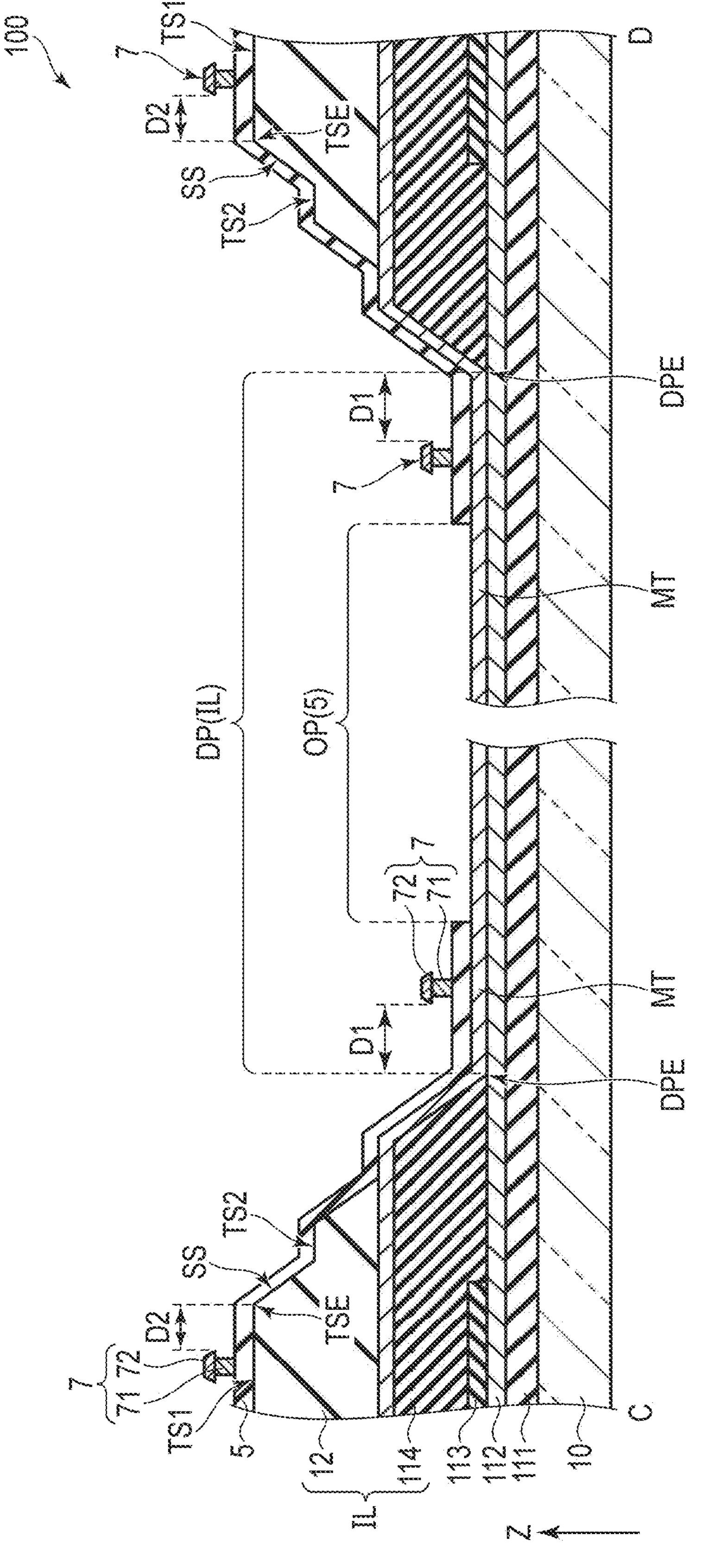
F I G. 15

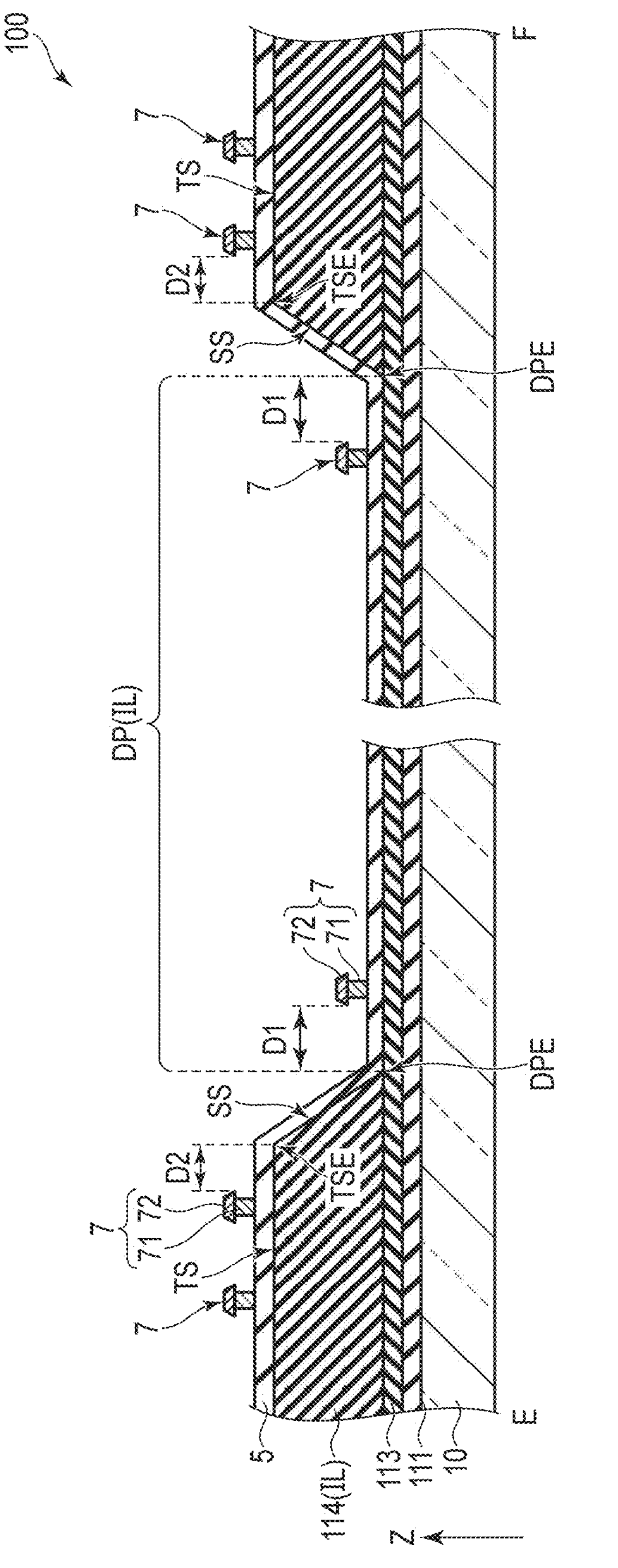
F I G. 21

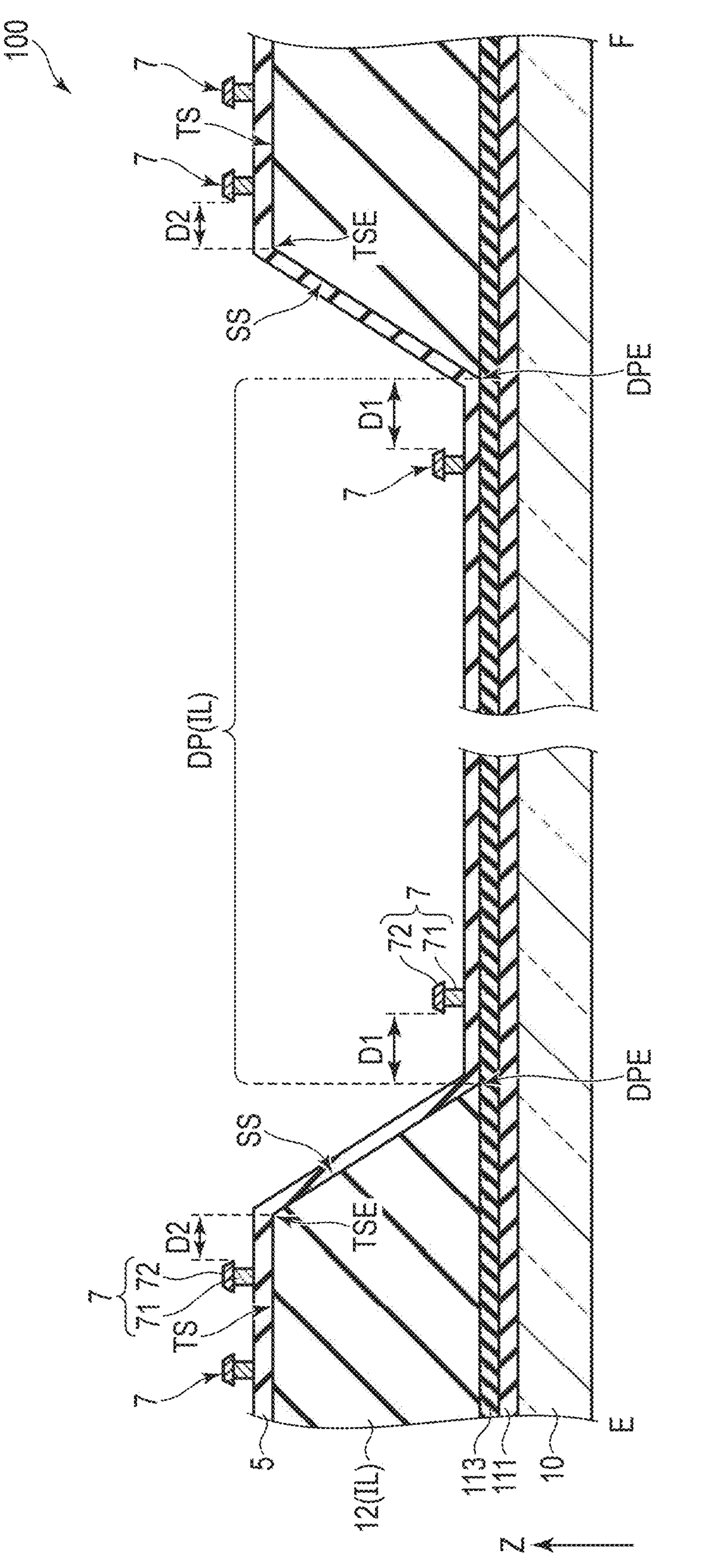
F I G. 22

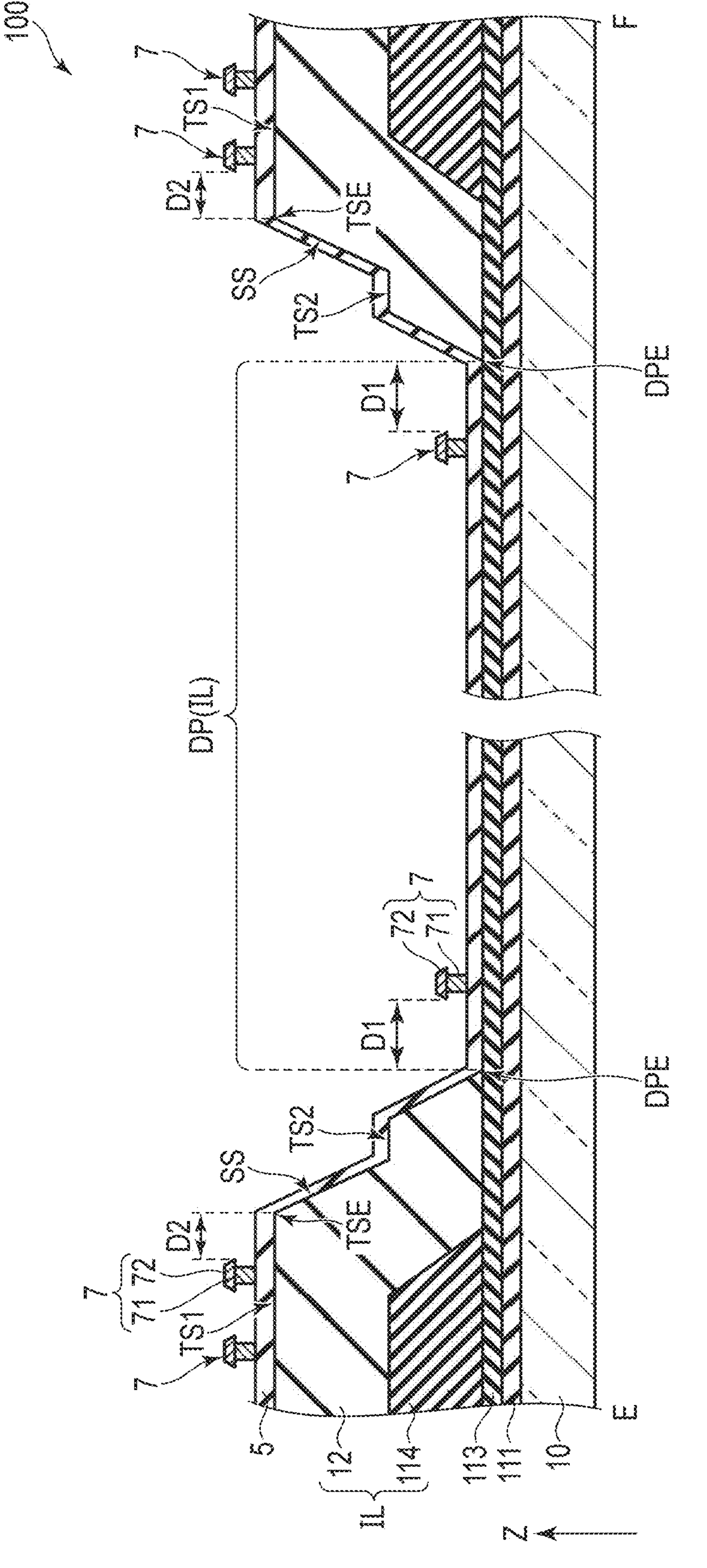
F I G. 24

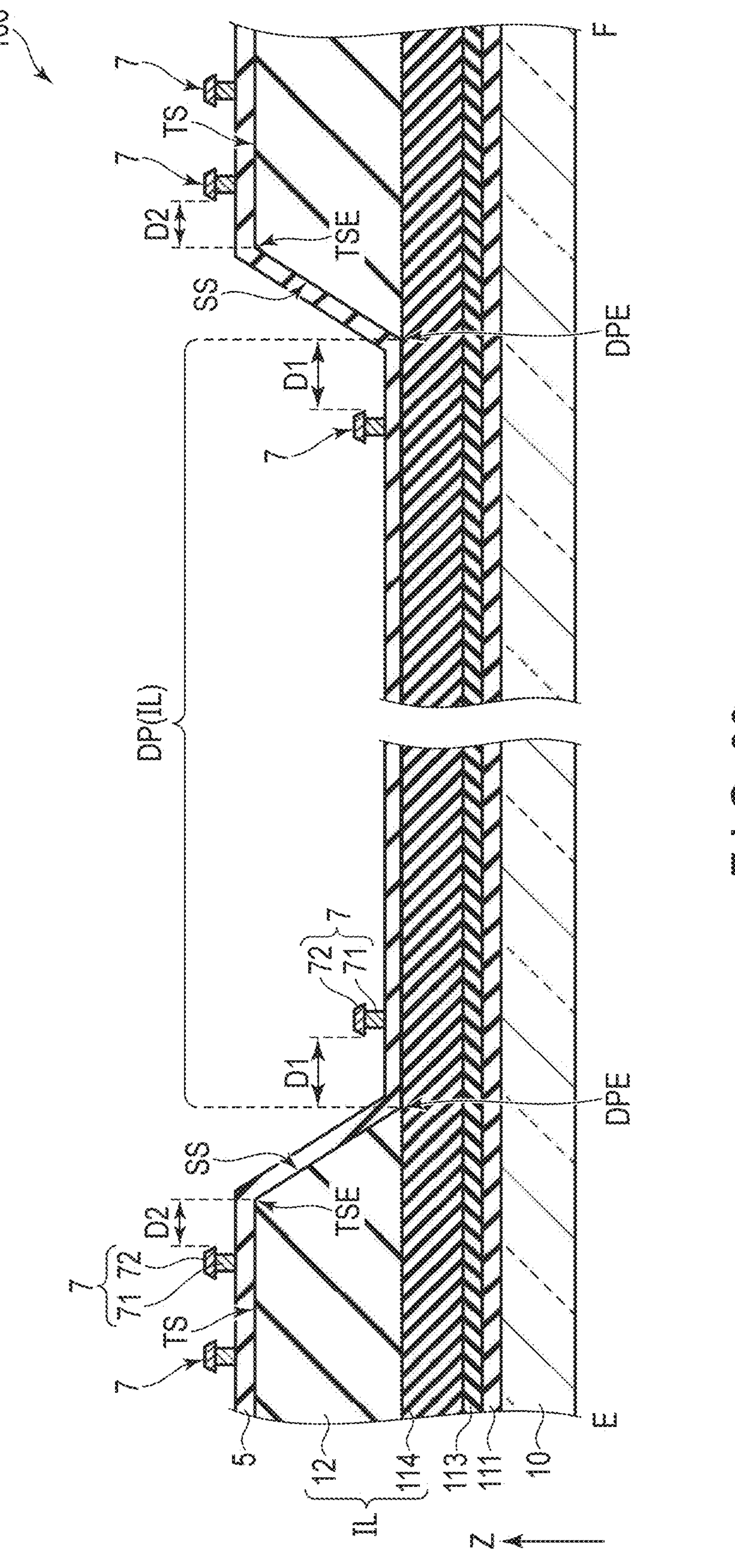
F I G. 30

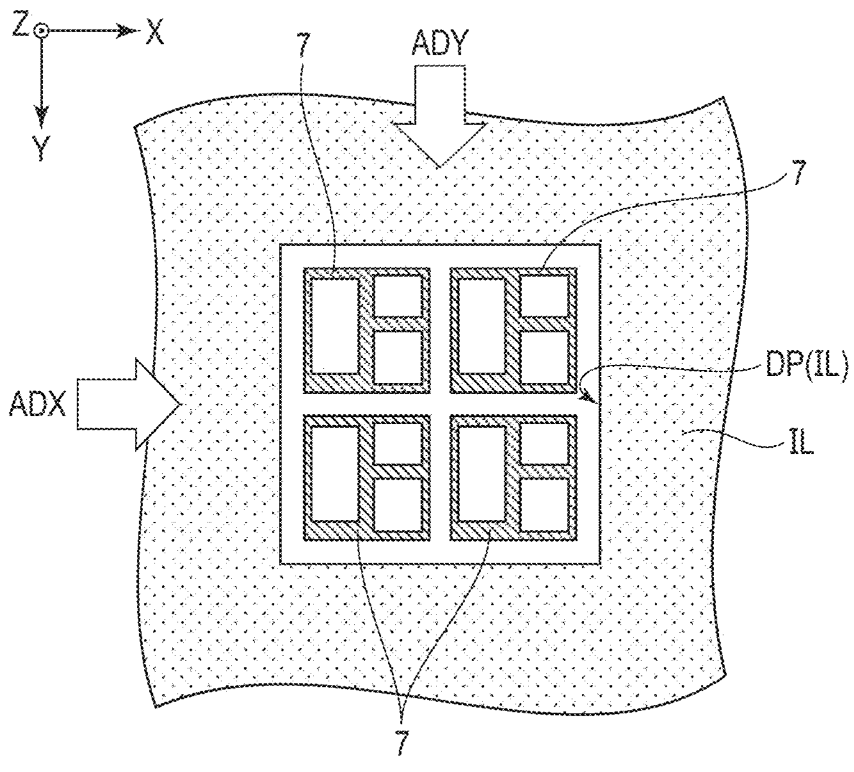
F I G. 33
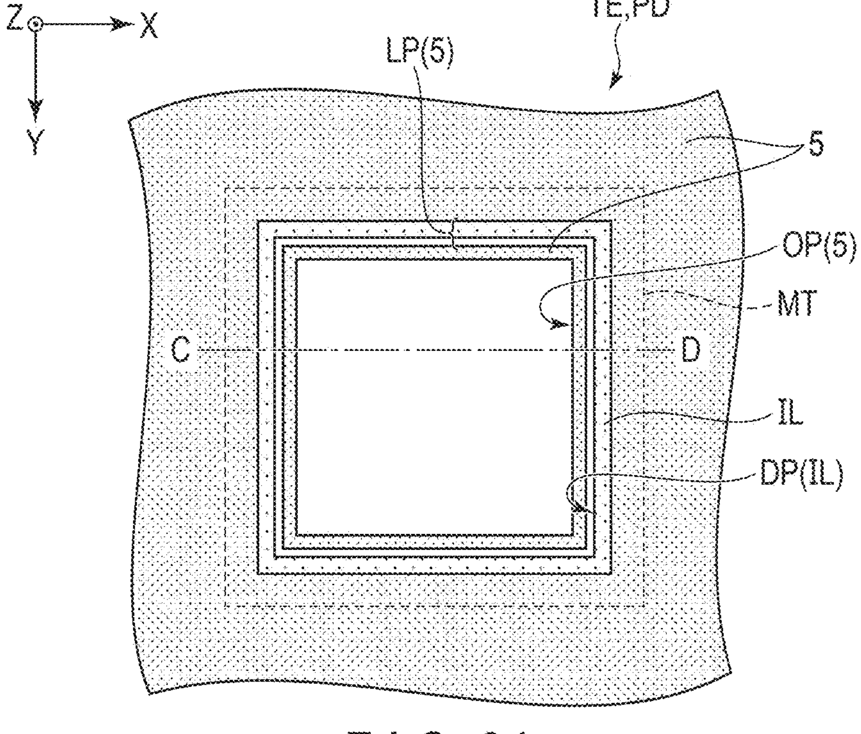
F I G. 34

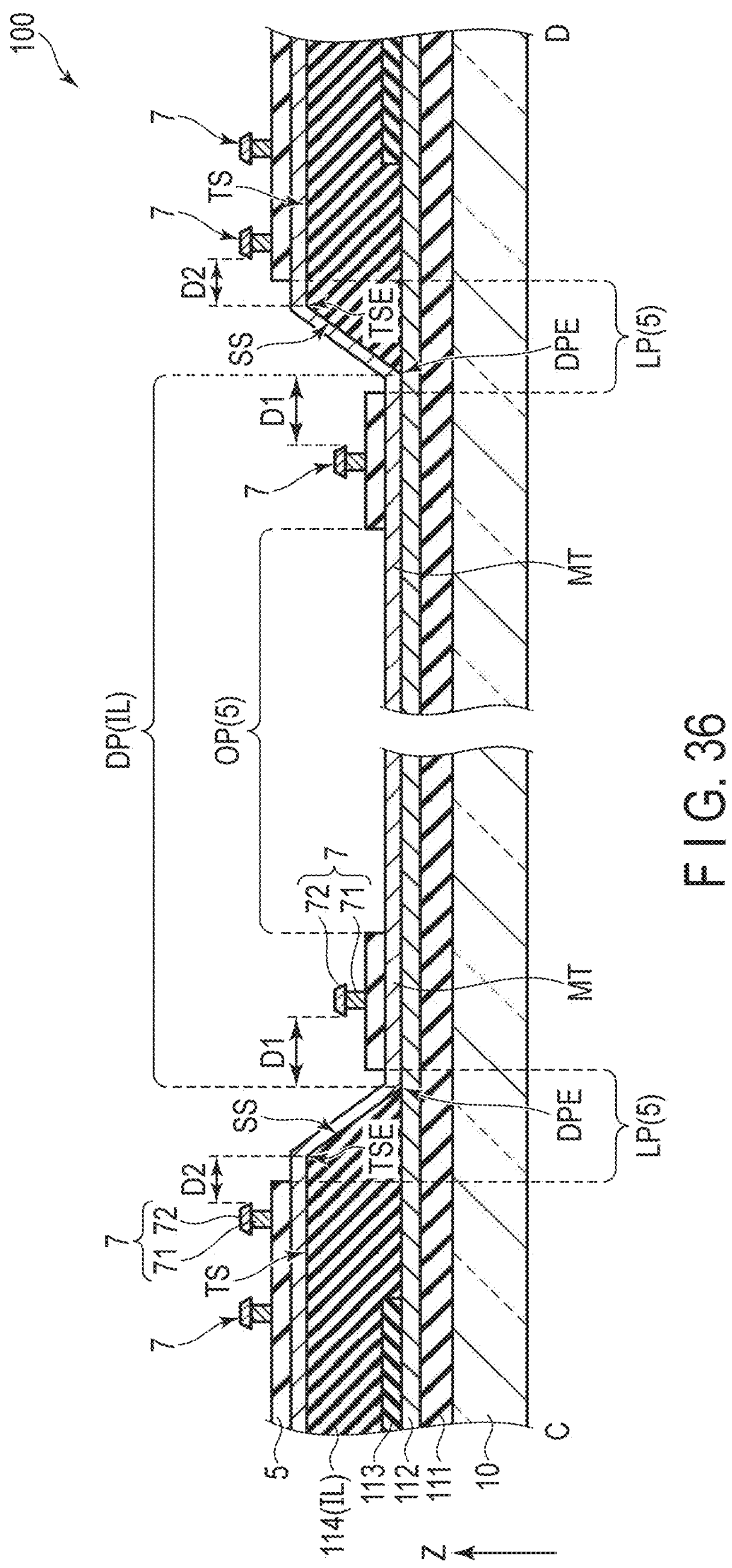
F I G. 36

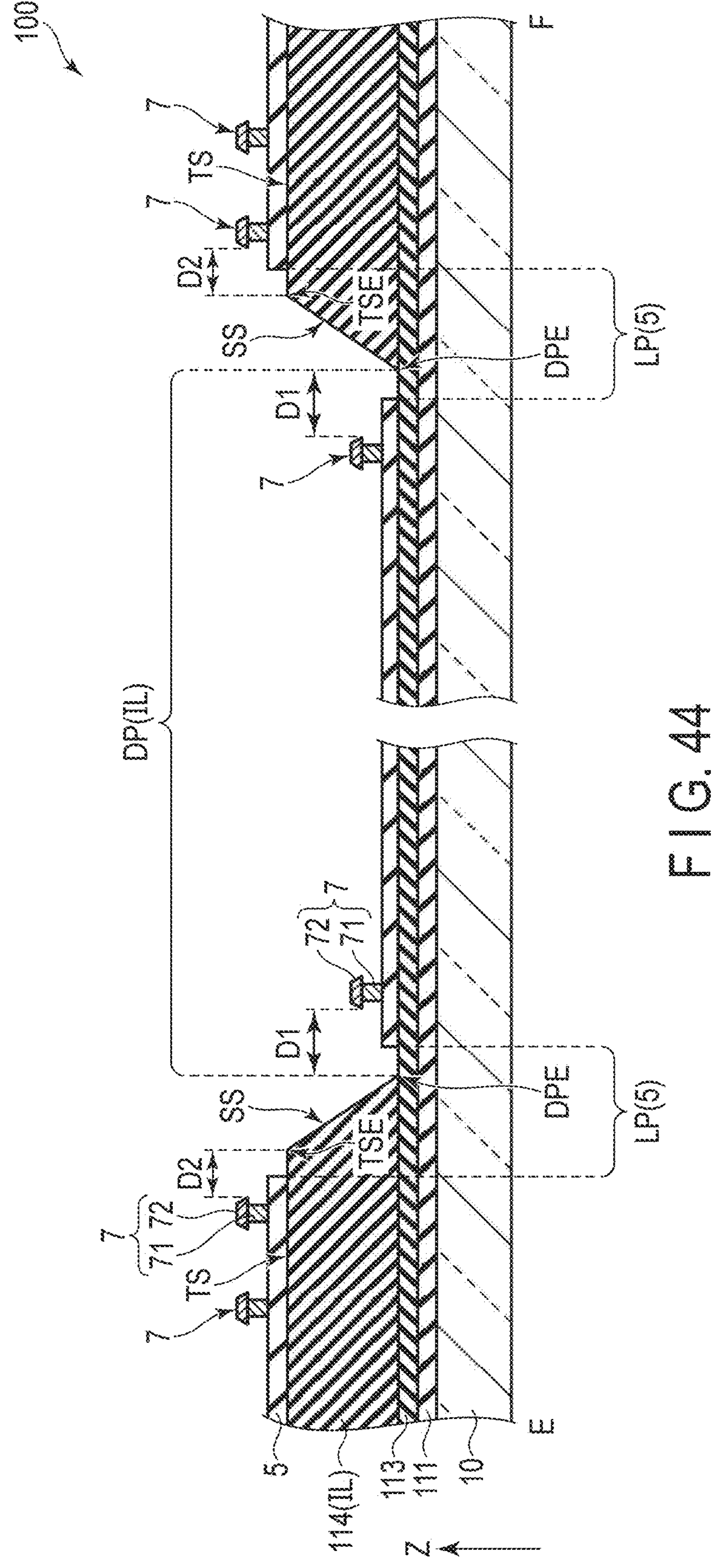
F I G. 44

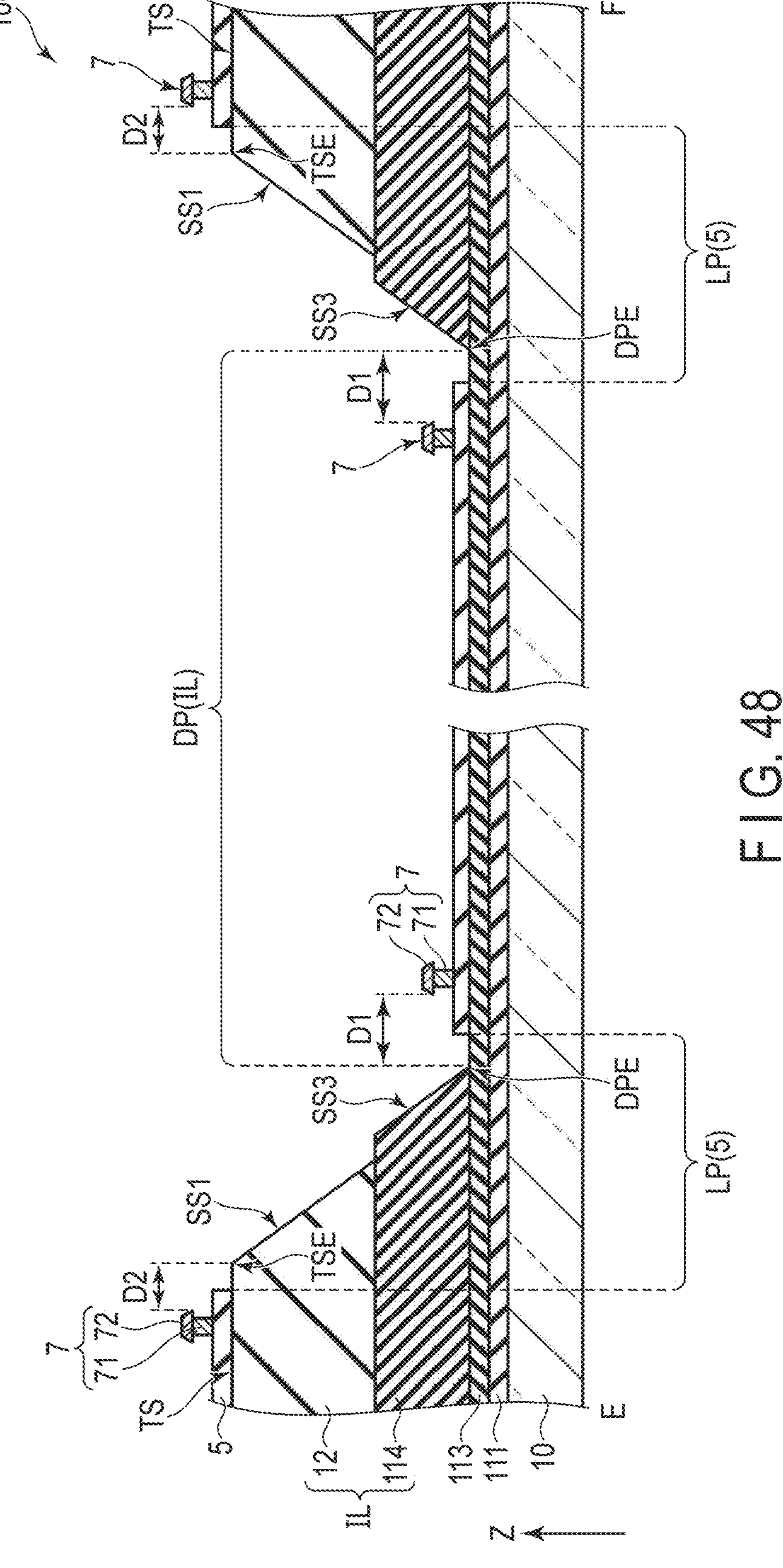
F I G. 48

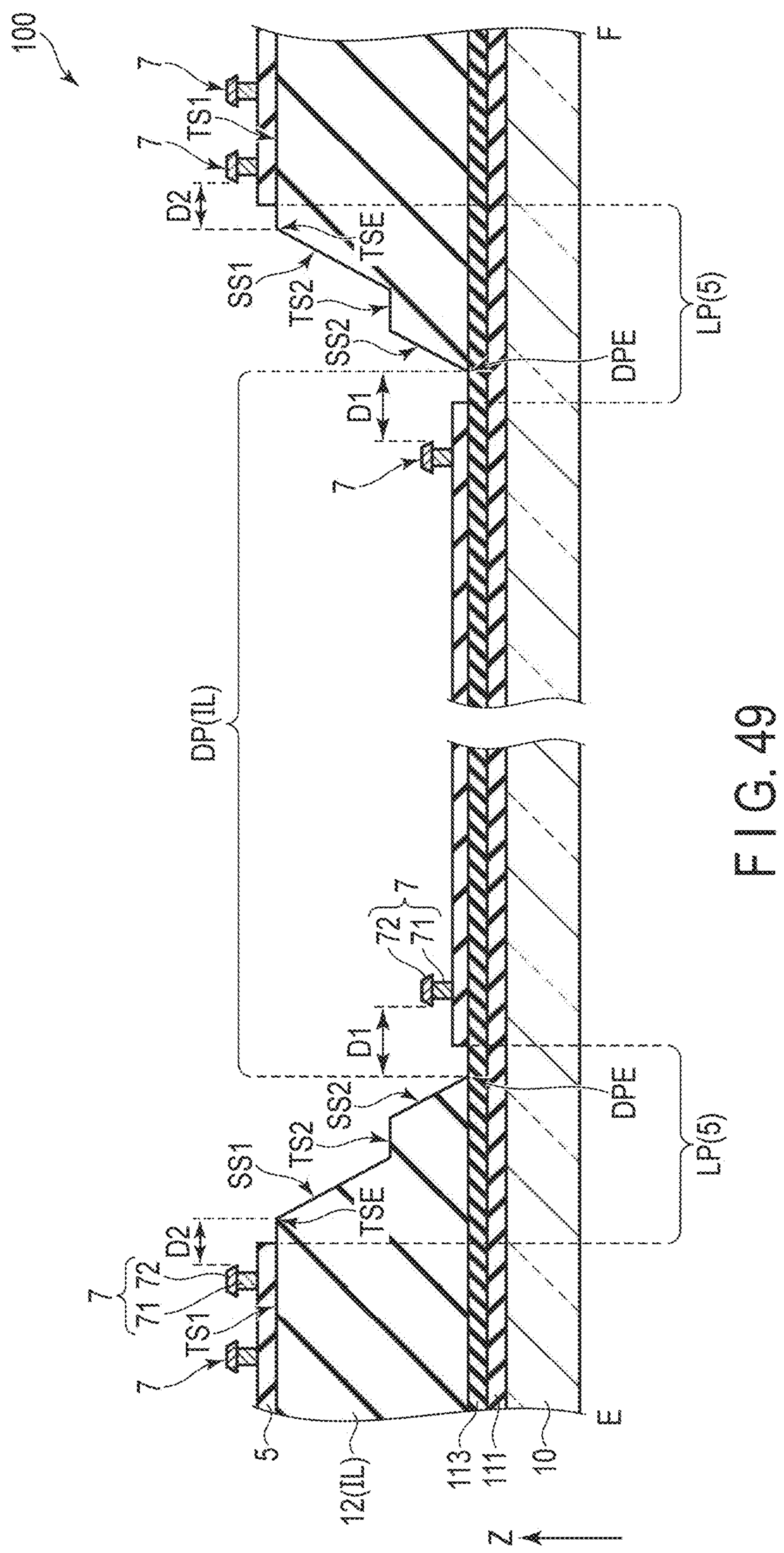
F I G. 49

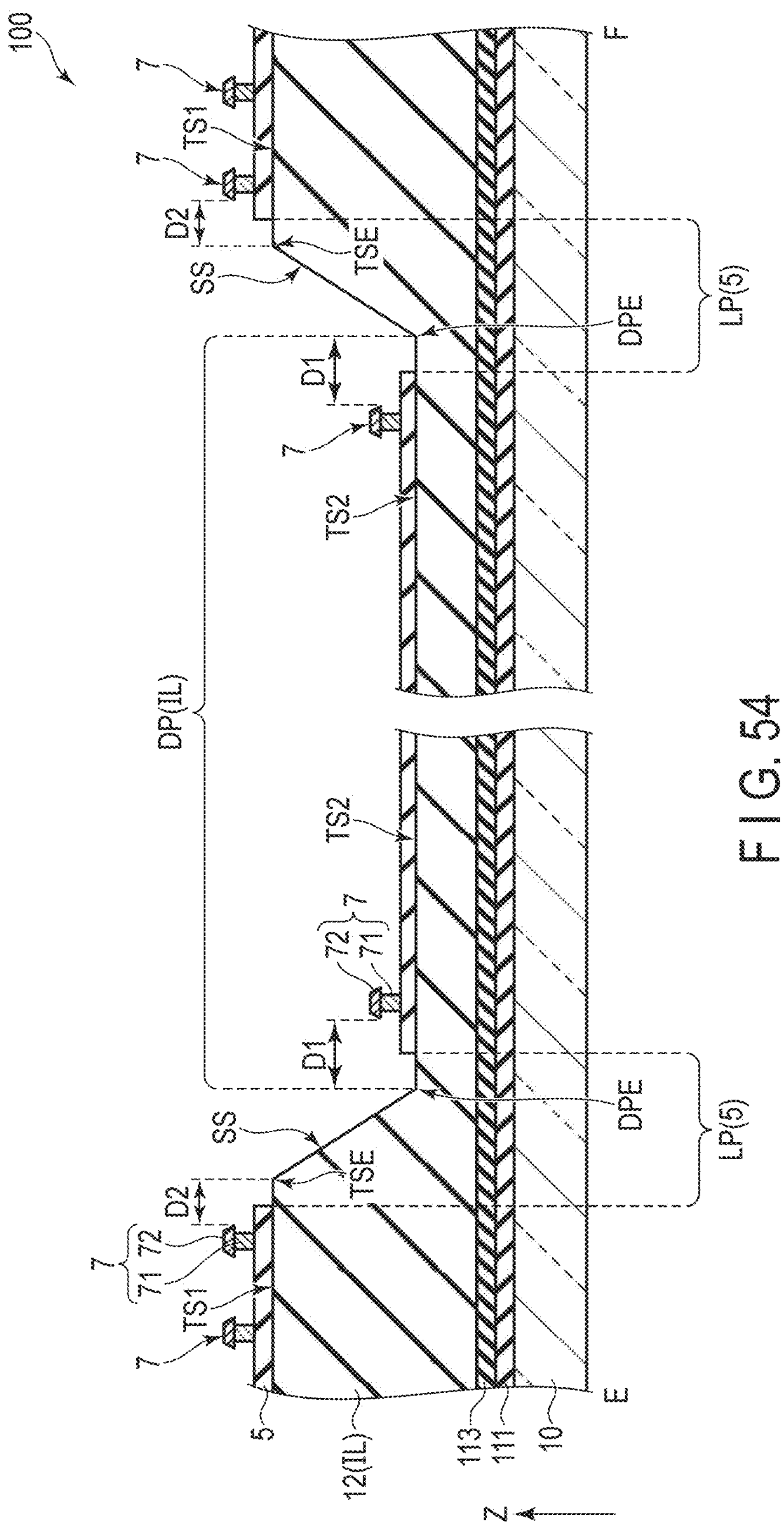
F I G. 54

DISPLAY DEVICE AND MOTHER SUBSTRATE

CROSS-REFERENCE TO RELATED APPLICATION

This application is based upon and claims the benefit of priority from Japanese Patent Application No. 2023-179595, filed Oct. 18, 2023, the entire contents of which are incorporated herein by reference.

FIELD

Embodiments described herein relate generally to a display device and a mother substrate.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole transport layer and an electron transport layer in addition to a light emitting layer.

In the process of manufacturing such a display element, a technique which prevents the reduction in reliability has been required.

BRIEF DESCRIPTION OF THE DRAWINGS

FIG. 1 is a diagram showing a configuration example of a display device DSP.

FIG. 2 is a diagram showing an example of the layout of subpixels SP1, SP2 and SP3.

FIG. 3 is a schematic cross-sectional view of the display device DSP along the A-B line of FIG. 2.

FIG. 4 is a diagram for explaining the manufacturing method of the display device DSP.

FIG. 5 is a diagram for explaining the manufacturing method of the display device DSP.

FIG. 6 is a diagram for explaining the manufacturing method of the display device DSP.

FIG. 7 is a diagram for explaining the manufacturing method of the display device DSP.

FIG. 14 is a cross-sectional view showing another configuration example of the mother substrate 100.

FIG. 15 is a cross-sectional view showing another configuration example of the mother substrate 100.

FIG. 21 is a cross-sectional view showing another configuration example of the mother substrate 100.

FIG. 22 is a cross-sectional view showing another configuration example of the mother substrate 100.

FIG. 24 is a cross-sectional view showing another configuration example of the mother substrate 100.

FIG. 30 is a cross-sectional view showing another configuration example of the mother substrate 100.

FIG. 33 is a plan view showing an example of surrounding partitions 7 provided in the recess portion DP of an organic insulating layer IL.

FIG. 34 is a plan view showing another configuration example of the pad PD or the terminal TE.

FIG. 36 is a cross-sectional view showing another configuration example of the mother substrate 100.

FIG. 44 is a cross-sectional view showing another configuration example of the mother substrate 100.

FIG. 48 is a cross-sectional view showing another configuration example of the mother substrate 100.

FIG. 49 is a cross-sectional view showing another configuration example of the mother substrate 100.

FIG. 54 is a cross-sectional view showing another configuration example of the mother substrate 100.

DETAILED DESCRIPTION

Figure 8:
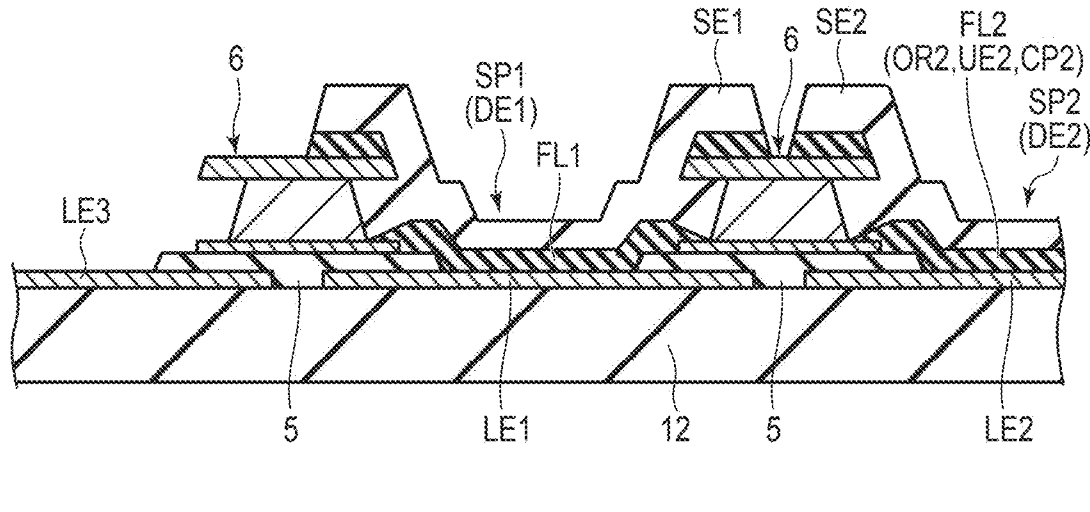
FIG. 8 is a diagram for explaining the manufacturing method of the display device DSP.

Embodiments described herein aim to provide a display device and a mother substrate such that the reduction in reliability can be prevented.

In general, according to one embodiment, a display device comprises a substrate, an organic insulating layer provided over a display area displaying an image and a surrounding area on an external side relative to the display area above the substrate, a lower electrode provided on the organic insulating layer in the display area, an inorganic insulating layer provided on the organic insulating layer and covering a peripheral portion of the lower electrode, an organic layer provided on the lower electrode and including a light emitting layer, an upper electrode provided on the organic layer, and a plurality of surrounding partitions provided in the surrounding area. Each of the surrounding partitions has a first lower portion located on the inorganic insulating layer, and a first upper portion located on the first lower portion and protruding from a side surface of the first lower portion. The organic insulating layer has a flat upper surface and a recess portion which is concave relative to the upper surface in the surrounding area. The surrounding partitions include a first partition which overlaps the recess portion. A distance from the first upper portion of the first partition to an edge portion of the recess portion is greater than or equal to 50 μm.

According to another embodiment, a display device comprises a substrate, an organic insulating layer provided over a display area displaying an image and a surrounding area on an external side relative to the display area above the substrate, a lower electrode provided on the organic insulating layer in the display area, an inorganic insulating layer provided on the organic insulating layer and covering a peripheral portion of the lower electrode, an organic layer provided on the lower electrode and including a light emitting layer, an upper electrode provided on the organic layer, and a plurality of surrounding partitions provided in the surrounding area. Each of the surrounding partitions has a first lower portion located on the inorganic insulating layer, and a first upper portion located on the first lower portion and protruding from a side surface of the first lower portion. The organic insulating layer has a flat upper surface, a recess portion which is concave relative to the upper surface and a slope which surrounds the recess portion in the surrounding area. The surrounding partitions include a first partition which overlaps the recess portion and a second partition which overlaps the upper surface. The inorganic insulating layer has a removed portion which overlaps the slope.

According to yet another embodiment, a mother substrate comprises a panel portion which has a display area displaying an image and a surrounding area on an external side relative to the display area, a margin portion on an external side relative to the panel portion, an organic insulating layer provided over the panel portion and the margin portion, a lower electrode provided on the organic insulating layer in the display area, an inorganic insulating layer provided on the organic insulating layer and covering a peripheral portion of the lower electrode, an organic layer provided on the lower electrode and including a light emitting layer, an upper electrode provided on the organic layer, and a plurality of surrounding partitions provided in the surrounding area and the margin portion. Each of the surrounding partitions has a first lower portion located on the inorganic insulating layer and a first upper portion located on the first lower portion and protruding from a side surface of the first lower portion. The organic insulating layer has a flat upper surface and a recess portion which is concave relative to the upper surface in the surrounding area or the margin portion. The surrounding partitions include a first partition which overlaps the recess portion. A distance from the first upper portion of the first partition to an edge portion of the recess portion is greater than or equal to 50 μm.

According to yet another embodiment, a mother substrate comprises a panel portion which has a display area displaying an image and a surrounding area on an external side relative to the display area, a margin portion on an external side relative to the panel portion, an organic insulating layer provided over the panel portion and the margin portion, a lower electrode provided on the organic insulating layer in the display area, an inorganic insulating layer provided on the organic insulating layer and covering a peripheral portion of the lower electrode, an organic layer provided on the lower electrode and including a light emitting layer, an upper electrode provided on the organic layer, and a plurality of surrounding partitions provided in the surrounding area and the margin portion. Each of the surrounding partitions has a first lower portion located on the inorganic insulating layer and a first upper portion located on the first lower portion and protruding from a side surface of the first lower portion. The organic insulating layer has a flat upper surface, a recess portion which is concave relative to the upper surface and a slope which surrounds the recess portion in the surrounding area or the margin portion. The surrounding partitions include a first partition which overlaps the recess portion and a second partition which overlaps the upper portion. The inorganic insulating layer has a removed portion which overlaps the slope.

The embodiments can provide a display device and a mother substrate such that the reduction in reliability can be prevented.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. When various elements are viewed parallel to the third direction Z, the appearance is defined as a plan view.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display panel PNL having a display area DA which displays an image and a surrounding area SA located on an external side relative to the display area DA on an insulating substrate 10. The substrate 10 may be glass or a resinous film having flexibility.

In the embodiment, the substrate 10 is rectangular in plan view. It should be noted that the shape of the substrate 10 in plan view is not limited to a rectangle and may be another shape such as a square, a circle or an oval.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. Each of the pixel switch 2 and the drive transistor 3 is, for example, a switching element consisting of a thin-film transistor.

The gate electrode of the pixel switch 2 is connected to a scanning line GL. One of the source electrode and the drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element DE.

It should be noted that the configuration of the pixel circuit 1 is not limited to the example shown in the figure. For example, the pixel circuit 1 may comprise more thin-film transistors and capacitors.

The display element DE is an organic light emitting diode (OLED) as a light emitting element, and may be called an organic EL element.

The surrounding area SA comprises a plurality of terminals TE which are arranged along one direction. In the example shown in the figure, the terminals TE are arranged in the first direction X. Each of the terminals TE extends in the second direction Y. However, the configuration is not limited to this example. For example, some of the terminals TE may extend in an oblique direction. For example, these terminals TE are electrically connected to a flexible printed circuit substrate or an IC chip.

FIG. 2 is a diagram showing an example of the layout of subpixels SP1, SP2 and SP3.

In the example shown in the figure, subpixels SP2 and SP3 are arranged in the second direction Y. Subpixels SP1 and SP2 are arranged in the first direction X, and subpixels SP1 and SP3 are arranged in the first direction X.

When subpixels SP1, SP2 and SP3 are provided in line with this layout, a column in which subpixels SP2 and SP3 are alternately provided in the second direction Y and a column in which a plurality of subpixels SP1 are provided in the second direction Y are formed in the display area DA. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

An inorganic insulating layer 5 and a partition 6 are provided in the display area DA. The inorganic insulating layer 5 has apertures AP1, AP2 and AP3 in subpixels SP1, SP2 and SP3, respectively. The inorganic insulating layer 5 having these apertures AP1, AP2 and AP3 may be called a rib.

The partition 6 overlaps the inorganic insulating layer 5 in plan view. The partition 6 is formed into a grating shape surrounding the apertures AP1, AP2 and AP3. In other words, the partition 6 has apertures in subpixels SP1, SP2 and SP3 in a manner similar to that of the inorganic insulating layer 5. The partition 6 is conductive and is electrically connected to, of the terminals TE shown in FIG. 1, each terminal TE having a common potential.

Subpixels SP1, SP2 and SP3 comprise display elements DE1, DE2 and DE3, respectively, as the display elements DE.

The display element DE1 of subpixel SP1 comprises a lower electrode LE1, an upper electrode UE1 and an organic layer OR1 overlapping the aperture AP1. The peripheral portion of the lower electrode LE1 is covered with the inorganic insulating layer 5. The lower electrode LE1, the organic layer OR1 and the upper electrode UE1 are surrounded by the partition 6 in plan view. The peripheral portion of each of the organic layer OR1 and the upper electrode UE1 overlaps the inorganic insulating layer 5 in plan view. The organic layer OR1 includes a light emitting layer which emits light in, for example, a blue wavelength range.

The display element DE2 of subpixel SP2 comprises a lower electrode LE2, an upper electrode UE2 and an organic layer OR2 overlapping the aperture AP2. The peripheral portion of the lower electrode LE2 is covered with the inorganic insulating layer 5. The lower electrode LE2, the organic layer OR2 and the upper electrode UE2 are surrounded by the partition 6 in plan view. The peripheral portion of each of the organic layer OR2 and the upper electrode UE2 overlaps the inorganic insulating layer 5 in plan view. The organic layer OR2 includes a light emitting layer which emits light in, for example, a green wavelength range.

The display element DE3 of subpixel SP3 comprises a lower electrode LE3, an upper electrode UE3 and an organic layer OR3 overlapping the aperture AP3. The peripheral portion of the lower electrode LE3 is covered with the inorganic insulating layer 5. The lower electrode LE3, the organic layer OR3 and the upper electrode UE3 are surrounded by the partition 6 in plan view. The peripheral portion of each of the organic layer OR3 and the upper electrode UE3 overlaps the inorganic insulating layer 5 in plan view. The organic layer OR3 includes a light emitting layer which emits light in, for example, a red wavelength range.

In the example shown in the figure, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. It should be noted that the outer shape of each of the lower electrodes, the organic layers and the upper electrodes shown in the figure does not necessarily reflect the accurate shape.

The lower electrodes LE1, LE2 and LE3 correspond to, for example, the anodes of the display elements. The upper electrodes UE1, UE2 and UE3 correspond to the cathodes of the display elements or a common electrode and are in contact with the partition 6.

The lower electrode LE1 is electrically connected to the pixel circuit 1 (see FIG. 1) of subpixel SP1. The lower electrode LE2 is electrically connected to the pixel circuit 1 of subpixel SP2. The lower electrode LE3 is electrically connected to the pixel circuit 1 of subpixel SP3.

In the example shown in the figure, the area of the aperture AP1, the area of the aperture AP2 and the area of the aperture AP3 are different from each other. The area of the aperture AP1 is greater than that of the aperture AP2, and the area of the aperture AP2 is greater than that of the aperture AP3. In other words, the area of the lower electrode LE1 exposed from the aperture AP1 is greater than that of the lower electrode LE2 exposed from the aperture AP2. The area of the lower electrode LE2 exposed from the aperture AP2 is greater than that of the lower electrode LE3 exposed from the aperture AP3.

FIG. 3 is a schematic cross-sectional view of the display device DSP along the A-B line of FIG. 2.

A circuit layer 11 is provided on the substrate 10. The circuit layer 11 includes various circuits such as the pixel circuit 1 shown in FIG. 1 and various lines such as the scanning line GL, the signal line SL and the power line PL. The circuit layer 11 is covered with an insulating layer 12. The insulating layer 12 is an organic insulating layer which planarizes the irregularities formed by the circuit layer 11.

The lower electrodes LE1, LE2 and LE3 are provided on the insulating layer 12 and are spaced apart from each other. The inorganic insulating layer 5 is provided on the insulating layer 12 and the lower electrodes LE1, LE2 and LE3. The aperture AP1 of the inorganic insulating layer 5 overlaps the lower electrode LE1. The aperture AP2 overlaps the lower electrode LE2. The aperture AP3 overlaps the lower electrode LE3. The peripheral portions of the lower electrodes LE1, LE2 and LE3 are covered with the inorganic insulating layer 5. The lower electrodes LE1, LE2 and LE3 are connected to the pixel circuits 1 of subpixels SP1, SP2 and SP3, respectively, through contact holes provided in the insulating layer 12. It should be noted that the contact holes of the insulating layer 12 are omitted in FIG. 3.

The partition 6 includes a conductive lower portion 61 provided on the inorganic insulating layer 5, and an upper portion 62 provided on the lower portion 61. The upper portion 62 has a width greater than that of the lower portion 61. The both end portions of the upper portion 62 protrude relative to the side surfaces of the lower portion 61. This shape of the partition 6 is called an overhang shape.

In the example shown in the figure, the lower portion 61 has a first conductive layer 63 provided on the inorganic insulating layer 5 and a second conductive layer 64 provided on the first conductive layer 63. For example, the first conductive layer 63 is formed so as to be thinner than the second conductive layer 64. In the example shown in the figure, the both end portions of the first conductive layer 63 protrude from the side surfaces of the second conductive layer 64.

The upper portion 62 has a first thin film 65 provided on the second conductive layer 64 and a second thin film 66 provided on the first thin film 65. The both end portions of the first thin film 65 and the second thin film 66 protrude from the side surfaces of the second conductive layer 64.

The organic layer OR1 is in contact with the lower electrode LE1 through the aperture AP1 and covers the lower electrode LE1 exposed from the aperture AP1. The peripheral portion of the organic layer OR1 is located on the inorganic insulating layer 5. The upper electrode UE1 covers the organic layer OR1 and is in contact with the lower portion 61.

The organic layer OR2 is in contact with the lower electrode LE2 through the aperture AP2 and covers the lower electrode LE2 exposed from the aperture AP2. The peripheral portion of the organic layer OR2 is located on the inorganic insulating layer 5. The upper electrode UE2 covers the organic layer OR2 and is in contact with the lower portion 61.

The organic layer OR3 is in contact with the lower electrode LE3 through the aperture AP3 and covers the lower electrode LE3 exposed from the aperture AP3. The peripheral portion of the organic layer OR3 is located on the inorganic insulating layer 5. The upper electrode UE3 covers the organic layer OR3 and is in contact with the lower portion 61.

In the example shown in the figure, subpixel SP1 has a cap layer CP1 and a sealing layer SE1. Subpixel SP2 has a cap layer CP2 and a sealing layer SE2. Subpixel SP3 has a cap layer CP3 and a sealing layer SE3. The cap layers CP1, CP2 and CP3 function as optical adjustment layers which improve the extraction efficiency of the light emitted from the organic layers OR1, OR2 and OR3, respectively. It should be noted that the cap layers CP1, CP2 and CP3 may be omitted.

The cap layer CP1 is provided on the upper electrode UE1.

The cap layer CP2 is provided on the upper electrode UE2.

The cap layer CP3 is provided on the upper electrode UE3.

The sealing layer SE1 is provided on the cap layer CP1, is in contact with the partition 6 and continuously covers the members of subpixel SP1.

The sealing layer SE2 is provided on the cap layer CP2, is in contact with the partition 6 and continuously covers the members of subpixel SP2.

The sealing layer SE3 is provided on the cap layer CP3, is in contact with the partition 6 and continuously covers the members of subpixel SP3.

In the example shown in the figure, each of the organic layer OR1, the upper electrode UE1 and the cap layer CP1 is partly located on the partition 6 around subpixel SP1. These portions are spaced apart from, of the organic layer OR1, the upper electrode UE1 and the cap layer CP1, the portions located in the aperture AP1 (the portions constituting the display element DE1).

Similarly, each of the organic layer OR2, the upper electrode UE2 and the cap layer CP2 is partly located on the partition 6 around subpixel SP2. These portions are spaced apart from, of the organic layer OR2, the upper electrode UE2 and the cap layer CP2, the portions located in the aperture AP2 (the portions constituting the display element DE2).

Similarly, each of the organic layer OR3, the upper electrode UE3 and the cap layer CP3 is partly located on the partition 6 around subpixel SP3. These portions are spaced apart from, of the organic layer OR3, the upper electrode UE3 and the cap layer CP3, the portions located in the aperture AP3 (the portions constituting the display element DE3).

In the following explanation, a multilayer body including the organic layer OR1, the upper electrode UE1 and the cap layer CP1 is called a stacked film FL1. A multilayer body including the organic layer OR2, the upper electrode UE2 and the cap layer CP2 is called a stacked film FL2. A multilayer body including the organic layer OR3, the upper electrode UE3 and the cap layer CP3 is called a stacked film FL3.

The end portions of the sealing layers SE1, SE2 and SE3 and the end portions of the stacked films FL1, FL2 and FL3 are located on the partition 6. In the example shown in the figure, the stacked film FL1 and sealing layer SE1 located on the partition 6 between subpixels SP1 and SP2 are spaced apart from the stacked film FL2 and sealing layer SE2 located on this partition 6. The stacked film FL1 and sealing layer SE1 located on the partition 6 between subpixels SP1 and SP3 are spaced apart from the stacked film FL3 and sealing layer SE3 located on this partition 6.

The partition 6 and the sealing layers SE1, SE2 and SE3 are covered with a resin layer 13. The resin layer 13 is covered with a sealing layer 14. The sealing layer 14 is covered with a resin layer 15.

Each of the inorganic insulating layer 5, the sealing layers SE1, SE2 and SE3 and the sealing layer 14 is formed of, for example, an inorganic insulating material such as silicon nitride (SiNx), silicon oxide (SiOx), silicon oxynitride (SiON) or aluminum oxide ($Al_2O_3$).

The lower portion 61 of the partition 6 is formed of a conductive material and is electrically connected to the upper electrodes UE1, UE2 and UE3. The first conductive layer 63 is formed of, for example, a titanium-based material such as titanium or a titanium compound. The second conductive layer 64 is formed of a material which is different from the first conductive layer 63 and the upper portion 62, and is formed of, for example, an aluminum-based material such as aluminum or an aluminum compound.

The upper portion 62 of the partition 6 is formed of, for example, a conductive material. However, the upper portion 62 may be formed of an insulating material. The upper portion 62 is formed of a material which is different from that of the lower portion 61. The first thin film 65 is formed of, for example, a titanium-based material such as titanium or a titanium compound. The second thin film 66 is formed of, for example, an oxide conductive material such as indium tin oxide (ITO).

Each of the lower electrodes LE1, LE2 and LE3 is, for example, a multilayer body including a transparent layer formed of an oxide conductive material such as indium tin oxide (ITO) and a reflective layer formed of a metal material such as silver. For example, each of the lower electrodes LE1, LE2 and LE3 is a multilayer body including a reflective layer between a pair of transparent layers. The lower transparent layer functions as an adhesive layer which adheres tightly to the insulating layer 12.

The organic layer OR1 includes a light emitting layer EM1. The organic layer OR2 includes a light emitting layer EM2. The organic layer OR3 includes a light emitting layer EM3. The light emitting layer EM1, the light emitting layer EM2 and the light emitting layer EM3 are formed of materials which are different from each other. For example, the light emitting layer EM1 is formed of a material which emits light in a blue wavelength range. The light emitting layer EM2 is formed of a material which emits light in a green wavelength range. The light emitting layer EM3 is formed of a material which emits light in a red wavelength range.

Each of the organic layers OR1, OR2 and OR3 includes a plurality of functional layers such as a hole injection layer, a hole transport layer, an electron blocking layer, a hole blocking layer, an electron transport layer and an electron injection layer.

Each of the upper electrodes UE1, UE2 and UE3 is formed of, for example, a metal material such as an alloy of magnesium and silver (MgAg).

Each of the cap layers CP1, CP2 and CP3 is a multilayer body consisting of a plurality of thin films. All of the thin films are transparent and have refractive indices different from each other.

The circuit layer 11, the insulating layer 12 and the inorganic insulating layer 5 shown in the figure are provided over the display area DA and the surrounding area SA.

Now, this specification explains the manufacturing method of the display device DSP. Regarding each figure for explaining the manufacturing method, the illustration of the lower side of the insulating layer 12 is omitted.

First, the circuit layer 11 and the insulating layer 12 are formed over the display area DA and the surrounding area SA on the substrate 10. Subsequently, as shown in FIG. 4, the lower electrode LE1 of subpixel SP1, the lower electrode LE2 of subpixel SP2 and the lower electrode LE3 of subpixel SP3 are formed on the insulating layer 12.

Subsequently, the inorganic insulating layer 5 which covers the peripheral portions of the lower electrodes LE1, LE2 and LE3 is formed. The inorganic insulating layer 5 is formed of silicon oxide, silicon nitride, silicon oxynitride, etc.

Subsequently, the partition 6 which has the lower portion 61 located on the inorganic insulating layer 5 and the upper portion 62 located on the lower portion 61 is formed. The first conductive layer 63 of the lower portion 61 and the upper portion 62 protrude from the side surfaces of the second conductive layer 64 of the lower portion 61. The first conductive layer 63 is formed of a conductive material such as a titanium-based material, and the second conductive layer 64 is formed of a conductive material such as an aluminum-based material.

It should be noted that the process of forming the apertures AP1, AP2 and AP3 in the inorganic insulating layer 5 may be performed either before the partition 6 is formed or after the partition 6 is formed.

Subsequently, the display element DE1 is formed.

First, as shown in FIG. 5, the stacked film FL1 including the organic layer OR1, the upper electrode UE1 and the cap layer CP1 is formed. The process of forming the stacked film FL1 includes the process of forming the organic layer OR1 which is in contact with the lower electrode LE1 in the aperture AP1, the process of forming the upper electrode UE1 which covers the organic layer OR1 and is in contact with the lower portion 61 of the partition 6, and the process of forming the cap layer CP1 located on the upper electrode UE1. The process of forming the organic layer OR1 includes the process of forming each of the hole injection layer, the hole transport layer, the electron blocking layer, the light emitting layer, the hole blocking layer, the electron transport layer, the electron injection layer and the like. Each of the organic layer OR1, the upper electrode UE1 and the cap layer CP1 is formed by vapor deposition using the partition 6 as a mask. The stacked film FL1 is divided into a plurality of portions by the partition 6 having an overhang shape. These organic layer OR1, upper electrode UE1 and cap layer CP1 are successively formed in a state where a vacuum environment is maintained.

Subsequently, the sealing layer SE1 is formed on the stacked film FL1 by depositing an inorganic insulating material. The sealing layer SE1 is formed by chemical vapor deposition (CVD). The sealing layer SE1 continuously covers the portions into which the stacked film FL1 is divided, and the partition 6.

Subsequently, as shown in FIG. 6, a resist RS patterned into a predetermined shape is formed on the sealing layer SE1. The resist RS overlaps subpixel SP1 and part of the partition 6 around subpixel SP1.

Subsequently, as shown in FIG. 7, the sealing layer SE1 and the stacked film FL1 exposed from the resist RS are removed in series by performing etching using the resist RS as a mask. In this etching, the sealing layer SE1 exposed from the resist RS is removed. Subsequently, the cap layer CP1 exposed from the sealing layer SE1 is removed. Further, the upper electrode UE1 exposed from the cap layer CP1 is removed. Subsequently, the organic layer OR1 exposed from the upper electrode UE1 is removed. By this etching, the lower electrode LE2 of subpixel SP2 and the lower electrode LE3 of subpixel SP3 are exposed.

Subsequently, the resist RS is removed. By this process, the display element DE1 is formed in subpixel SP1.

Subsequently, as shown in FIG. 8, the display element DE2 is formed. The procedure of forming the display element DE2 is similar to that of forming the display element DE1. Specifically, the stacked film FL2 is formed by forming the organic layer OR2 including the light emitting layer EM2, the upper electrode UE2 and the cap layer CP2 in order on the lower electrode LE2. Subsequently, the sealing layer SE2 is formed on the stacked film FL2. Subsequently, a resist is formed on the sealing layer SE2. The sealing layer SE2, the cap layer CP2, the upper electrode UE2 and the organic layer OR2 are patterned by etching using the resist as a mask. After this patterning, the resist is removed. By this process, the display element DE2 is formed in subpixel SP2, and the lower electrode LE3 of subpixel SP3 is exposed.

Figure 9:
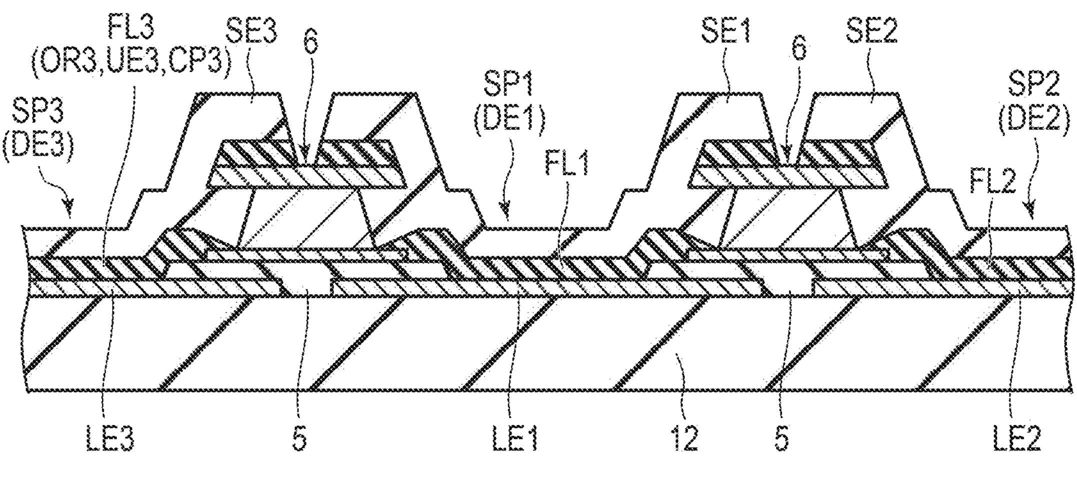
FIG. 9 is a diagram for explaining the manufacturing method of the display device DSP.

Subsequently, as shown in FIG. 9, the display element DE3 is formed. The procedure of forming the display element DE3 is similar to that of forming the display element DE1. Specifically, the stacked film FL3 is formed by forming the organic layer OR3 including the light emitting layer EM3, the upper electrode UE3 and the cap layer CP3 in order on the lower electrode LE3. Subsequently, the sealing layer SE3 is formed on the stacked film FL3. Subsequently, a resist is formed on the sealing layer SE3. The sealing layer SE3, the cap layer CP3, the upper electrode UE3 and the organic layer OR3 are patterned by etching using the resist as a mask. After this patterning, the resist is removed. By this process, the display element DE3 is formed in subpixel SP3.

Subsequently, the resin layer 13, the sealing layer 14 and the resin layer 15 shown in FIG. 3 are formed in order. By this process, the display device DSP is completed.

In the manufacturing process described above, this specification assumes a case where the display element DE1 is formed firstly, and the display element DE2 is formed secondly, and the display element DE3 is formed lastly. However, the formation order of the display elements DE1, DE2 and DE3 is not limited to this example.

Now, this specification explains a mother substrate 100 for a display device (hereinafter, simply referred to as a mother substrate 100) for manufacturing a plurality of display devices DSP in a lump.

Figure 10:
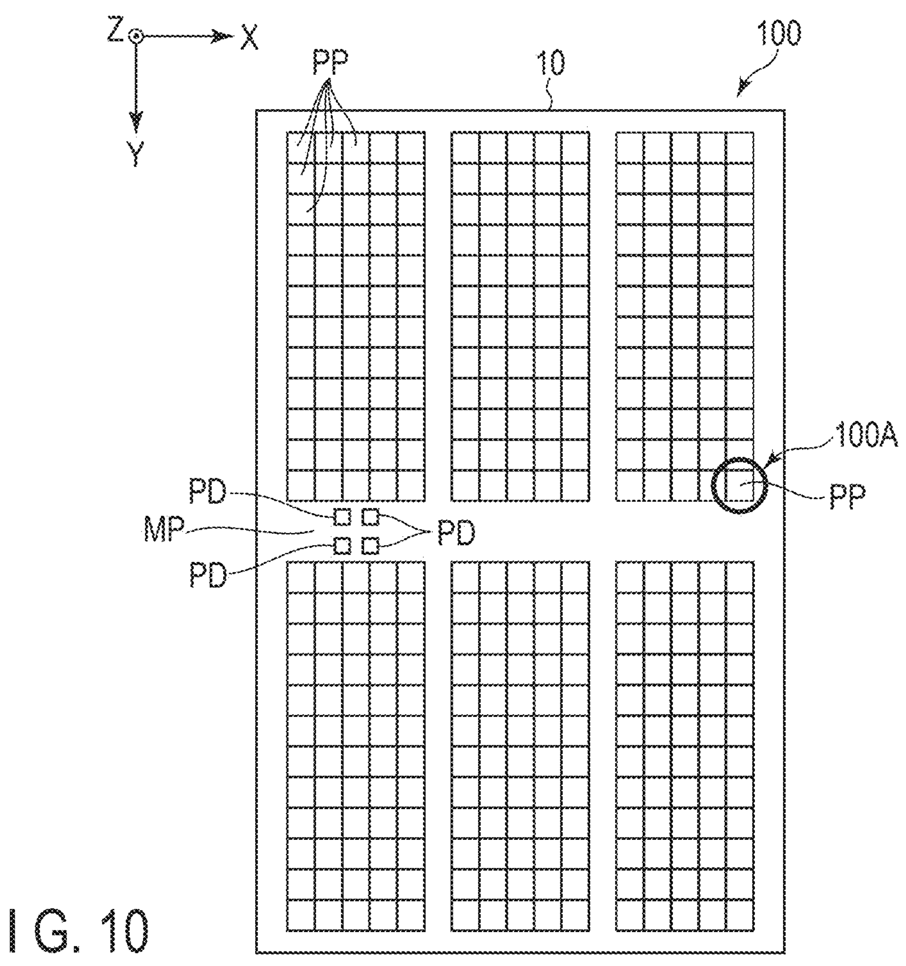
FIG. 10 is a plan view showing an example of a mother substrate 100.

FIG. 10 is a plan view showing an example of the mother substrate 100.

The mother substrate 100 comprises a plurality of panel portions PP and a margin portion MP located on an external side relative to these panel portions PP on a large substrate 10. The large substrate 10 is formed into, for example, a rectangular shape. The panel portions PP are arrayed in matrix in the first direction X and the second direction Y. The panel portions PP are extracted by dividing the mother substrate 100 along cut lines. Each of the extracted panel portions PP corresponds to the display panel PNL shown in FIG. 1 and comprises the display area DA and the surrounding area SA.

The margin portion MP comprises, for example, a plurality of pads PD electrically connected to a test element group, etc.

Figure 11:
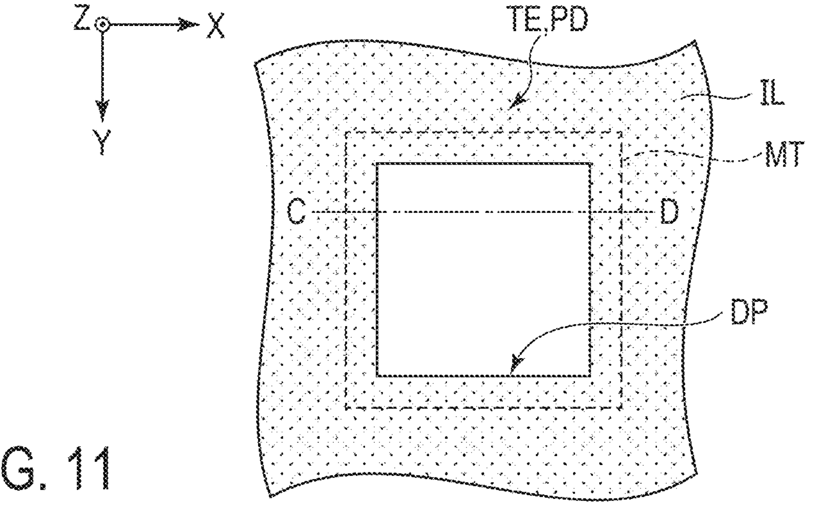
FIG. 11 is a plan view showing a configuration example of a pad PD or a terminal TE.

FIG. 11 is a plan view showing a configuration example of a pad PD or a terminal TE.

This pad PD corresponds to, for example, each pad PD of the margin portion MP shown in FIG. 10. This terminal TE corresponds to, for example, each terminal TE of the surrounding area SA shown in FIG. 1.

An organic insulating layer IL includes, for example, the insulating layer 12 shown in FIG. 3. As explained later, the organic insulating layer IL may be a single-layer body of the insulating layer 12 or another insulating layer, or may be a multilayer body consisting of the insulating layer 12 and another insulating layer. The organic insulating layer IL is provided in each of the panel portions PP and is also provided in the margin portion MP. It should be noted that the inorganic insulating layer 5 omitted in this figure is also provided in the margin portion MP as well as the panel portions PP.

A metal layer MT shown by broken lines corresponds to, for example, the electrode of the pad PD or the terminal TE. The metal layer MT overlaps the recess portion DP of the organic insulating layer IL in plan view. The recess portion DP corresponds to the penetration portion of the organic insulating layer IL and exposes part of the metal layer MT. The peripheral portion of the metal layer MT is covered with the organic insulating layer IL or the inorganic insulating layer 5.

Now, this specification explains several configuration examples of the sectional structure of the mother substrate 100 along the C-D line of FIG. 11.

Figure 12:
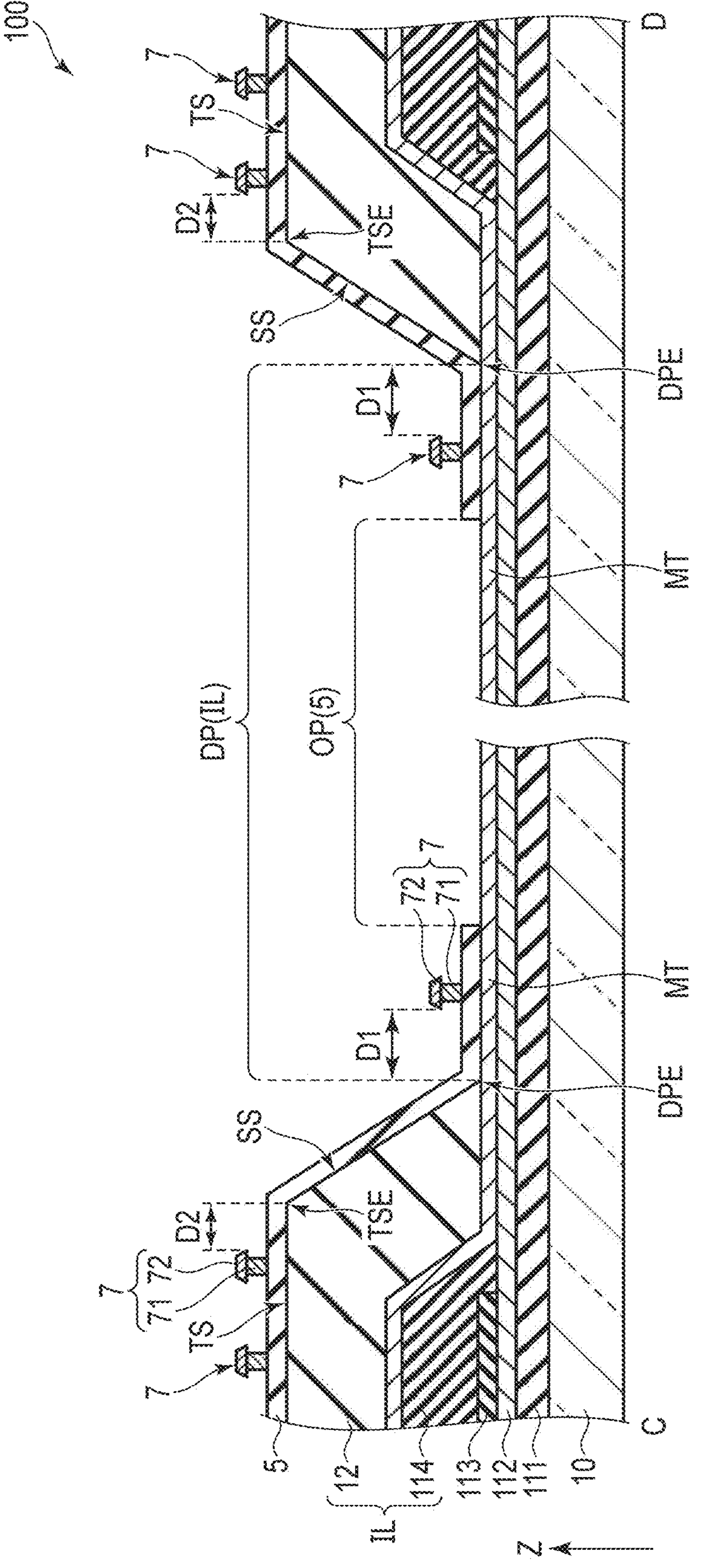
FIG. 12 is a cross-sectional view showing a configuration example of the mother substrate 100.

FIG. 12 is a cross-sectional view showing a configuration example of the mother substrate 100.

An insulating layer 111 is an inorganic insulating layer and is provided on the substrate 10. A wiring layer 112 is provided on the insulating layer 111. An insulating layer 113 is an inorganic insulating layer and is provided on the wiring layer 112. The insulating layer 113 exposes part of the wiring layer 112. An insulating layer 114 is an organic insulating layer and is provided on the insulating layer 113. The metal layer MT is in contact with the wiring layer 112. The peripheral portion of the metal layer MT is provided on the insulating layer 114. By this configuration, the metal layer MT is electrically connected to the wiring layer 112. These insulating layer 111, the wiring layer 112, the insulating layer 113, the insulating layer 114 and the metal layer MT are included in the circuit layer 11 shown in FIG. 3. It should be noted that the circuit layer 11 may include an insulating layer and a conductive layer in addition to the layers shown in the figure.

The insulating layer 12 is an organic insulating layer and is provided on the insulating layer 114 and the metal layer MT. The insulating layer 114 is retracted relative to the insulating layer 12 and is covered with the insulating layer 12. The peripheral portion of the metal layer MT is covered with the insulating layer 12.

The organic insulating layer IL described above has the insulating layer 114 and the insulating layer 12. The organic insulating layer IL has a flat upper surface TS, the recess portion DP which is concave relative to the upper surface TS, and a slope SS which surrounds the recess portion DP. The recess portion DP is a penetration portion in the insulating layer 12. This penetration portion is formed such that the metal layer MT is exposed. The upper surface TS is the upper surface of the insulating layer 12. The slope SS is a slope which is connected to the upper surface of the insulating layer 12. The edge portion DPE of the recess portion DP is defined as the edge portion of the insulating layer 12. The edge portion TSE of the upper surface TS is defined as the intersection of the upper surface TS and the slope SS.

The inorganic insulating layer 5 covers the insulating layer 12 and is in contact with the metal layer MT in the recess portion DP. The inorganic insulating layer 5 has an aperture OP which overlaps the recess portion DP. The aperture OP is a penetration portion in the inorganic insulating layer 5. This penetration portion is formed such that the metal layer MT is exposed. The area of the aperture OP is less than that of the recess portion DP.

A plurality of surrounding partitions 7 are provided so as to overlap the upper surface TS and the recess portion DP of the organic insulating layer IL. Each of the surrounding partitions 7 has a lower portion 71 provided on the inorganic insulating layer 5 and an upper portion 72 provided on the lower portion 71. The upper portion 72 has a width which is greater than that of the lower portion 71. The both end portions of the upper portion 72 protrude relative to the side surfaces of the lower portion 71.

Thus, each of the surrounding partitions 7 has an overhang shape similar to that of the partition 6 shown in FIG. 3. The surrounding partitions 7 can be formed by the same process as the partition 6. In this case, the lower portion 71 is formed of the same material as the lower portion 61. The upper portion 72 is formed of the same material as the upper portion 62.

When this specification focuses attention on the surrounding partition (first partition) 7 located in the recess portion DP, distance D1 from the edge portion of the upper portion 72 to the edge portion DPE of the recess portion DP is greater than or equal to 50 μm.

When this specification focuses attention on the surrounding partition (second partition) 7 located above the upper surface TS, distance D2 from the edge portion of the upper portion 72 to the edge portion TSE of the upper surface TS is greater than or equal to 20 μm.

Figure 13:
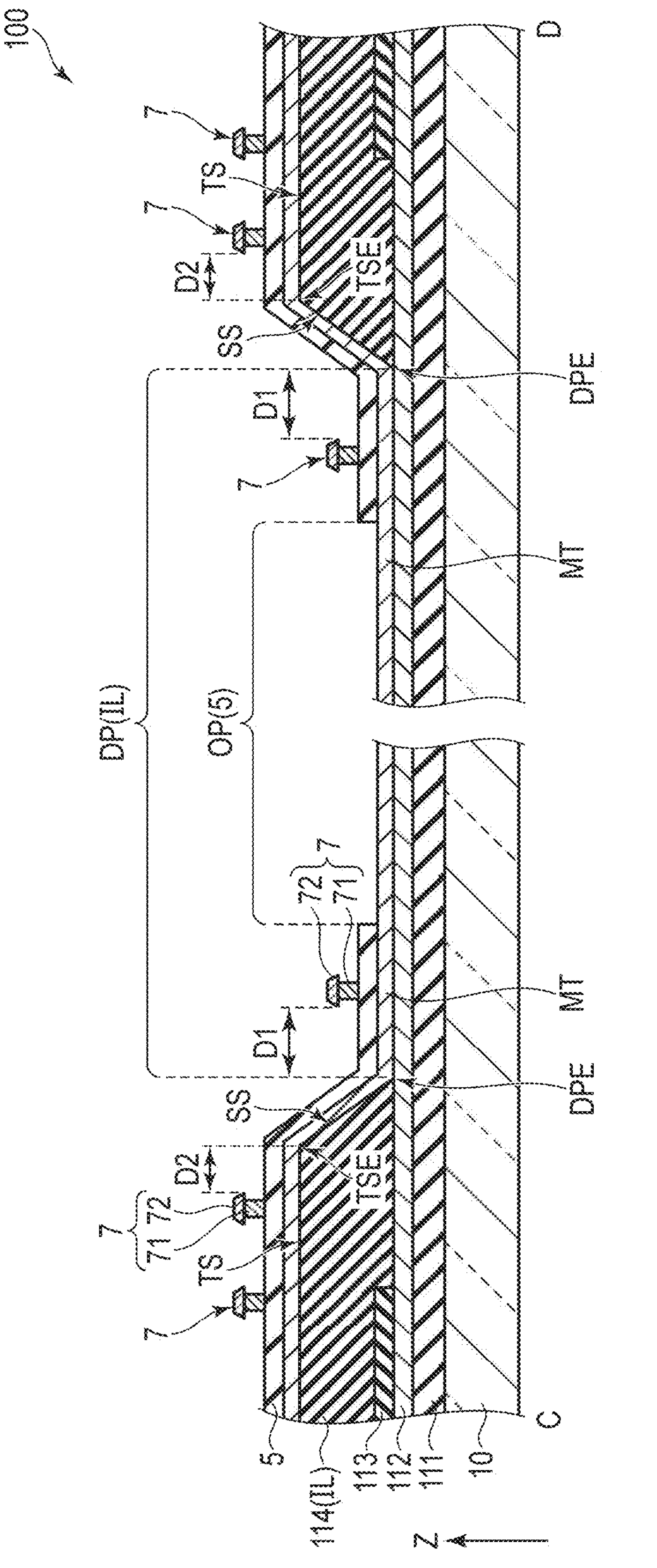
FIG. 13 is a cross-sectional view showing another configuration example of the mother substrate 100.

FIG. 13 is a cross-sectional view showing another configuration example of the mother substrate 100.

The configuration example shown in FIG. 13 is different from that shown in FIG. 12 in respect that the organic insulating layer IL is a single-layer body of the insulating layer 114 at least around the recess portion DP.

The recess portion DP of the organic insulating layer IL is a penetration portion in the insulating layer 114. This penetration portion is formed such that the metal layer MT is exposed. The upper surface TS is the upper surface of the insulating layer 114. The slope SS is a slope which is connected to the upper surface of the insulating layer 114. The edge portion DPE of the recess portion DP is defined as the edge portion of the insulating layer 114. The edge portion TSE of the upper surface TS is defined as the intersection of the upper surface TS and the slope SS.

The inorganic insulating layer 5 is provided on the insulating layer 114 and the metal layer MT. The peripheral portion of the metal layer MT is covered with the inorganic insulating layer 5. The aperture OP of the inorganic insulating layer 5 exposes the metal layer MT.

A plurality of surrounding partitions 7 are provided so as to overlap the upper surface TS and the recess portion DP of the organic insulating layer IL. Each surrounding partition 7 has an overhang shape.

Distance D1 related to the surrounding partitions 7 located in the recess portion DP and distance D2 related to the surrounding partitions 7 located above the upper surface TS are as described above.

FIG. 14 is a cross-sectional view showing another configuration example of the mother substrate 100.

The configuration example shown in FIG. 14 is different from that shown in FIG. 12 in respect that the organic insulating layer IL is a single-layer body of the insulating layer 12 at least around the recess portion DP.

The recess portion DP of the organic insulating layer IL is a penetration portion in the insulating layer 12. This penetration portion is formed such that the metal layer MT is exposed. The upper surface TS is the upper surface of the insulating layer 12. The slope SS is a slope which is connected to the upper surface of the insulating layer 12. The edge portion DPE of the recess portion DP is defined as the edge portion of the insulating layer 12. The edge portion TSE of the upper surface TS is defined as the intersection of the upper surface TS and the slope SS.

The inorganic insulating layer 5 is provided on the insulating layer 12 and the metal layer MT. The peripheral portion of the metal layer MT is covered with the inorganic insulating layer 5. The aperture OP of the inorganic insulating layer 5 exposes the metal layer MT.

A plurality of surrounding partitions 7 are provided so as to overlap the upper surface TS and the recess portion DP of the organic insulating layer IL. Each surrounding partition 7 has an overhang shape.

Distance D1 related to the surrounding partitions 7 located in the recess portion DP and distance D2 related to the surrounding partitions 7 located above the upper surface TS are as described above.

FIG. 15 is a cross-sectional view showing another configuration example of the mother substrate 100.

The configuration example shown in FIG. 15 is different from that shown in FIG. 12 in respect that the organic insulating layer IL has a stepwise cross section.

The insulating layer 114 extends toward the recess portion DP relative to the insulating layer 12. The insulating layer 12 is provided on the insulating layer 114. The peripheral portion of the metal layer MT is located between the insulating layer 114 and the insulating layer 12.

Around the recess portion DP, the organic insulating layer IL has an upper surface TS1 located in the uppermost portion, an upper surface TS2 located in a portion lower than the upper surface TS1, and a slope SS between the upper surface TS1 and the upper surface TS2. The upper surface TS2 is located between the upper surface TS1 and the recess portion DP. The upper surfaces TS1 and TS2 are the upper surfaces of the insulating layer 12. The slope SS is the slope of the insulating layer 12. The insulating layer 12 having this stepwise cross section is formed by adjusting the exposure amount for each portion.

The recess portion DP of the organic insulating layer IL is a penetration portion in the insulating layer 114. This penetration portion is formed such that the metal layer MT is exposed. The edge portion DPE of the recess portion DP is defined as the edge portion of the insulating layer 114. The edge portion TSE of the upper surface TS1 is defined as the intersection of the upper surface TS1 and the slope SS.

The inorganic insulating layer 5 is provided on the insulating layer 12, the metal layer MT and the insulating layer 114. The aperture OP of the inorganic insulating layer 5 exposes the metal layer MT.

A plurality of surrounding partitions 7 are provided so as to overlap the upper surface TS1 and the recess portion DP of the organic insulating layer IL. Each surrounding partition 7 has an overhang shape.

Distance D1 related to the surrounding partitions 7 located in the recess portion DP and distance D2 related to the surrounding partitions 7 located above the upper surface TS1 are as described above.

Figure 16:
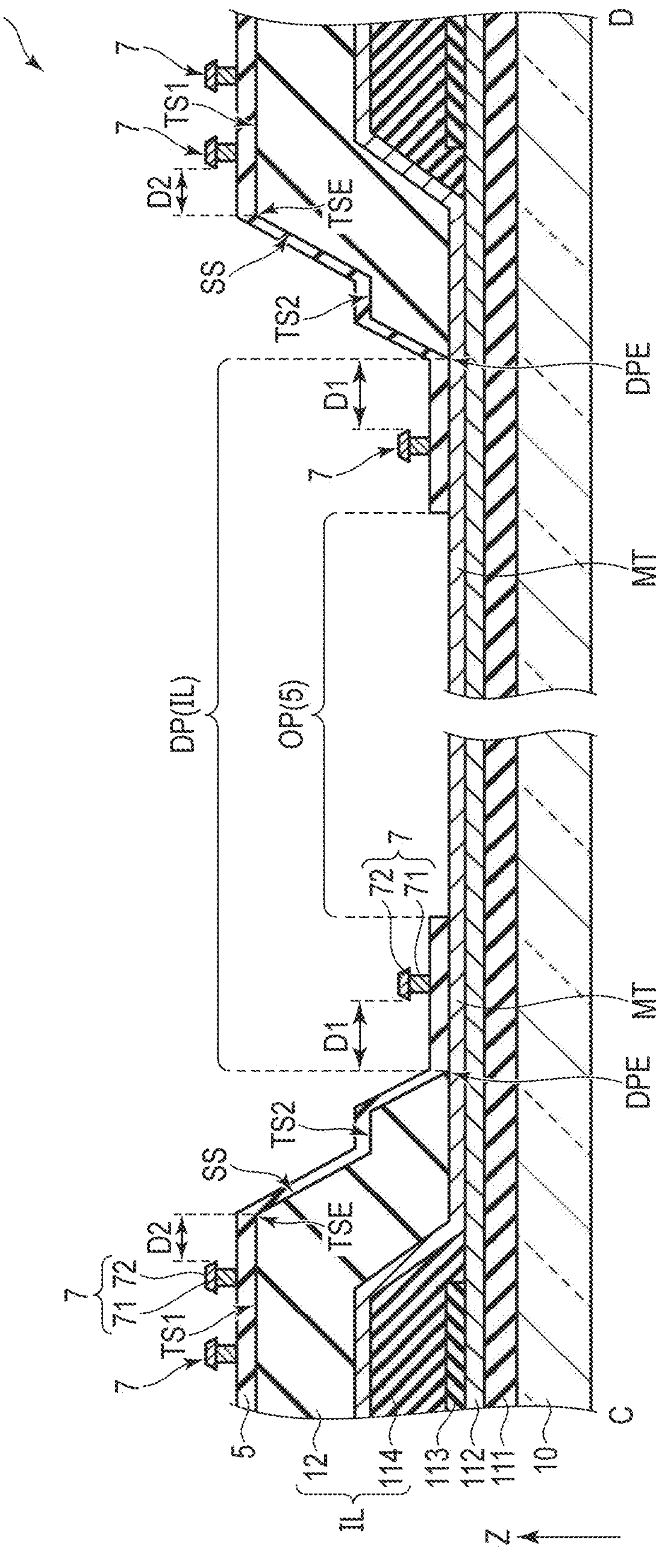
FIG. 16 is a cross-sectional view showing another configuration example of the mother substrate 100.

FIG. 16 is a cross-sectional view showing another configuration example of the mother substrate 100.

The configuration example shown in FIG. 16 is different from that shown in FIG. 12 in respect that the organic insulating layer IL has a stepwise cross section.

The insulating layer 114 is retracted relative to the insulating layer 12 and is covered with the insulating layer 12. The peripheral portion of the metal layer MT is located between the insulating layer 114 and the insulating layer 12.

The organic insulating layer IL has an upper surface TS1, an upper surface TS2 and a slope SS around the recess portion DP. The upper surface TS2 is located between the upper surface TS1 and the recess portion DP. The upper surfaces TS1 and TS2 are the upper surfaces of the insulating layer 12. The slope SS is the slope of the insulating layer 12. The insulating layer 12 having this stepwise cross section is formed by adjusting the exposure amount for each portion.

The recess portion DP of the organic insulating layer IL is a penetration portion in the insulating layer 12. This penetration portion is formed such that the metal layer MT is exposed. The edge portion DPE of the recess portion DP is defined as the edge portion of the insulating layer 12. The edge portion TSE of the upper surface TS1 is defined as the intersection of the upper surface TS1 and the slope SS.

The inorganic insulating layer 5 is provided on the insulating layer 12 and the metal layer MT. The aperture OP of the inorganic insulating layer 5 exposes the metal layer MT.

A plurality of surrounding partitions 7 are provided so as to overlap the upper surface TS1 and the recess portion DP of the organic insulating layer IL. Each surrounding partition 7 has an overhang shape.

Distance D1 related to the surrounding partitions 7 located in the recess portion DP and distance D2 related to the surrounding partitions 7 located above the upper surface TS1 are as described above.

Figure 17:
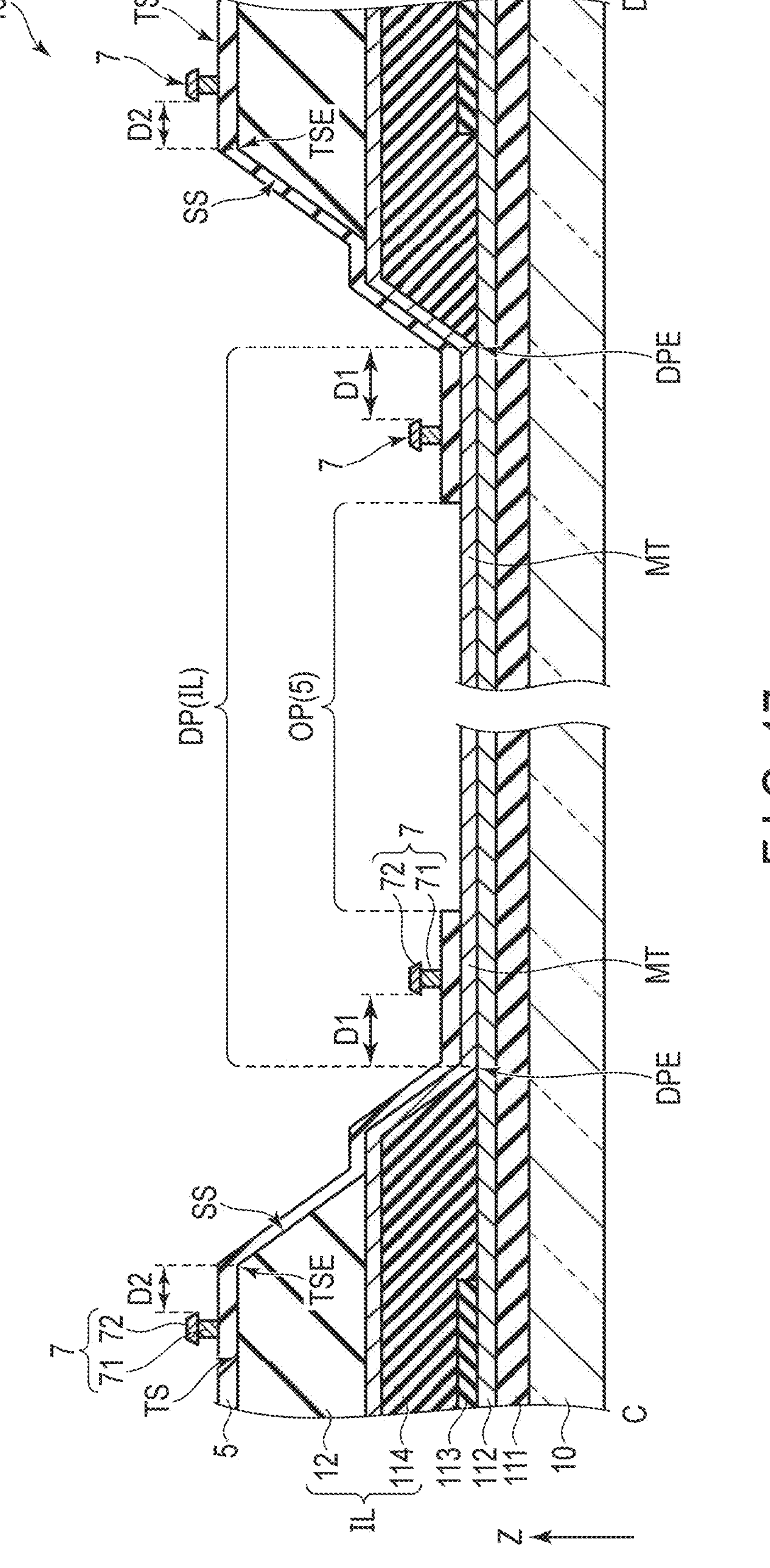
FIG. 17 is a cross-sectional view showing another configuration example of the mother substrate 100.

FIG. 17 is a cross-sectional view showing another configuration example of the mother substrate 100.

The configuration example shown in FIG. 17 is different from that shown in FIG. 12 in respect that the organic insulating layer IL has a stepwise cross section.

The insulating layer 114 extends toward the recess portion DP relative to the insulating layer 12. The insulating layer 12 is provided on the insulating layer 114. The peripheral portion of the metal layer MT is located between the insulating layer 114 and the insulating layer 12.

The organic insulating layer IL has an upper surface TS and a slope SS. The upper surface TS is the upper surface of the insulating layer 12. The slope SS is the slope of the insulating layer 12.

The recess portion DP of the organic insulating layer IL is a penetration portion in the insulating layer 114. This penetration portion is formed such that the metal layer MT is exposed. The edge portion DPE of the recess portion DP is defined as the edge portion of the insulating layer 114. The edge portion TSE of the upper surface TS is defined as the intersection of the upper surface TS and the slope SS.

The inorganic insulating layer 5 is provided on the insulating layer 12, the metal layer MT and the insulating layer 114. The aperture OP of the inorganic insulating layer 5 exposes the metal layer MT.

A plurality of surrounding partitions 7 are provided so as to overlap the upper surface TS and the recess portion DP of the organic insulating layer IL. Each surrounding partition 7 has an overhang shape.

Distance D1 related to the surrounding partitions 7 located in the recess portion DP and distance D2 related to the surrounding partitions 7 located above the upper surface TS are as described above.

Figure 18:
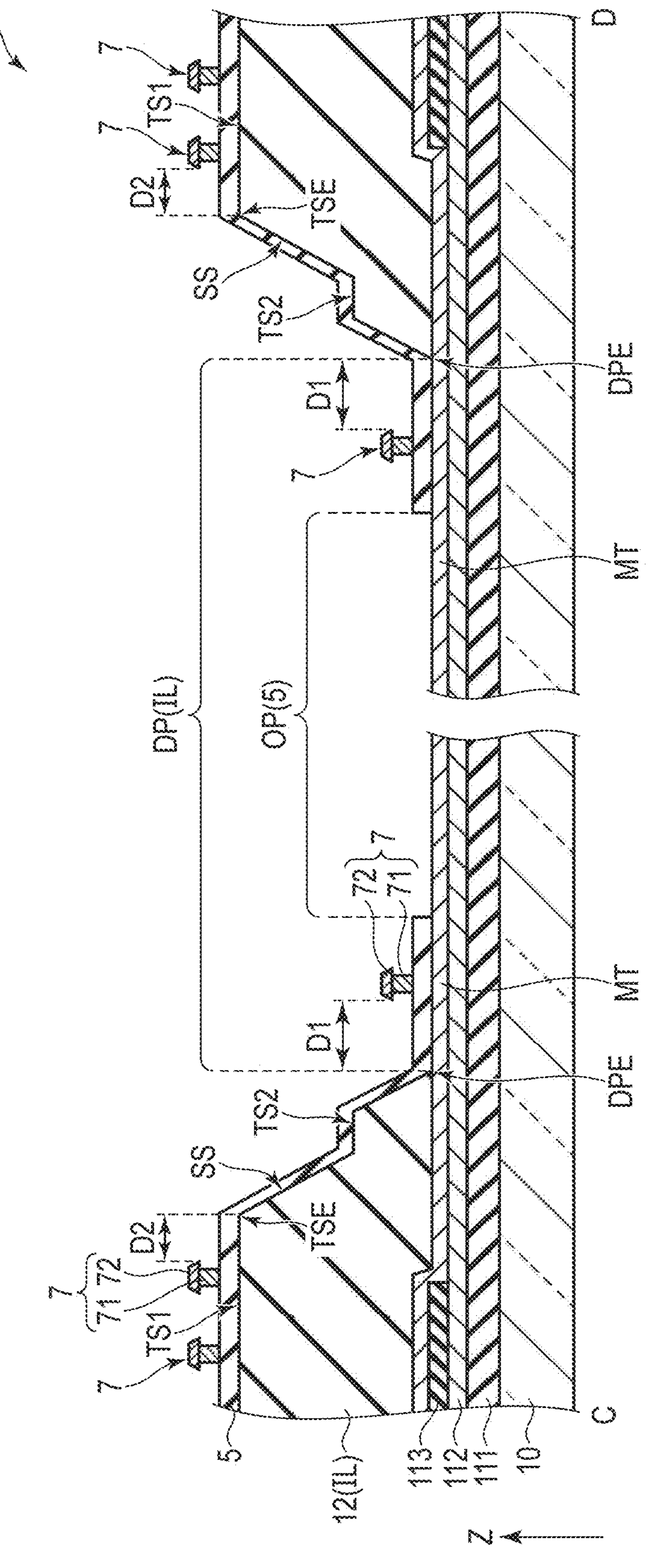
FIG. 18 is a cross-sectional view showing another configuration example of the mother substrate 100.

FIG. 18 is a cross-sectional view showing another configuration example of the mother substrate 100.

The configuration example shown in FIG. 18 is different from that shown in FIG. 12 in respect that the organic insulating layer IL is a single-layer body and further has a stepwise cross section at least around the recess portion DP.

The insulating layer 12 is provided on the insulating layer 113. The peripheral portion of the metal layer MT is located between the insulating layer 113 and the insulating layer 12.

The organic insulating layer IL has an upper surface TS1, an upper surface TS2 and a slope SS around the recess portion DP. The upper surface TS2 is located between the upper surface TS1 and the recess portion DP. The upper surfaces TS1 and TS2 are the upper surfaces of the insulating layer 12. The slope SS is the slope of the insulating layer 12. The insulating layer 12 having this stepwise cross section is formed by adjusting the exposure amount for each portion.

The recess portion DP of the organic insulating layer IL is a penetration portion in the insulating layer 12. This penetration portion is formed such that the metal layer MT is exposed. The edge portion DPE of the recess portion DP is defined as the edge portion of the insulating layer 12. The edge portion TSE of the upper surface TS1 is defined as the intersection of the upper surface TS1 and the slope SS.

The inorganic insulating layer 5 is provided on the insulating layer 12 and the metal layer MT. The aperture OP of the inorganic insulating layer 5 exposes the metal layer MT.

A plurality of surrounding partitions 7 are provided so as to overlap the upper surface TS1 and the recess portion DP of the organic insulating layer IL. Each surrounding partition 7 has an overhang shape.

Distance D1 related to the surrounding partitions 7 located in the recess portion DP and distance D2 related to the surrounding partitions 7 located above the upper surface TS1 are as described above.

Figure 19:
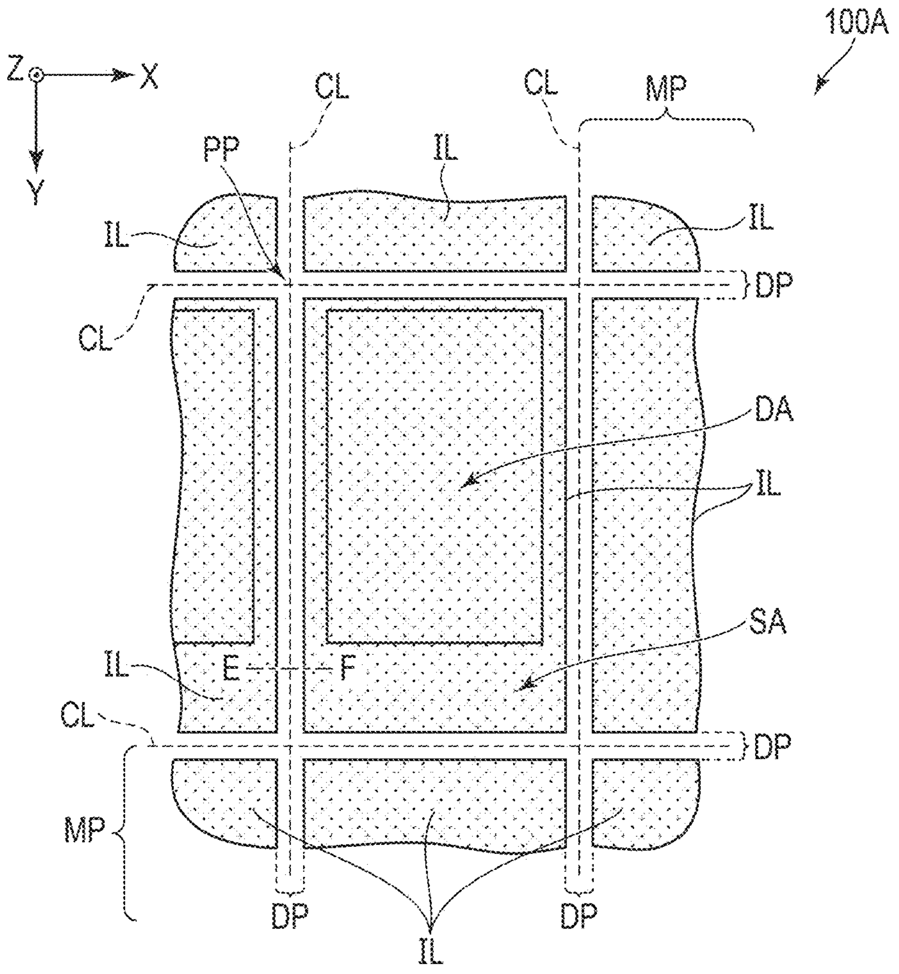
FIG. 19 is a plan view showing a configuration example of the area 100A of the mother substrate 100 shown in FIG. 10.

FIG. 19 is a plan view showing a configuration example of the area 100A of the mother substrate 100 shown in FIG. 10.

The area 100A includes one panel portion PP. The cut lines CL shown by broken lines in the figure extend in, for example, the first direction X and the second direction Y.

These cut lines CL could be the outer shape of the display panel PNL shown in FIG. 1. Each of the panel portions PP comprises the display area DA and the surrounding area SA.

The organic insulating layer IL is provided in each of the panel portions PP and is provided in the margin portion MP as well. The organic insulating layer IL has the recess portion DP along the outer shape of each panel portion PP. The cut lines CL overlap the recess portion DP. The recess portion DP may be a penetration portion in the organic insulating layer IL or may be a thin portion in the organic insulating layer IL. The recess portion DP is formed into a grating shape surrounding each panel portion PP. In the example shown in the figure, the recess portion DP extends in the first direction X and the second direction Y.

When one panel portion PP is particularly looked at, the recess portion DP is formed into a loop shape surrounding the panel portion PP. In each panel portion PP, the display area DA overlaps the organic insulating layer IL. Part of the surrounding area SA also overlaps the organic insulating layer IL.

Now, this specification explains several configuration examples of the sectional structure of the mother substrate 100 along the E-F line of FIG. 19.

Figure 20:
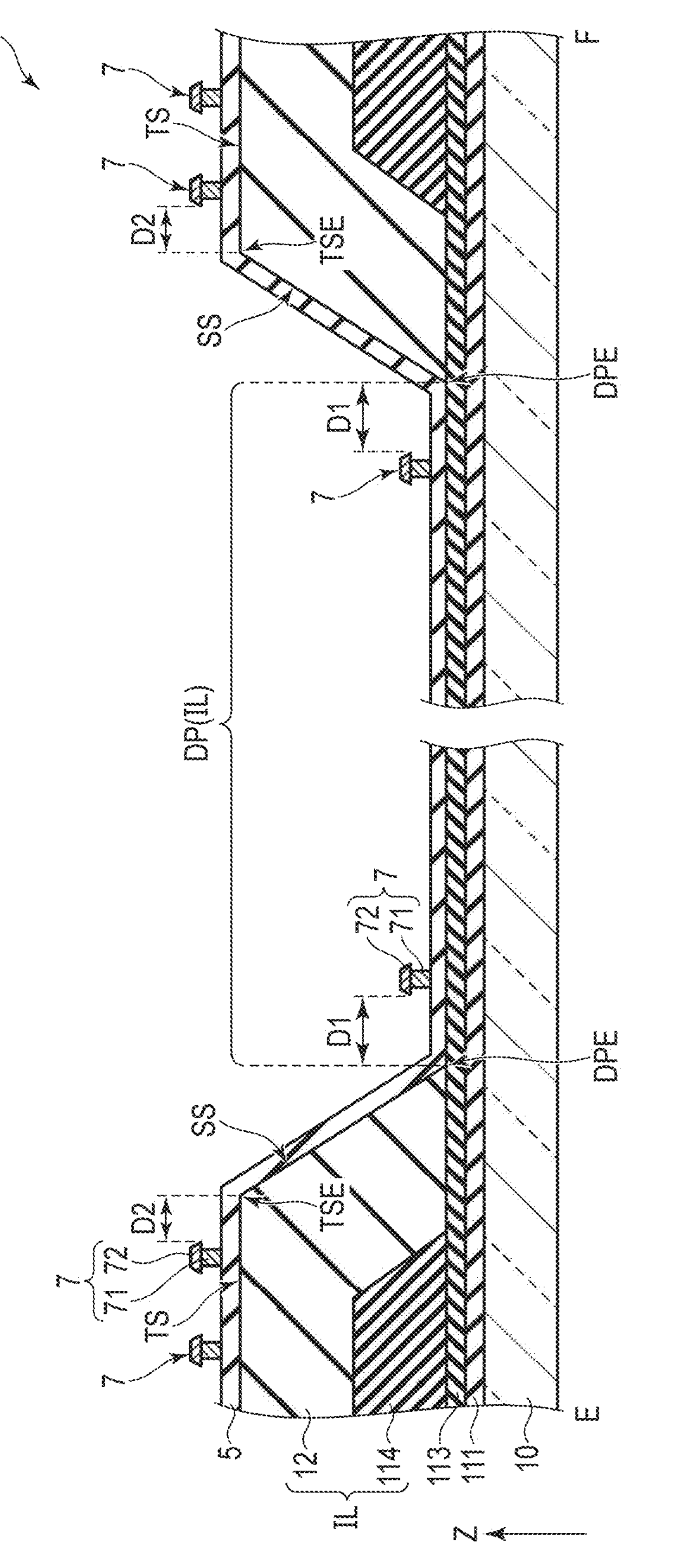
FIG. 20 is a cross-sectional view showing a configuration example of the mother substrate 100.

FIG. 20 is a cross-sectional view showing a configuration example of the mother substrate 100.

The insulating layer 111 is an inorganic insulating layer and is provided on the substrate 10. The insulating layer 113 is an inorganic insulating layer and is provided on the insulating layer 111. The insulating layer 114 is an organic insulating layer and is provided on the insulating layer 113. These insulating layer 111, insulating layer 113 and insulating layer 114 are included in the circuit layer 11 shown in FIG. 3. It should be noted that the circuit layer 11 may include an insulating layer and a conductive layer in addition to the layers shown in the figure.

The insulating layer 12 is an organic insulating layer and is provided on the insulating layer 113 and the insulating layer 114. The insulating layer 114 is retracted relative to the insulating layer 12 and is covered with the insulating layer 12.

The organic insulating layer IL has the insulating layer 114 and the insulating layer 12. The organic insulating layer IL has a flat upper surface TS, the recess portion DP which is concave relative to the upper surface TS, and a slope SS which surrounds the recess portion DP. The recess portion DP is a penetration portion in the insulating layer 12. This penetration portion is formed such that the insulating layer 113 is exposed. The upper surface TS is the upper surface of the insulating layer 12. The slope SS is a slope which is connected to the upper surface of the insulating layer 12. The edge portion DPE of the recess portion DP is defined as the edge portion of the insulating layer 12. The edge portion TSE of the upper surface TS is defined as the intersection of the upper surface TS and the slope SS.

The inorganic insulating layer 5 covers the insulating layer 12 and covers the insulating layer 113 in the recess portion DP.

A plurality of surrounding partitions 7 are provided so as to overlap the upper surface TS and the recess portion DP of the organic insulating layer IL. Each of the surrounding partitions 7 has a lower portion 71 provided on the inorganic insulating layer 5 and an upper portion 72 provided on the lower portion 71. Each of the surrounding partitions 7 has an overhang shape similar to that of the partition 6 shown in FIG. 3. The surrounding partitions 7 can be formed by the same process as the partition 6.

When this specification focuses attention on the surrounding partition (first partition) 7 located in the recess portion DP, distance D1 from the edge portion of the upper portion 72 to the edge portion DPE of the recess portion DP is greater than or equal to 50 μm.

When this specification focuses attention on the surrounding partition (second partition) 7 located above the upper surface TS, distance D2 from the edge portion of the upper portion 72 to the edge portion TSE of the upper surface TS is greater than or equal to 20 μm.

FIG. 21 is a cross-sectional view showing another configuration example of the mother substrate 100.

The configuration example shown in FIG. 21 is different from that shown in FIG. 20 in respect that the organic insulating layer IL is a single-layer body of the insulating layer 114 at least around the recess portion DP.

The recess portion DP of the organic insulating layer IL is a penetration portion in the insulating layer 114. This penetration portion is formed such that the insulating layer 113 is exposed. The upper surface TS is the upper surface of the insulating layer 114. The slope SS is a slope which is connected to the upper surface of the insulating layer 114. The edge portion DPE of the recess portion DP is defined as the edge portion of the insulating layer 114. The edge portion TSE of the upper surface TS is defined as the intersection of the upper surface TS and the slope SS.

The inorganic insulating layer 5 covers the insulating layer 114 and covers the insulating layer 113 in the recess portion DP.

A plurality of surrounding partitions 7 are provided so as to overlap the upper surface TS and the recess portion DP of the organic insulating layer IL. Each surrounding partition 7 has an overhang shape.

Distance D1 related to the surrounding partitions 7 located in the recess portion DP and distance D2 related to the surrounding partitions 7 located above the upper surface TS are as described above.

FIG. 22 is a cross-sectional view showing another configuration example of the mother substrate 100.

The configuration example shown in FIG. 22 is different from that shown in FIG. 20 in respect that the organic insulating layer IL is a single-layer body of the insulating layer 12 at least around the recess portion DP.

The recess portion DP of the organic insulating layer IL is a penetration portion in the insulating layer 12. This penetration portion is formed such that the insulating layer 113 is exposed. The upper surface TS is the upper surface of the insulating layer 12. The slope SS is a slope which is connected to the upper surface of the insulating layer 12. The edge portion DPE of the recess portion DP is defined as the edge portion of the insulating layer 12. The edge portion TSE of the upper surface TS is defined as the intersection of the upper surface TS and the slope SS.

The inorganic insulating layer 5 covers the insulating layer 12 and covers the insulating layer 113 in the recess portion DP.

A plurality of surrounding partitions 7 are provided so as to overlap the upper surface TS and the recess portion DP of the organic insulating layer IL. Each surrounding partition 7 has an overhang shape.

Distance D1 related to the surrounding partitions 7 located in the recess portion DP and distance D2 related to the surrounding partitions 7 located above the upper surface TS are as described above.

Figure 23:
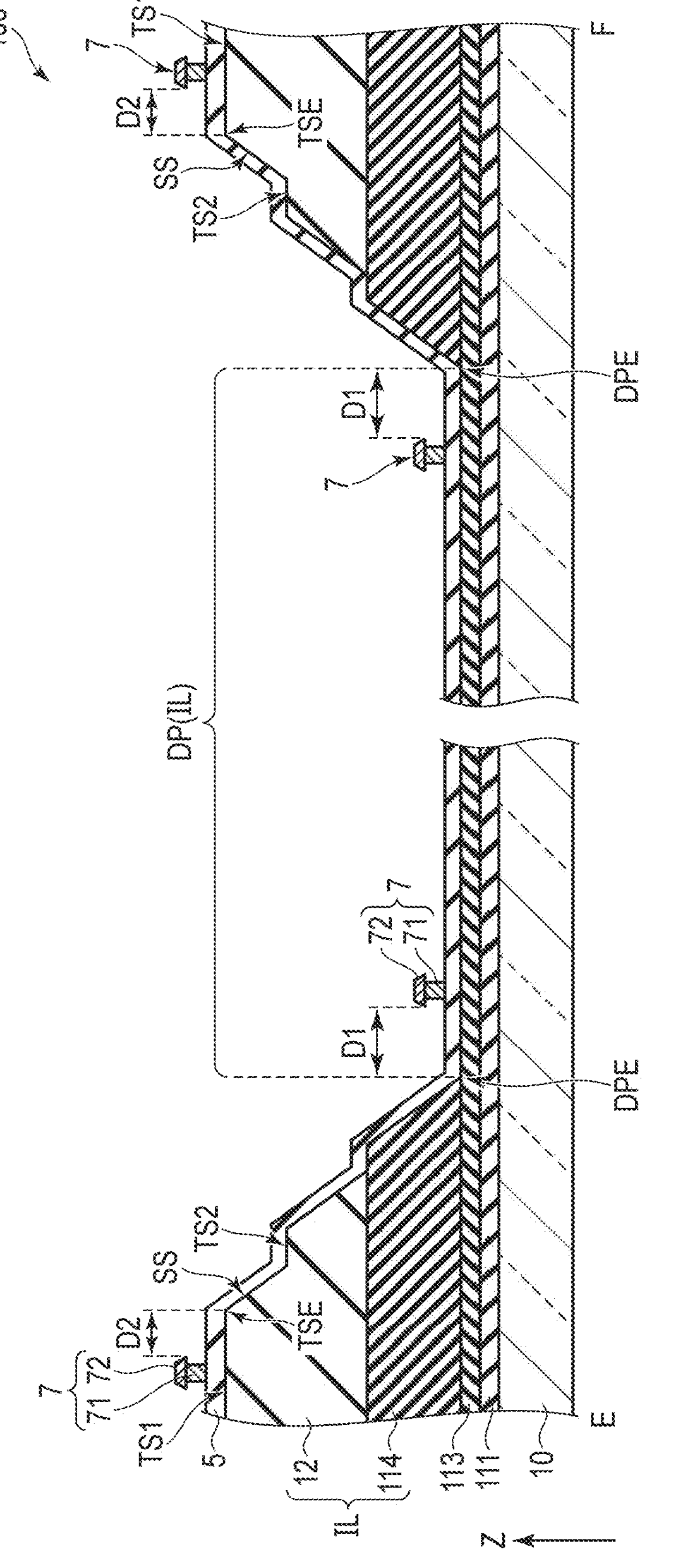
FIG. 23 is a cross-sectional view showing another configuration example of the mother substrate 100.

FIG. 23 is a cross-sectional view showing another configuration example of the mother substrate 100.

The configuration example shown in FIG. 23 is different from that shown in FIG. 20 in respect that the organic insulating layer IL has a stepwise cross section.

The insulating layer 114 extends toward the recess portion DP relative to the insulating layer 12. The insulating layer 12 is provided on the insulating layer 114 such that the insulating layer 114 close to the recess portion DP is exposed.

Around the recess portion DP, the organic insulating layer IL has an upper surface TS1 located in the uppermost portion, an upper surface TS2 located in a portion lower than the upper surface TS1, and a slope SS between the upper surface TS1 and the upper surface TS2. The upper surface TS2 is located between the upper surface TS1 and the recess portion DP. The upper surfaces TS1 and TS2 are the upper surfaces of the insulating layer 12. The slope SS is the slope of the insulating layer 12. The insulating layer 12 having this stepwise cross section is formed by adjusting the exposure amount for each portion.

The recess portion DP of the organic insulating layer IL is a penetration portion in the insulating layer 114. This penetration portion is formed such that the insulating layer 113 is exposed. The edge portion DPE of the recess portion DP is defined as the edge portion of the insulating layer 114. The edge portion TSE of the upper surface TS1 is defined as the intersection of the upper surface TS1 and the slope SS.

The inorganic insulating layer 5 covers the insulating layer 12 and the insulating layer 114 and covers the insulating layer 113 in the recess portion DP.

A plurality of surrounding partitions 7 are provided so as to overlap the upper surface TS1 and the recess portion DP of the organic insulating layer IL. Each surrounding partition 7 has an overhang shape.

Distance D1 related to the surrounding partitions 7 located in the recess portion DP and distance D2 related to the surrounding partitions 7 located above the upper surface TS are as described above.

FIG. 24 is a cross-sectional view showing another configuration example of the mother substrate 100.

The configuration example shown in FIG. 24 is different from that shown in FIG. 20 in respect that the organic insulating layer IL has a stepwise cross section.

The insulating layer 114 is retracted relative to the insulating layer 12 and is covered with the insulating layer 12.

The organic insulating layer IL has an upper surface TS1, an upper surface TS2 and a slope SS around the recess portion DP. The upper surface TS2 is located between the upper surface TS1 and the recess portion DP. The upper surfaces TS1 and TS2 are the upper surfaces of the insulating layer 12. The slope SS is the slope of the insulating layer 12. The insulating layer 12 having this stepwise cross section is formed by adjusting the exposure amount for each portion.

The recess portion DP of the organic insulating layer IL is a penetration portion in the insulating layer 12. This penetration portion is formed such that the insulating layer 113 is exposed. The edge portion DPE of the recess portion DP is defined as the edge portion of the insulating layer 12. The edge portion TSE of the upper surface TS1 is defined as the intersection of the upper surface TS1 and the slope SS.

The inorganic insulating layer 5 covers the insulating layer 12 and covers the insulating layer 113 in the recess portion DP.

A plurality of surrounding partitions 7 are provided so as to overlap the upper surface TS1 and the recess portion DP of the organic insulating layer IL. Each surrounding partition 7 has an overhang shape.

Distance D1 related to the surrounding partitions 7 located in the recess portion DP and distance D2 related to the surrounding partitions 7 located above the upper surface TS1 are as described above.

Figure 25:
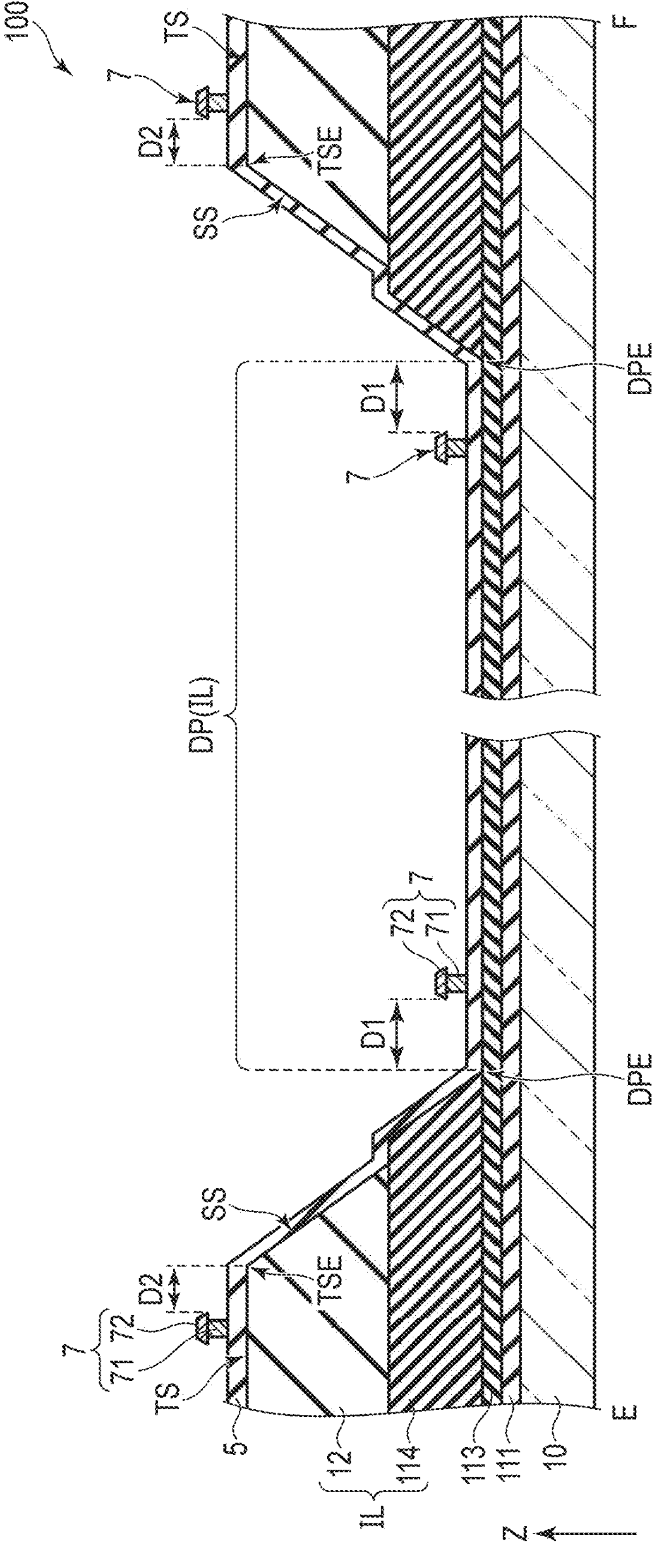
FIG. 25 is a cross-sectional view showing another configuration example of the mother substrate 100.

FIG. 25 is a cross-sectional view showing another configuration example of the mother substrate 100.

The configuration example shown in FIG. 25 is different from that shown in FIG. 20 in respect that the organic insulating layer IL has a stepwise cross section.

The insulating layer 114 extends toward the recess portion DP relative to the insulating layer 12. The insulating layer 12 is provided on the insulating layer 114.

The organic insulating layer IL has an upper surface TS and a slope SS. The upper surface TS is the upper surface of the insulating layer 12. The slope SS is the slope of the insulating layer 12.

The recess portion DP of the organic insulating layer IL is a penetration portion in the insulating layer 114. This penetration portion is formed such that the insulating layer 113 is exposed. The edge portion DPE of the recess portion DP is defined as the edge portion of the insulating layer 114. The edge portion TSE of the upper surface TS is defined as the intersection of the upper surface TS and the slope SS.

The inorganic insulating layer 5 covers the insulating layer 12 and the insulating layer 114 and covers the insulating layer 113 in the recess portion DP.

A plurality of surrounding partitions 7 are provided so as to overlap the upper surface TS and recess portion DP of the organic insulating layer IL. Each surrounding partition 7 has an overhang shape.

Distance D1 related to the surrounding partitions 7 located in the recess portion DP and distance D2 related to the surrounding partitions 7 located above the upper surface TS are as described above.

Figure 26:
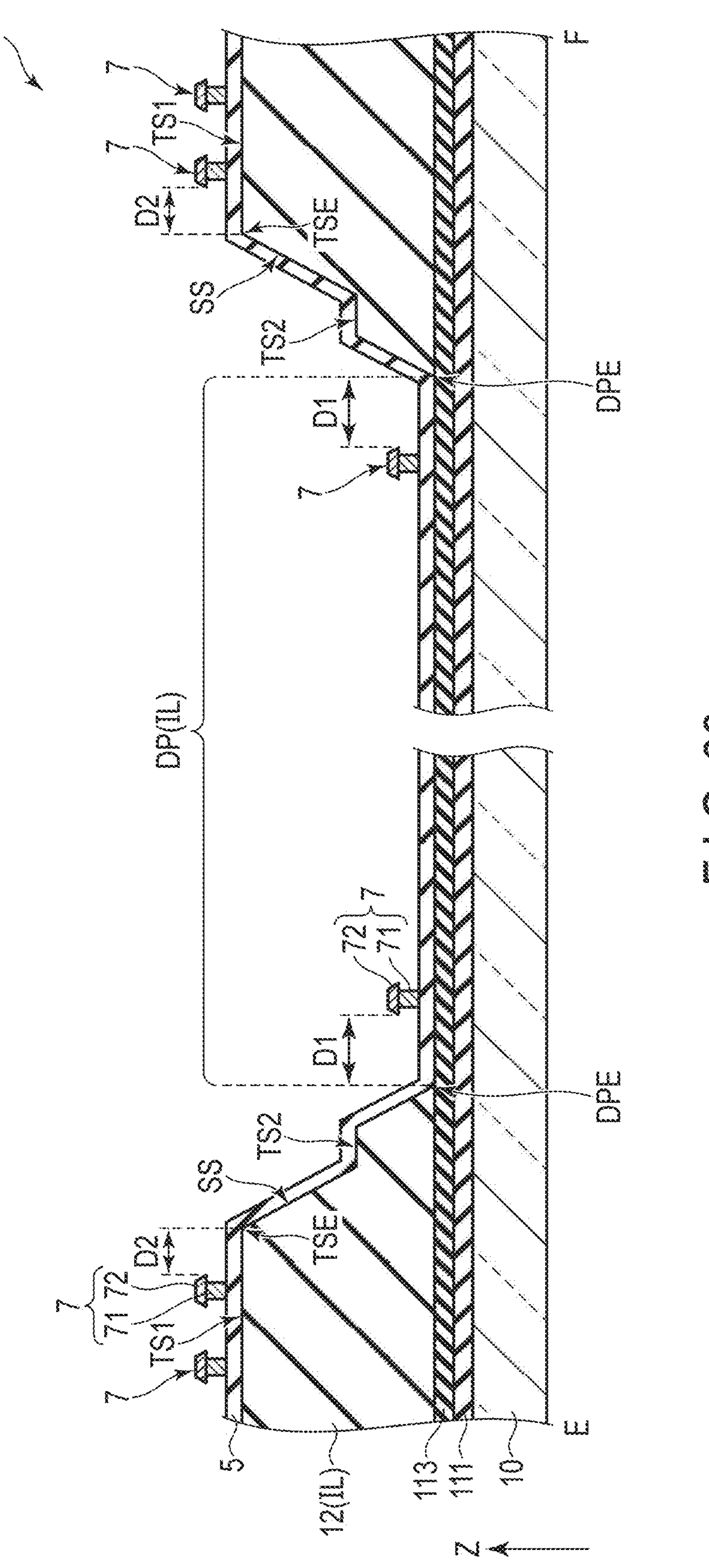
FIG. 26 is a cross-sectional view showing another configuration example of the mother substrate 100.

FIG. 26 is a cross-sectional view showing another configuration example of the mother substrate 100.

The configuration example shown in FIG. 26 is different from that shown in FIG. 20 in respect that the organic insulating layer IL is a single-layer body and further has a stepwise cross section at least around the recess portion DP.

The insulating layer 12 is provided on the insulating layer 113.

The organic insulating layer IL has an upper surface TS1, an upper surface TS2 and a slope SS around the recess portion DP. The upper surface TS2 is located between the upper surface TS1 and the recess portion DP. The upper surfaces TS1 and TS2 are the upper surfaces of the insulating layer 12. The slope SS is the slope of the insulating layer 12. The insulating layer 12 having this stepwise cross section is formed by adjusting the exposure amount for each portion.

The recess portion DP of the organic insulating layer IL is a penetration portion in the insulating layer 12. This penetration portion is formed such that the insulating layer 113 is exposed. The edge portion DPE of the recess portion DP is defined as the edge portion of the insulating layer 12. The edge portion TSE of the upper surface TS1 is defined as the intersection of the upper surface TS1 and the slope SS.

The inorganic insulating layer 5 covers the insulating layer 12 and covers the insulating layer 113 in the recess portion DP.

A plurality of surrounding partitions 7 are provided so as to overlap the upper surface TS1 and the recess portion DP of the organic insulating layer IL. Each surrounding partition 7 has an overhang shape.

Distance D1 related to the surrounding partitions 7 located in the recess portion DP and distance D2 related to the surrounding partitions 7 located above the upper surface TS1 are as described above.

Figure 27:
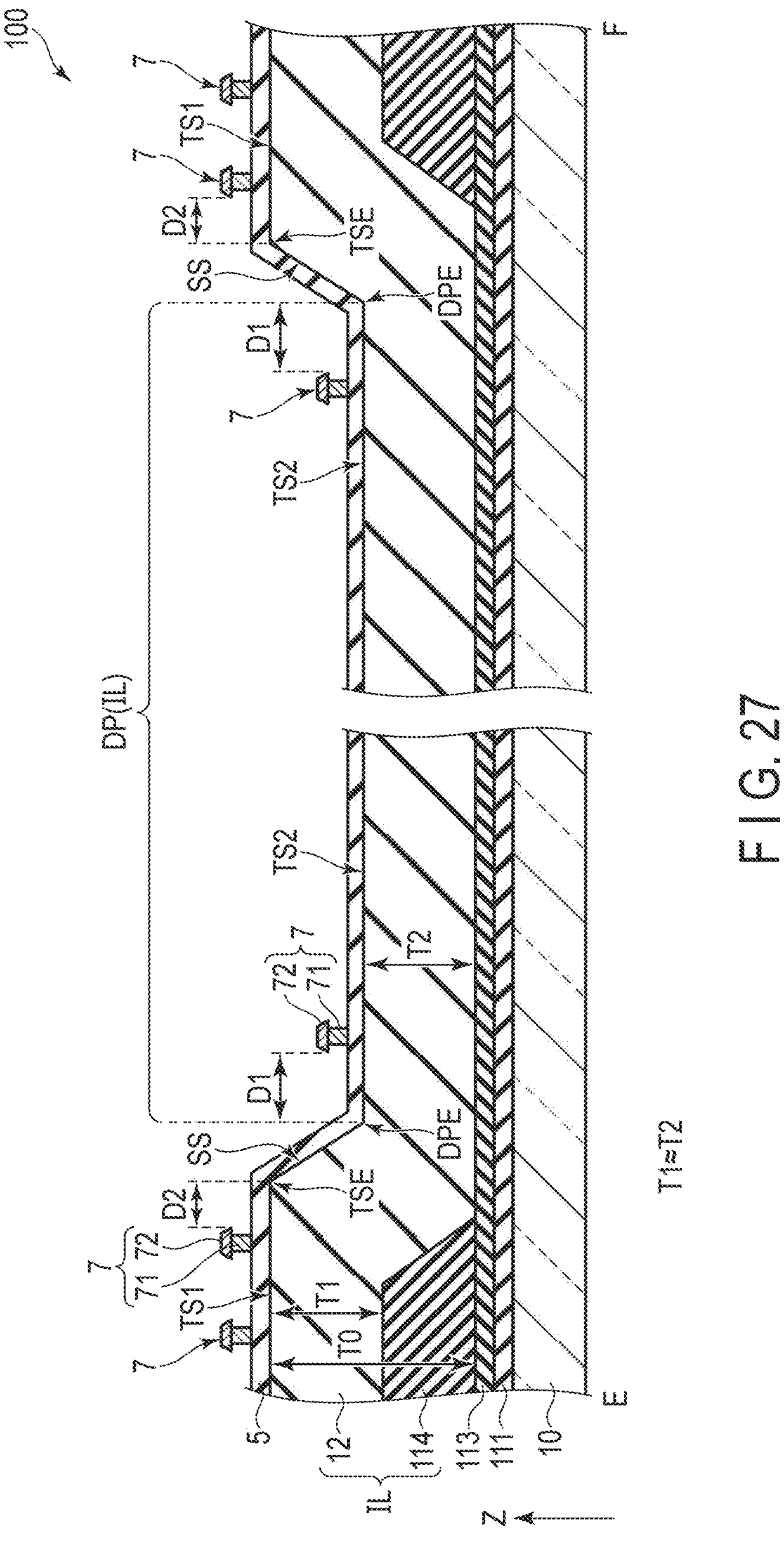
FIG. 27 is a cross-sectional view showing another configuration example of the mother substrate 100.

FIG. 27 is a cross-sectional view showing another configuration example of the mother substrate 100.

The configuration example shown in FIG. 27 is different from that shown in FIG. 20 in respect that the recess portion DP of the organic insulating layer IL is a thin portion.

The insulating layer 114 is provided on the insulating layer 113. The insulating layer 12 covers the insulating layer 113 and the insulating layer 114.

The organic insulating layer IL has the insulating layer 114 and the insulating layer 12. The organic insulating layer IL has a flat upper surface TS1, the recess portion DP which is concave relative to the upper surface TS1, a flat upper surface TS2 located in a portion lower than the upper surface TS1, and a slope SS which is located between the upper surface TS1 and the upper surface TS2 and surrounds the recess portion DP. The upper surface TS2 corresponds to the bottom surface of the recess portion DP. The recess portion DP corresponds to a thin portion which is formed by only the insulating layer 12 of the organic insulating layer IL. In the recess portion DP, the insulating layer 113 is not exposed from the organic insulating layer IL.

Thickness T0 of the organic insulating layer IL is the sum of the thicknesses of the insulating layer 114 and the insulating layer 12 and corresponds to the length from the upper surface of the insulating layer 113 to the upper surface TS1 in a third direction Z. Thickness T2 of the organic insulating layer IL corresponds to the thickness of the thin portion which forms the recess portion DP in the organic insulating layer IL, and is the thickness of the insulating layer 12 only (not including the insulating layer 114). Thus, thickness T2 corresponds to the thickness from the upper surface of the insulating layer 113 to the upper surface TS2 in the third direction Z. Thickness T2 is less than thickness T0 ($T0>T2$). Thickness T1 of the insulating layer 12 overlapping the insulating layer 114 is nearly equal to thickness T2 ($T1 \approx T2$).

The upper surfaces TS1 and TS2 are the upper surfaces of the insulating layer 12. The slope SS is the slope of the insulating layer 12. The edge portion DPE of the recess portion DP is defined as the intersection of the upper surface TS2 and the slope SS. The edge portion TSE of the upper surface TS1 is defined as the intersection of the upper surface TS1 and the slope SS.

The inorganic insulating layer 5 covers the insulating layer 12.

A plurality of surrounding partitions 7 are provided so as to overlap the upper surface TS1 and the recess portion DP of the organic insulating layer IL. Each surrounding partition 7 has an overhang shape.

Distance D1 related to the surrounding partitions 7 located above the upper surface TS2 or in the recess portion DP and distance D2 related to the surrounding partitions 7 located above the upper surface TS1 are as described above.

Figure 28:
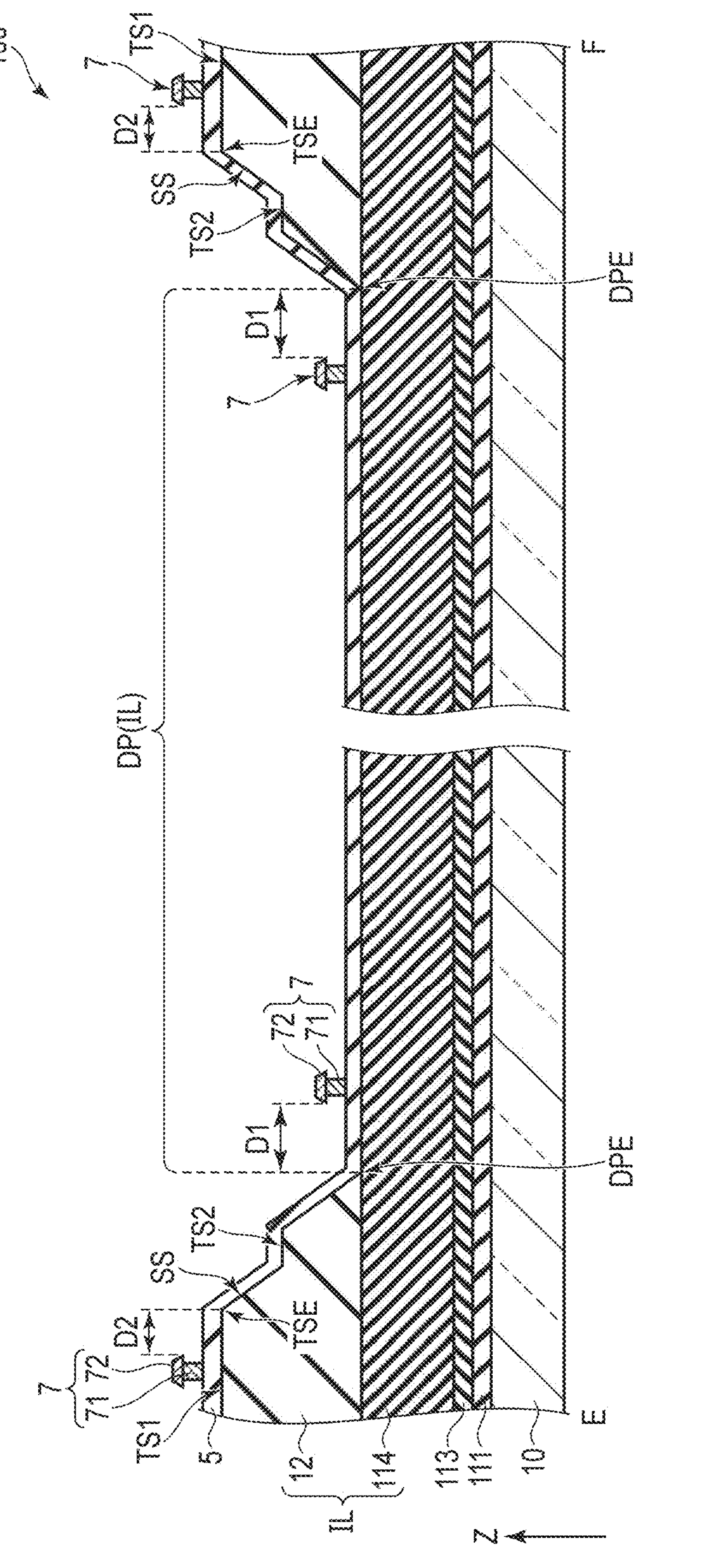
FIG. 28 is a cross-sectional view showing another configuration example of the mother substrate 100.

FIG. 28 is a cross-sectional view showing another configuration example of the mother substrate 100.

The configuration example shown in FIG. 28 is different from that shown in FIG. 27 in respect that the organic insulating layer IL has a stepwise cross section, and the recess portion DP of the organic insulating layer IL is a thin portion.

The insulating layer 114 is provided on the insulating layer 113. The insulating layer 12 is provided on the insulating layer 114.

Around the recess portion DP, the organic insulating layer IL has an upper surface TS1 located in the uppermost portion, an upper surface TS2 located in a portion lower than the upper surface TS1, and a slope SS between the upper surface TS1 and the upper surface TS2. The upper surface TS2 is located between the upper surface TS1 and the recess portion DP. The upper surfaces TS1 and TS2 are the upper surfaces of the insulating layer 12. The slope SS is the slope of the insulating layer 12. The insulating layer 12 having this stepwise cross section is formed by adjusting the exposure amount for each portion.

The recess portion DP of the organic insulating layer IL is a penetration portion in the insulating layer 12. This penetration portion is formed such that the insulating layer 114 is exposed. The recess portion DP of the organic insulating layer IL corresponds to a thin portion which is formed by only the insulating layer 114 of the organic insulating layer IL. In the recess portion DP, the insulating layer 113 is not exposed from the organic insulating layer IL. The edge portion DPE of the recess portion DP is defined as the edge portion of the insulating layer 12. The edge portion TSE of the upper surface TS1 is defined as the intersection of the upper surface TS1 and the slope SS.

The inorganic insulating layer 5 covers the insulating layer 12 and the insulating layer 114.

A plurality of surrounding partitions 7 are provided so as to overlap the upper surface TS1 and the recess portion DP of the organic insulating layer IL. Each surrounding partition 7 has an overhang shape.

Distance D1 related to the surrounding partitions 7 located above the insulating layer 114 or in the recess portion DP and distance D2 related to the surrounding partitions 7 located above the upper surface TS1 are as described above.

Figure 29:
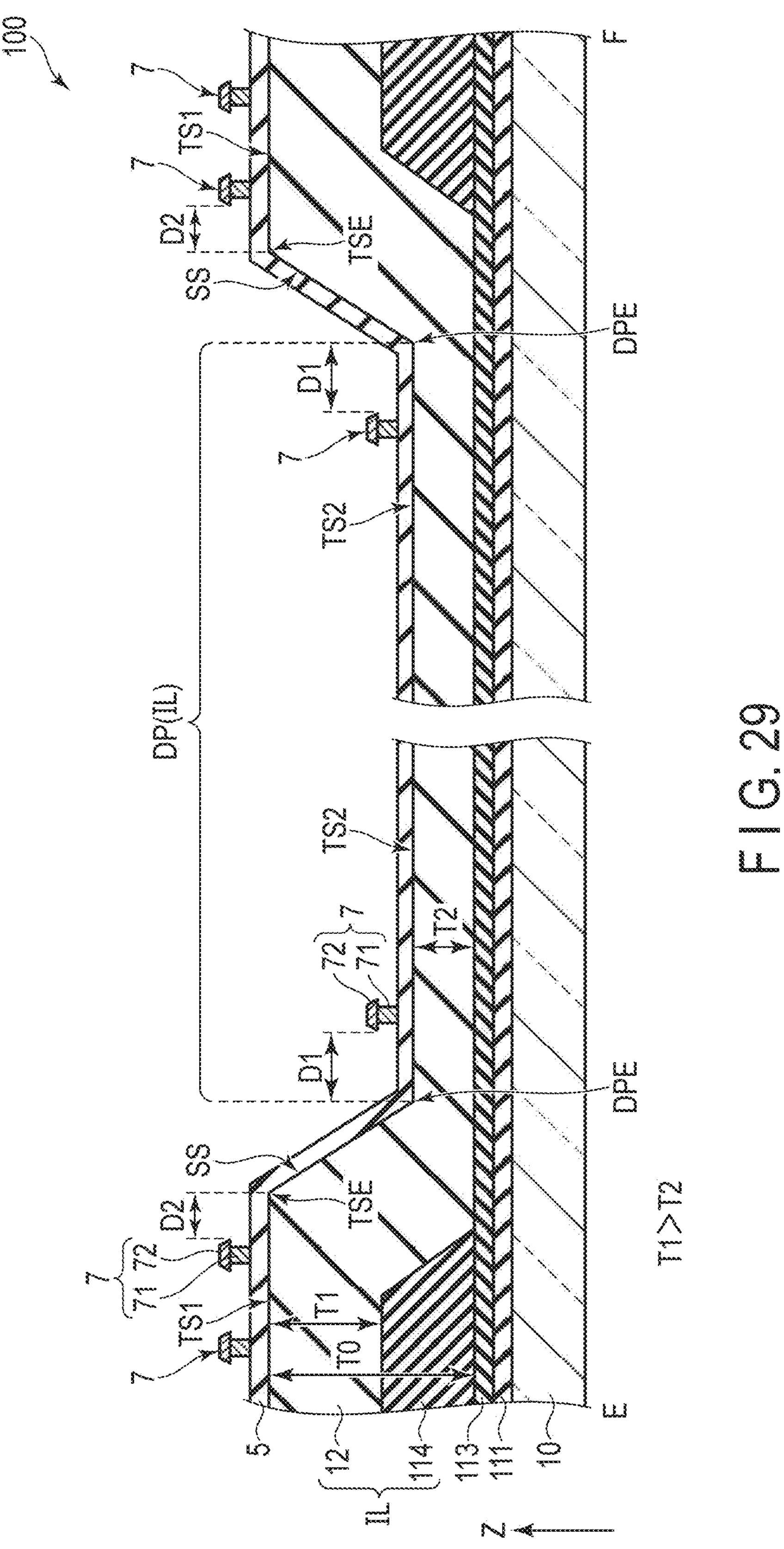
FIG. 29 is a cross-sectional view showing another configuration example of the mother substrate 100.

FIG. 29 is a cross-sectional view showing another configuration example of the mother substrate 100.

The configuration example shown in FIG. 29 is different from that shown in FIG. 20 in respect that the recess portion DP of the organic insulating layer IL is a thin portion.

The insulating layer 114 and the insulating layer 113 are covered with the insulating layer 12.

The organic insulating layer IL has an upper surface TS1, an upper surface TS2 and a slope SS. The upper surface TS2 corresponds to the bottom surface of the recess portion DP. The recess portion DP corresponds to a thin portion which is formed by only the insulating layer 12 of the organic insulating layer IL. In the recess portion DP, the insulating layer 113 is not exposed from the organic insulating layer IL.

Thickness T2 is less than thickness T0 ($T0>T2$). Thickness T2 is less than thickness T1 ($T1>T2$). The upper surfaces TS1 and TS2 are the upper surfaces of the insulating layer 12. The slope SS is the slope of the insulating layer 12. The insulating layer 12 having this stepwise cross section is formed by adjusting the exposure amount for each portion.

The edge portion DPE of the recess portion DP is defined as the intersection of the upper surface TS2 and the slope SS. The edge portion TSE of the upper surface TS1 is defined as the intersection of the upper surface TS1 and the slope SS.

The inorganic insulating layer 5 covers the insulating layer 12.

A plurality of surrounding partitions 7 are provided so as to overlap the upper surface TS1 and the recess portion DP of the organic insulating layer IL. Each surrounding partition 7 has an overhang shape.

Distance D1 related to the surrounding partitions 7 located above the upper surface TS2 or in the recess portion DP and distance D2 related to the surrounding partitions 7 located above the upper surface TS1 are as described above.

FIG. 30 is a cross-sectional view showing another configuration example of the mother substrate 100.

The configuration example shown in FIG. 30 is different from that shown in FIG. 20 in respect that the recess portion DP of the organic insulating layer IL is a thin portion.

The insulating layer 114 is provided on the insulating layer 113. The insulating layer 12 is provided on the insulating layer 114.

The organic insulating layer IL has an upper surface TS and a slope SS. The upper surface TS is the upper surface of the insulating layer 12. The slope SS is the slope of the insulating layer 12.

The recess portion DP of the organic insulating layer IL is a penetration portion in the insulating layer 12. This penetration portion is formed such that the insulating layer 114 is exposed. The recess portion DP of the organic insulating layer IL corresponds to a thin portion which is formed by only the insulating layer 114 of the organic insulating layer IL. In the recess portion DP, the insulating layer 113 is not exposed from the organic insulating layer IL. The edge portion DPE of the recess portion DP is defined as the edge portion of the insulating layer 12. The edge portion TSE of the upper surface TS is defined as the intersection of the upper surface TS and the slope SS.

The inorganic insulating layer 5 covers the insulating layer 12 and the insulating layer 114.

A plurality of surrounding partitions 7 are provided so as to overlap the upper surface TS and the recess portion DP of the organic insulating layer IL. Each surrounding partition 7 has an overhang shape.

Distance D1 related to the surrounding partitions 7 located above the insulating layer 114 or in the recess portion DP and distance D2 related to the surrounding partitions 7 located above the upper surface TS are as described above.

Figure 31:
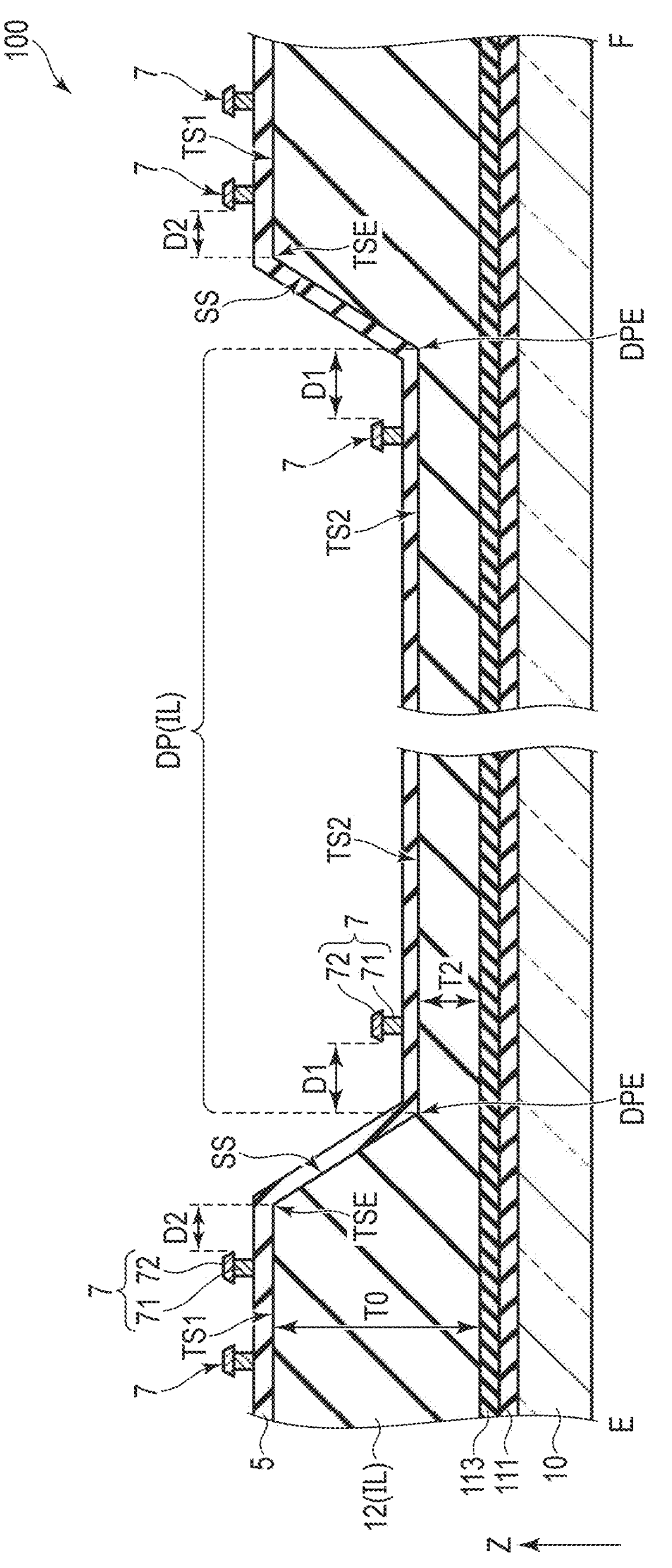
FIG. 31 is a cross-sectional view showing another configuration example of the mother substrate 100.

FIG. 31 is a cross-sectional view showing another configuration example of the mother substrate 100.

The configuration example shown in FIG. 31 is different from that shown in FIG. 20 in respect that the recess portion DP of the organic insulating layer IL is a thin portion, and the organic insulating layer IL is a single-layer body and further has a stepwise cross section at least around the recess portion DP.

The insulating layer 12 is provided on the insulating layer 113.

The organic insulating layer IL has an upper surface TS1, an upper surface TS2 and a slope SS. The upper surface TS2 corresponds to the bottom surface of the recess portion DP. The recess portion DP corresponds to a thin portion which is formed by only the insulating layer 12 of the organic insulating layer IL. In the recess portion DP, the insulating layer 113 is not exposed from the organic insulating layer IL.

Thickness T0 of the organic insulating layer IL corresponds to the thickness of the insulating layer 12 from the upper surface of the insulating layer 113 to the upper surface TS1 in the third direction Z. Thickness T2 of the organic insulating layer IL is the thickness of the thin portion which forms the recess portion DP in the organic insulating layer IL, and corresponds to the thickness of the insulating layer 12 from the upper surface of the insulating layer 113 to the upper surface TS2 in the third direction Z. Thickness T2 is less than thickness T0 (T0>T2).

The upper surfaces TS1 and TS2 are the upper surfaces of the insulating layer 12. The slope SS is the slope of the insulating layer 12. The insulating layer 12 having this stepwise cross section is formed by adjusting the exposure amount for each portion. The edge portion DPE of the recess portion DP is defined as the intersection of the upper surface TS2 and the slope SS. The edge portion TSE of the upper surface TS1 is defined as the intersection of the upper surface TS1 and the slope SS.

The inorganic insulating layer 5 covers the insulating layer 12.

A plurality of surrounding partitions 7 are provided so as to overlap the upper surface TS1 and the recess portion DP of the organic insulating layer IL. Each surrounding partition 7 has an overhang shape.

Distance D1 related to the surrounding partitions 7 located above the upper surface TS2 or in the recess portion DP and distance D2 related to the surrounding partitions 7 located above the upper surface TS1 are as described above.

Regarding the configuration examples shown in FIG. 20 to FIG. 31, the inorganic insulating layer 5 may have an aperture OP which overlaps the recess portion DP in a manner similar to that of the configuration example shown in FIG. 12.

Figure 32:
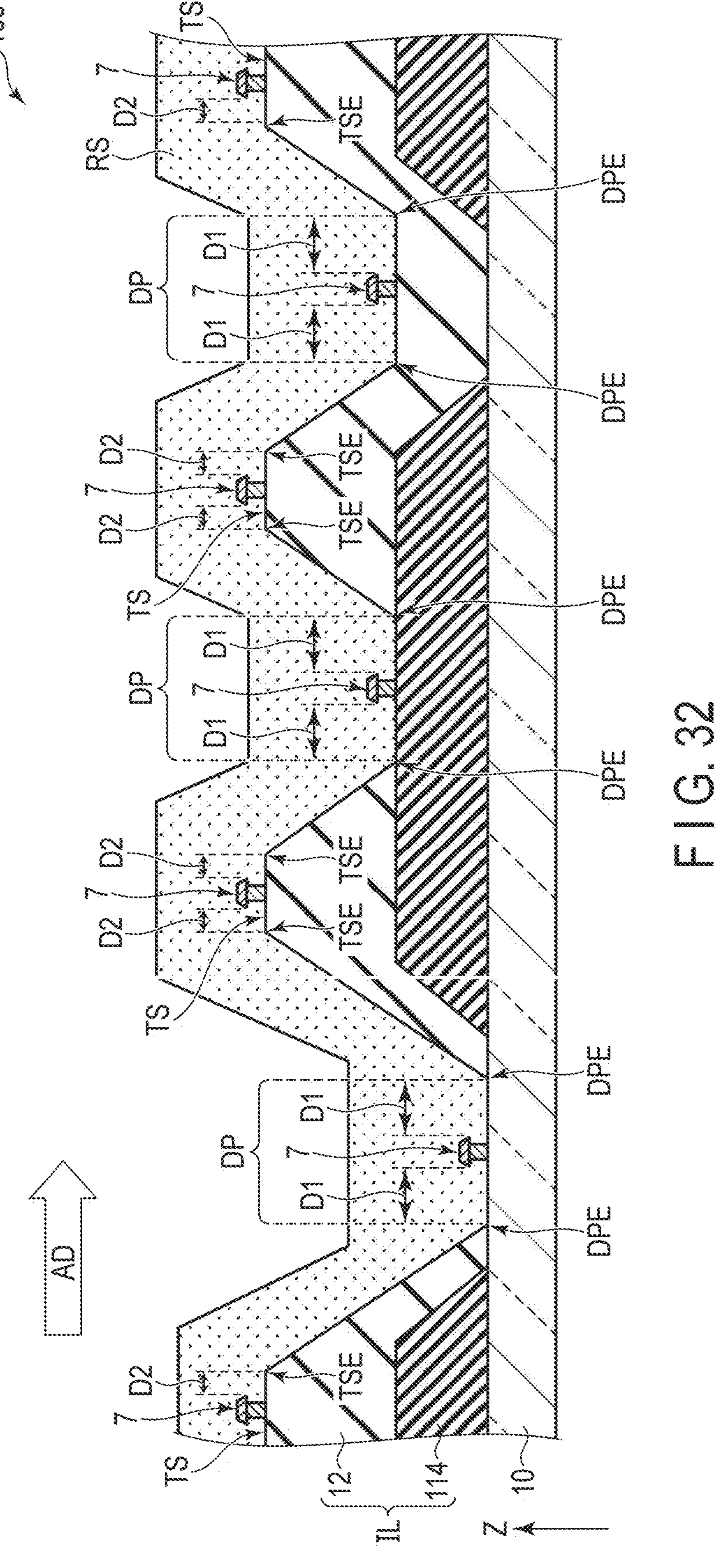
FIG. 32 is a diagram for explaining one of the effects of an embodiment.

FIG. 32 is a diagram for explaining one of the effects of the embodiment.

The mother substrate 100 has, as the recess portion DP of the organic insulating layer IL, a portion in which the insulating layer 114 and the insulating layer 12 are removed, a portion in which the insulating layer 12 is removed and the insulating layer 114 remains, and a portion in which the insulating layer 114 is removed and the insulating layer 12 remains. In the figure, the illustrations of elements other than the organic insulating layer IL, the surrounding partitions 7 and the resist RS are omitted.

For example, the process of forming the resist RS shown in FIG. 6 includes the process of applying the liquid resist RS. In the figure, arrow AD indicates the application direction of the resist RS.

In the recess portion DP of the organic insulating layer IL, each surrounding partition 7 is provided at the position of distance D1 from the edge portion DPE of the recess portion DP. Distance D1 is greater than or equal to 50 μm as described above. By this configuration, when the resist RS is applied to the recess portion DP, the resist RS flows into the area between each surrounding partition 7 and the slope of the organic insulating layer IL (the area near the edge portion DPE) and extends while contacting each surrounding partition 7. In this manner, the formation of an undesired cavity in the resist RS is prevented. In other words, the area which should be protected at the time of subsequent etching can be assuredly covered with the resist RS.

As a result of consideration, the inventor confirmed that, in a case where distance D1 is less than 50 μm, when the resist RS flows into the recess portion DP, the lower side of the upper portion 72 of each surrounding partition 7 is not easily filled with the resist RS, and a cavity is easily formed around each surrounding partition 7.

On the upper surface TS of the organic insulating layer IL, each surrounding partition 7 is provided at the position of distance D2 from the edge portion TSE of the upper surface TS. Distance D2 is greater than or equal to 20 μm as described above. By this configuration, when the resist RS is applied, the resist RS flows into the recess portion DP, and further extends while contacting the surrounding partitions 7 located on the upper surface TS as well. In this manner, the formation of an undesired cavity in the resist RS is prevented.

As a result of consideration, the inventor confirmed that, in a case where distance D2 is less than 20 μm, a large step is formed by the recess portion DP of the organic insulating layer IL and each surrounding partition 7 provided on the upper surface TS, and thus, a cavity is easily formed near the edge portion DPE of the recess portion DP or around the surrounding partitions 7.

When a cavity is formed in the resist RS, the cavity may expand and burst in an environment where the pressure is reduced to dry the resist RS. In this case, the resist RS is partly lost, and the area to be protected is exposed from the resist RS. Thus, etching excessively proceeds, and desired patterning cannot be performed.

According to the embodiment, when the display element DE1 is formed, the defect of the resist RS is prevented, and thus, the sealing layer SE1 and the stacked film FL1 can be patterned into the desired shapes. When the display element DE2 is formed, the sealing layer SE2 and the stacked film FL2 can be patterned into the desired shapes. When the display element DE3 is formed, the sealing layer SE3 and the stacked film FL3 can be patterned into the desired shapes. In this way, the reduction in reliability can be prevented.

FIG. 33 is a plan view showing an example of the surrounding partitions 7 provided in the recess portion DP of the organic insulating layer IL.

The surrounding partitions 7 are provided in the recess portion DP. Each of the surrounding partitions 7 is formed into a grating shape in plan view. For example, each surrounding partition 7 is formed with a pattern similar to that of the grating-shaped partition 6 shown in FIG. 2. The surrounding partitions 7 are arranged in the first direction X and the second direction Y and are spaced apart from each other. Although details are omitted here, the surrounding partitions 7 are provided at the positions of distance D1 from the edge portion DPE of the recess portion DP as described above.

In the figure, arrow ADX indicates the application direction of the resist RS in the first direction X, and arrow ADY indicates the application direction of the resist RS in the second direction Y.

When the resist RS is applied in the first direction X, the resist RS flows into the recess portion DP. At this time, the resist RS passes through the portions between the surrounding partitions 7 arranged in the second direction Y and extends while contacting the surrounding partitions 7 without being dammed up by the surrounding partitions 7. Further, the area surrounded by each surrounding partition 7 is filled with the resist RS. In this manner, the formation of an undesired cavity in the resist RS is prevented.

When the resist RS is applied in the second direction Y, similarly, the resist RS passes through the portions between the surrounding partitions 7 arranged in the first direction X and extends while contacting the surrounding partitions 7 without being dammed up by the surrounding partitions 7. Further, the area surrounded by each surrounding partition 7 is filled with the resist RS. In this manner, the formation of an undesired cavity in the resist RS is prevented.

Thus, the defect of the resist RS is prevented, and the reduction in reliability can be prevented.

The technique of providing the surrounding partitions 7 so as to be spaced apart from each other in the recess portion DP in the above manner can be applied to all of the configuration examples disclosed in this specification.

FIG. 34 is a plan view showing another configuration example of the pad PD or the terminal TE.

The configuration example shown in FIG. 34 is different from that shown in FIG. 11 in respect that the inorganic insulating layer 5 has a removed portion LP outside the aperture OP. The removed portion LP is a penetration portion in the inorganic insulating layer 5 and is formed into a loop shape in plan view. This removed portion LP can be formed by the same process as, for example, the aperture AP1 etc., shown in FIG. 2 etc.

A part of the organic insulating layer IL close to the recess portion DP overlaps the removed portion LP. In the example shown in the figure, the organic insulating layer IL overlapping the removed portion LP is exposed from the inorganic insulating layer 5. In the removed portion LP, in some cases, the overlapping organic insulating layer IL may not be exposed, and the metal layer MT may be exposed from the inorganic insulating layer 5.

The recess portion DP corresponds to a penetration portion in the organic insulating layer IL and exposes part of the metal layer MT. The peripheral portion of the metal layer MT is covered with the organic insulating layer IL or the inorganic insulating layer 5.

Now, this specification explains several configuration examples of the sectional structure of the mother substrate 100 along the C-D line of FIG. 34. In the following configuration examples, main differences are explained.

Figure 35:
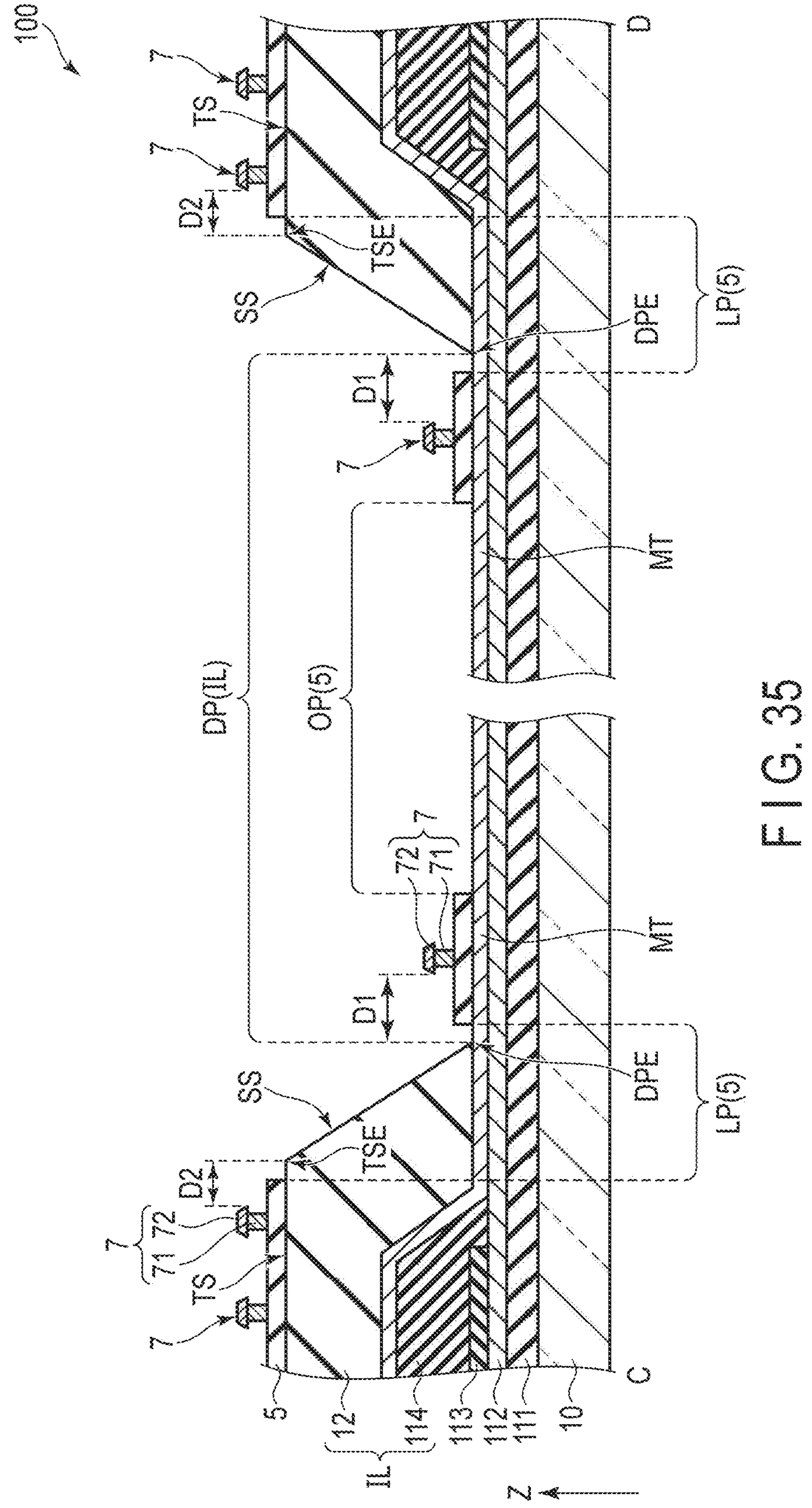
FIG. 35 is a cross-sectional view showing a configuration example of the mother substrate 100.

FIG. 35 is a cross-sectional view showing a configuration example of the mother substrate 100.

The configuration example shown in FIG. 35 is different from that shown in FIG. 12 in respect that the inorganic insulating layer 5 has a removed portion LP which overlaps the slope SS of the organic insulating layer IL.

The organic insulating layer IL has a flat upper surface TS, a recess portion DP which is concave relative to the upper surface TS, and a slope SS which surrounds the recess portion DP. The recess portion DP is a penetration portion in the organic insulating layer IL. The slope SS is the slope of the insulating layer 12.

The inorganic insulating layer 5 is provided on the upper surface TS and is provided on the metal layer MT in the recess portion DP. The inorganic insulating layer 5 has an aperture OP which overlaps the recess portion DP. The aperture OP is a penetration portion in the inorganic insulating layer 5. This penetration portion is formed such that the metal layer MT is exposed. The removed portion LP exposes the slope SS. In the example shown in the figure, the removed portion LP further exposes part of the upper surface TS, the edge portion TSE and the edge portion DPE, and exposes the metal layer MT between the edge portion DPE and the inorganic insulating layer 5 in the recess portion DP. The removed portion LP should overlap at least part of the slope SS.

FIG. 36 is a cross-sectional view showing another configuration example of the mother substrate 100.

The configuration example shown in FIG. 36 is different from that shown in FIG. 13 in respect that the inorganic insulating layer 5 has a removed portion LP which overlaps the slope SS of the organic insulating layer IL. The slope SS is the slope of the insulating layer 114. The removed portion LP exposes the metal layer MT which overlaps the slope SS.

Figure 37:
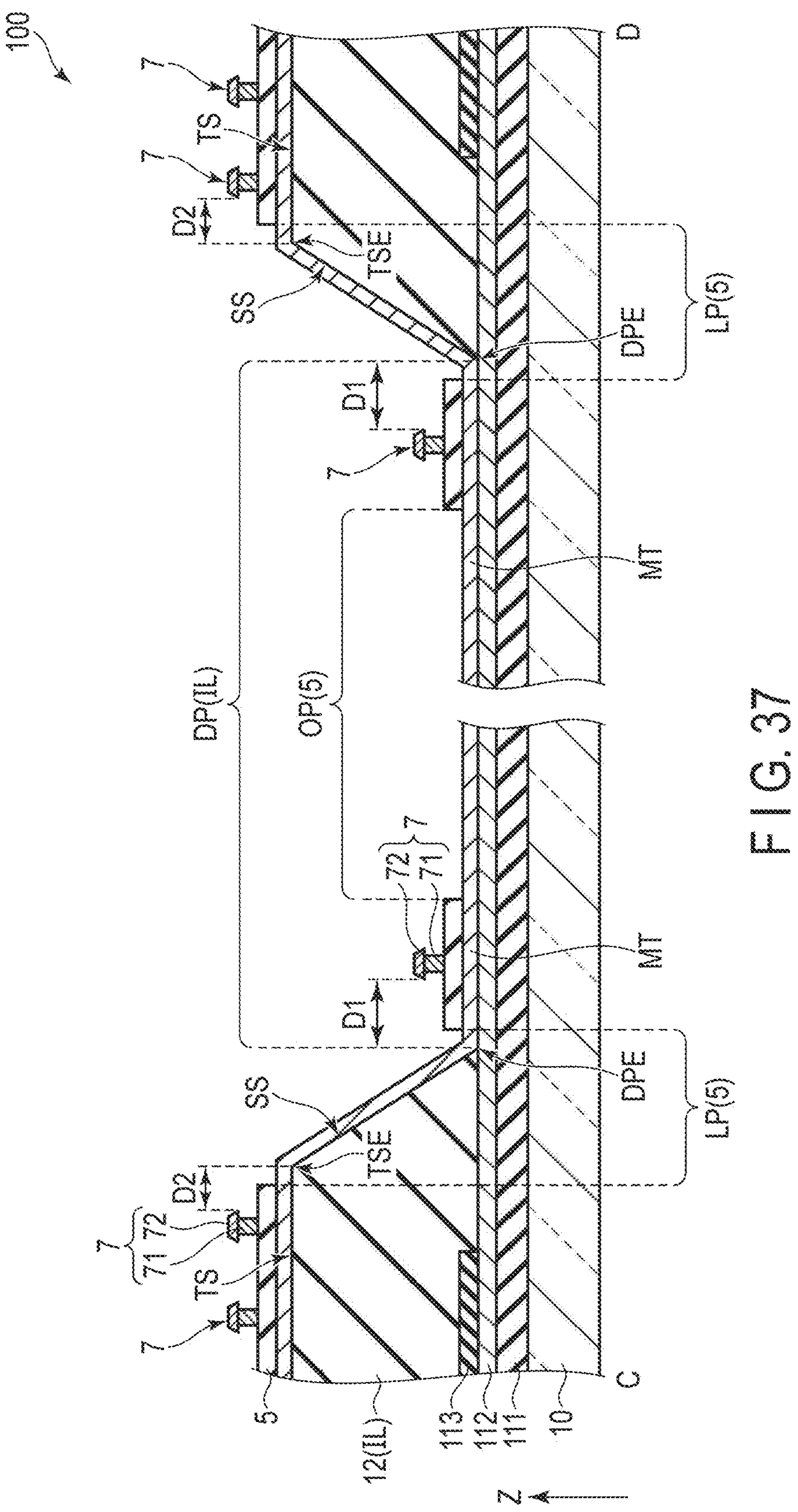
FIG. 37 is a cross-sectional view showing another configuration example of the mother substrate 100.

FIG. 37 is a cross-sectional view showing another configuration example of the mother substrate 100.

The configuration example shown in FIG. 37 is different from that shown in FIG. 14 in respect that the inorganic insulating layer 5 has a removed portion LP which overlaps the slope SS of the organic insulating layer IL. The slope SS is the slope of the insulating layer 12. The removed portion LP exposes the metal layer MT which overlaps the slope SS.

Figure 38:
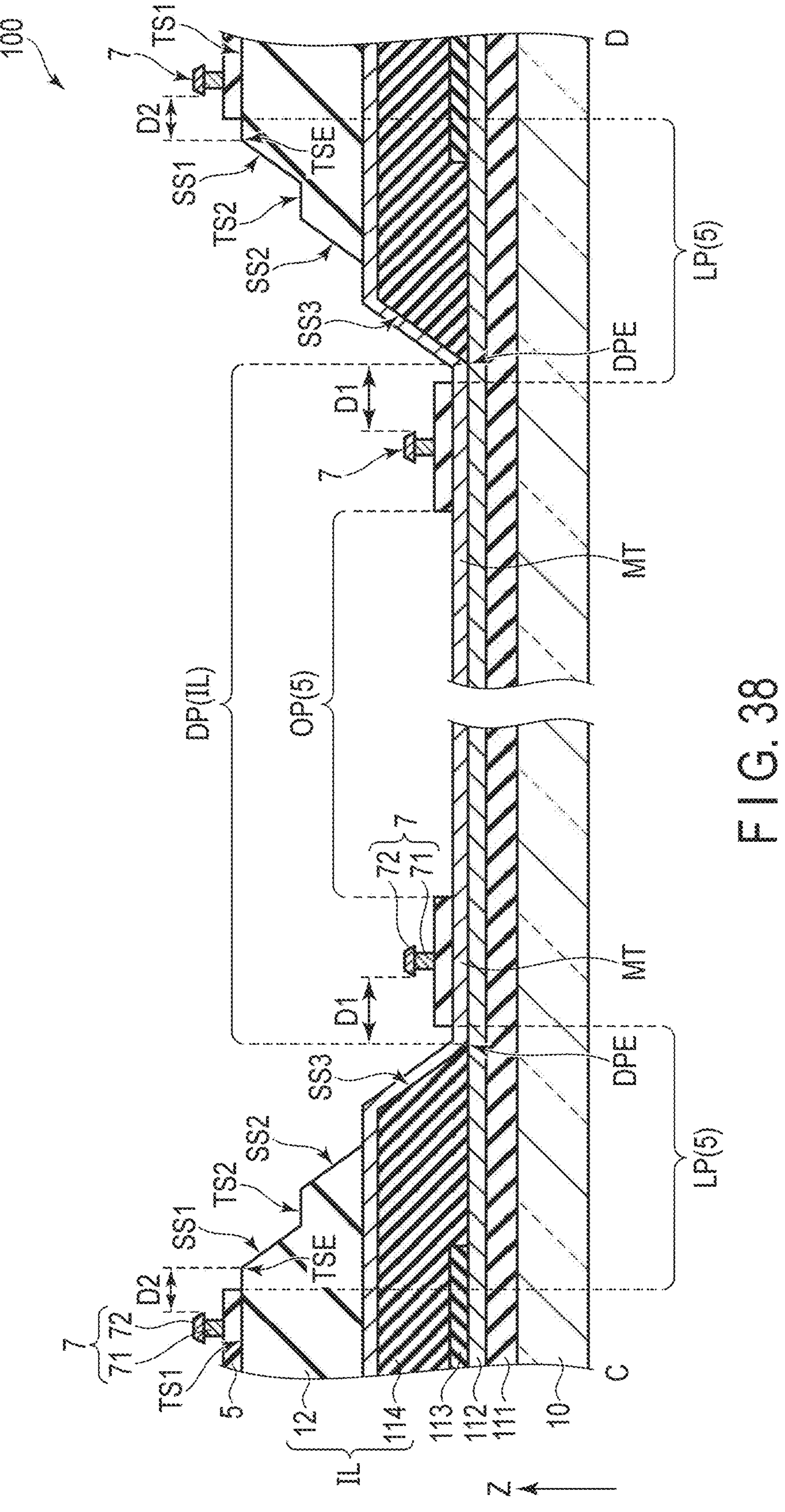
FIG. 38 is a cross-sectional view showing another configuration example of the mother substrate 100.

FIG. 38 is a cross-sectional view showing another configuration example of the mother substrate 100.

The configuration example shown in FIG. 38 is different from that shown in FIG. 15 in respect that the inorganic insulating layer 5 has a removed portion LP which overlaps the slope SS1, the slope SS2 and the slope SS3 of the organic insulating layer IL. The slope SS1 and the slope SS2 are the slopes of the insulating layer 12. The slope SS3 is the slope of the insulating layer 114. The removed portion LP exposes the slope SS1, the slope SS2 and the upper surface TS2, and further exposes the metal layer MT which overlaps the slope SS3.

Figure 39:
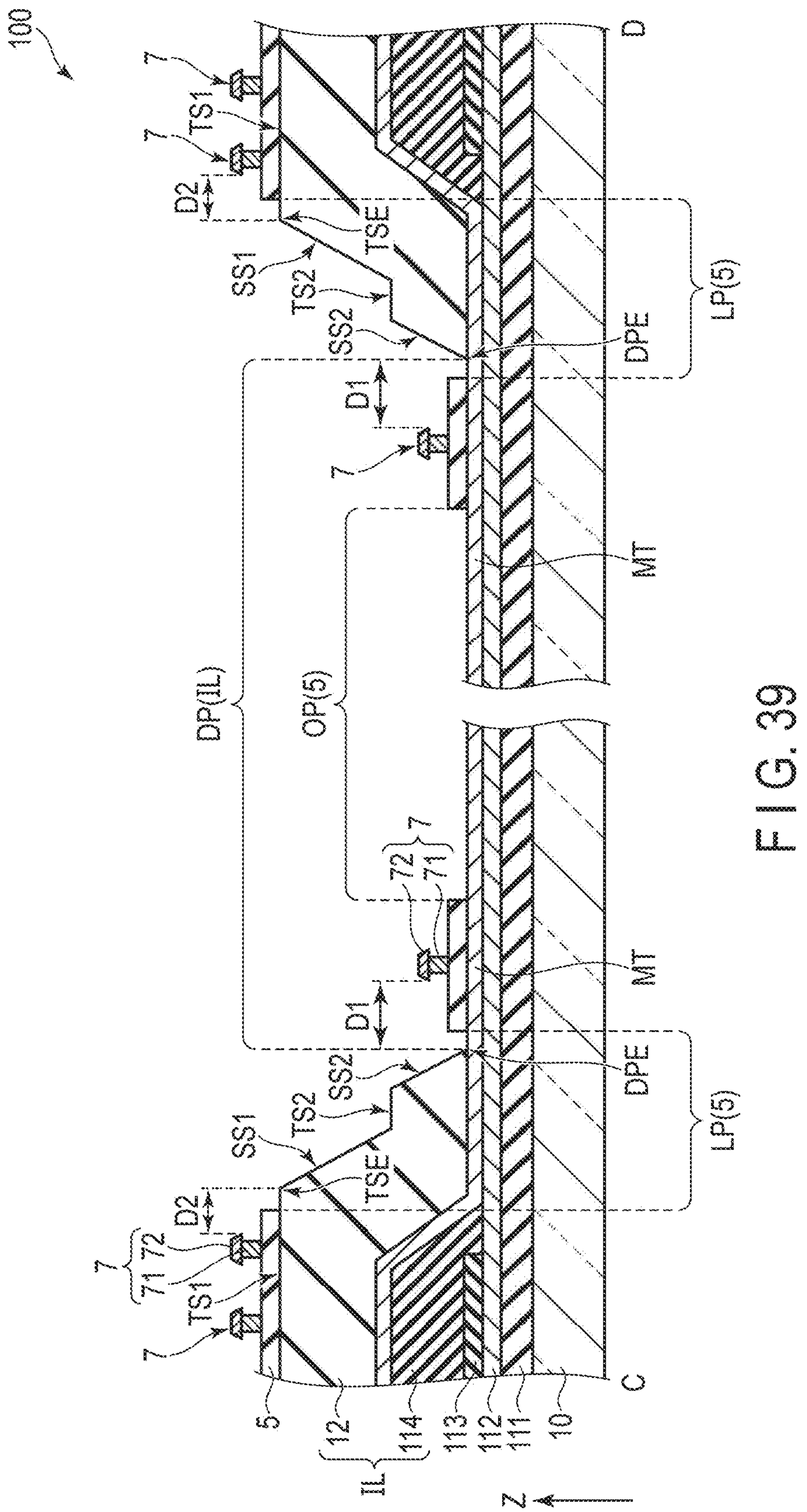
FIG. 39 is a cross-sectional view showing another configuration example of the mother substrate 100.

FIG. 39 is a cross-sectional view showing another configuration example of the mother substrate 100.

The configuration example shown in FIG. 39 is different from that shown in FIG. 16 in respect that the inorganic insulating layer 5 has a removed portion LP which overlaps the slope SS1 and the slope SS2 of the organic insulating layer IL. The slope SS1 and the slope SS2 are the slopes of the insulating layer 12. The removed portion LP exposes the slope SS1, the slope SS2 and the upper surface TS2.

Figure 40:
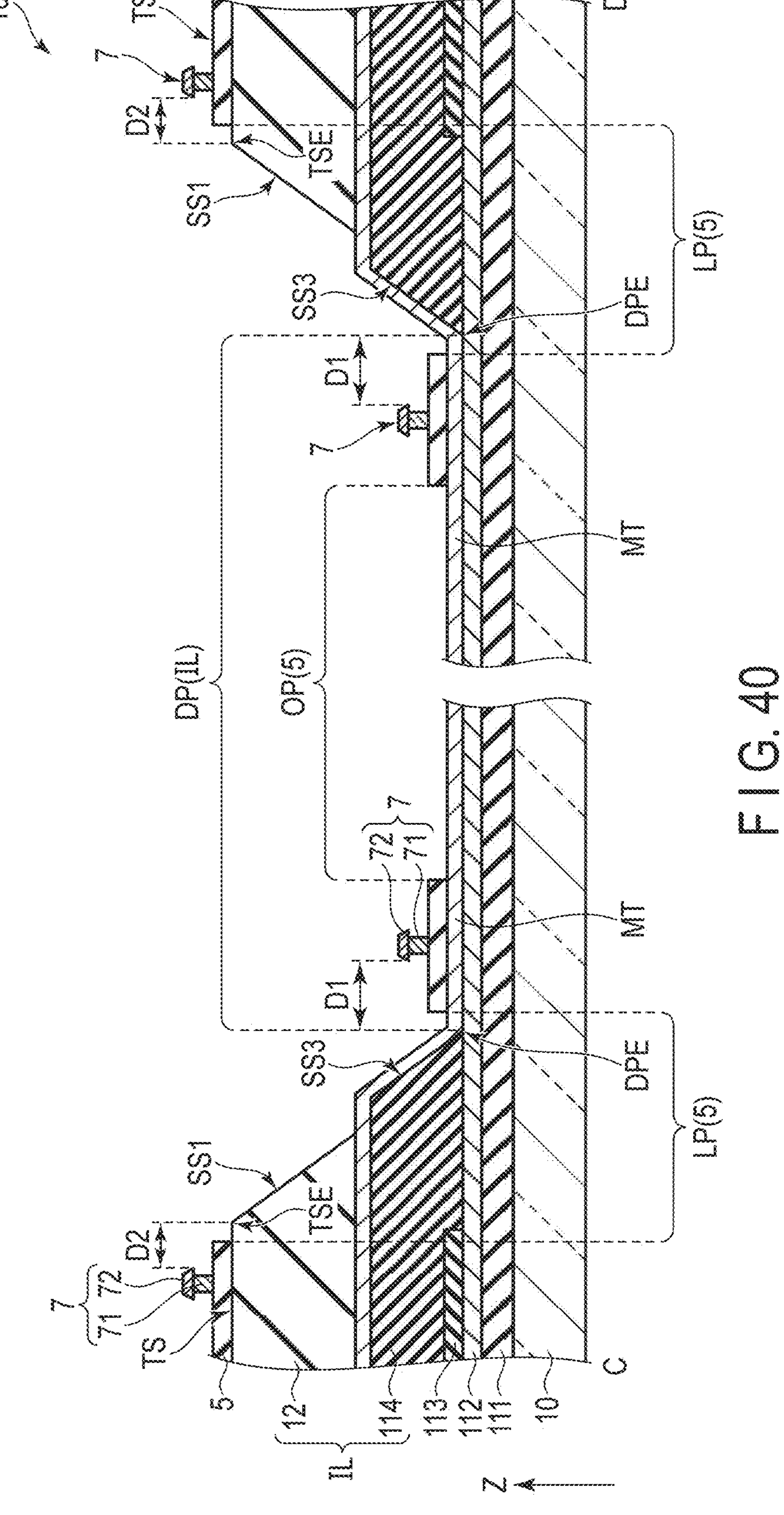
FIG. 40 is a cross-sectional view showing another configuration example of the mother substrate 100.

FIG. 40 is a cross-sectional view showing another configuration example of the mother substrate 100.

The configuration example shown in FIG. 40 is different from that shown in FIG. 17 in respect that the inorganic insulating layer 5 has a removed portion LP which overlaps the slope SS1 and the slope SS3 of the organic insulating layer IL. The slope SS1 is the slope of the insulating layer 12. The slope SS3 is the slope of the insulating layer 114. The removed portion LP exposes the slope SS1, and further exposes the metal layer MT which overlaps the slope SS3.

Figure 41:
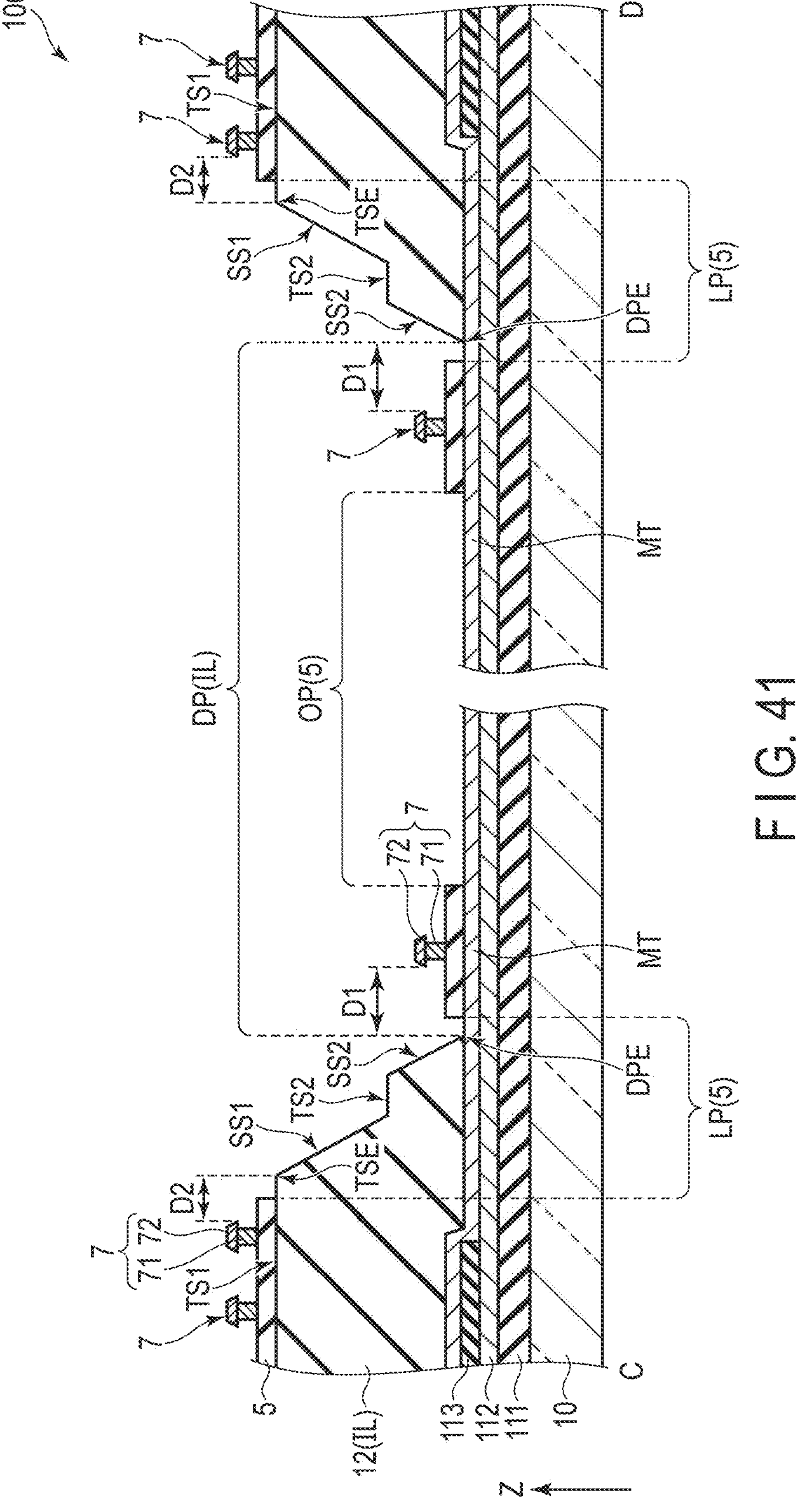
FIG. 41 is a cross-sectional view showing another configuration example of the mother substrate 100.

FIG. 41 is a cross-sectional view showing another configuration example of the mother substrate 100.

The configuration example shown in FIG. 41 is different from that shown in FIG. 18 in respect that the inorganic insulating layer 5 has a removed portion LP which overlaps the slope SS1 and the slope SS2 of the organic insulating layer IL. The slope SS1 and the slope SS2 are the slopes of the insulating layer 12. The removed portion LP exposes the slope SS1, the slope SS2 and the upper surface TS2.

In each of the configuration examples shown in FIG. 35 to FIG. 41, a plurality of surrounding partitions 7 are provided so as to overlap the upper surface TS or upper surface TS1 of the organic insulating layer IL, are provided so as to overlap the recess portion DP and have overhang shapes. In each configuration example, distance D1 is greater than or equal to 50 μm, and distance D2 is greater than or equal to 20 μm.

Figure 42:
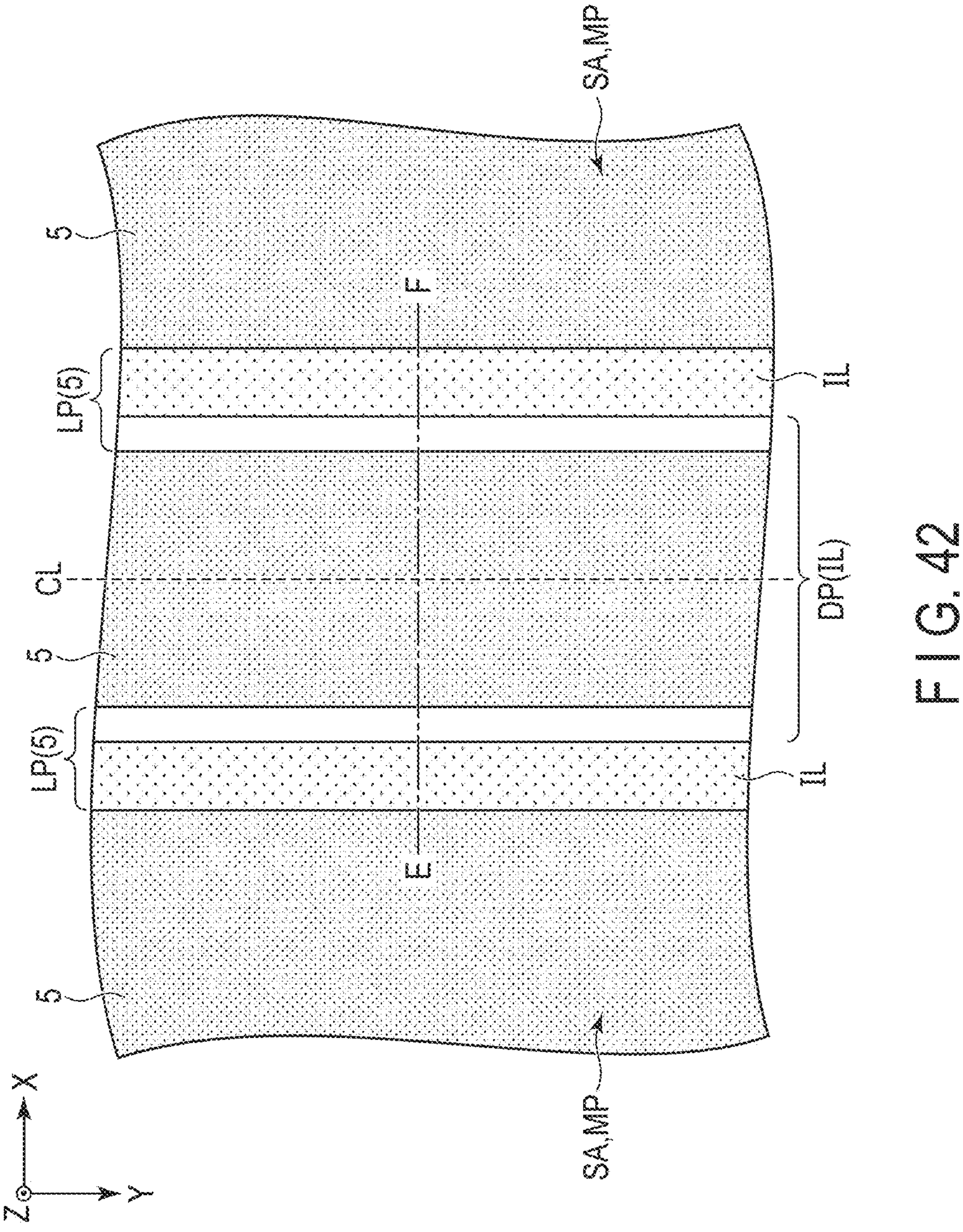
FIG. 42 is a plan view showing another configuration example of the area 100A shown in FIG. 19.

FIG. 42 is a plan view showing another configuration example of the area 100A shown in FIG. 19. Here, in the area 100A, a region including the recess portion DP formed in the surrounding area SA or the margin portion MP is enlarged.

The recess portion DP may be a penetration portion in the organic insulating layer IL or may be a thin portion in the organic insulating layer IL.

The removed portion LP is a penetration portion in the inorganic insulating layer 5. A portion which is close to the recess portion DP in the organic insulating layer IL overlaps the removed portion LP. The organic insulating layer IL overlapping the removed portion LP is exposed from the inorganic insulating layer 5.

Now, this specification explains several configuration examples of the sectional structure of the mother substrate 100 along the E-F line of FIG. 42. In the following configuration examples, main differences are explained.

Figure 43:
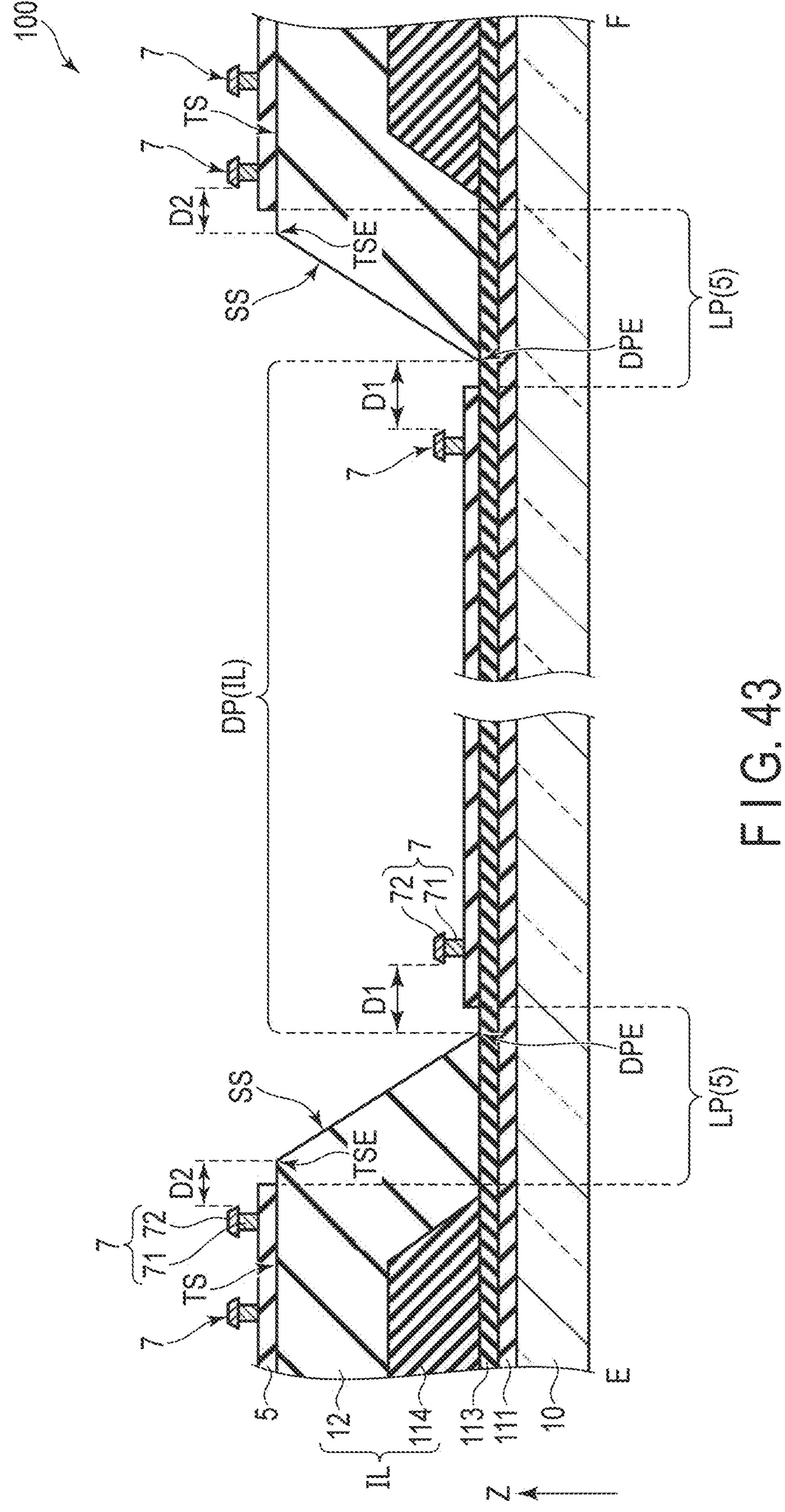
FIG. 43 is a cross-sectional view showing a configuration example of the mother substrate 100.

FIG. 43 is a cross-sectional view showing a configuration example of the mother substrate 100.

The configuration example shown in FIG. 43 is different from that shown in FIG. 20 in respect that the inorganic insulating layer 5 has a removed portion LP which overlaps the slope SS of the organic insulating layer IL.

The organic insulating layer IL has a flat upper surface TS, a recess portion DP which is concave relative to the upper surface TS, and a slope SS which surrounds the recess portion DP. The recess portion DP is a penetration portion in the organic insulating layer IL. The slope SS is the slope of the insulating layer 12.

The inorganic insulating layer 5 is provided on the upper surface TS and is provided on the insulating layer 113 in the recess portion DP. The removed portion LP exposes the slope SS. In the example shown in the figure, the removed portion LP further exposes part of the upper surface TS, the edge portion TSE and the edge portion DPE, and exposes the insulating layer 113 between the edge portion DPE and the inorganic insulating layer 5 in the recess portion DP. The removed portion LP should overlap at least part of the slope SS.

FIG. 44 is a cross-sectional view showing another configuration example of the mother substrate 100.

The configuration example shown in FIG. 44 is different from that shown in FIG. 21 in respect that the inorganic insulating layer 5 has a removed portion LP which overlaps the slope SS of the organic insulating layer IL. The slope SS is the slope of the insulating layer 114. The removed portion LP exposes the slope SS.

Figure 45:
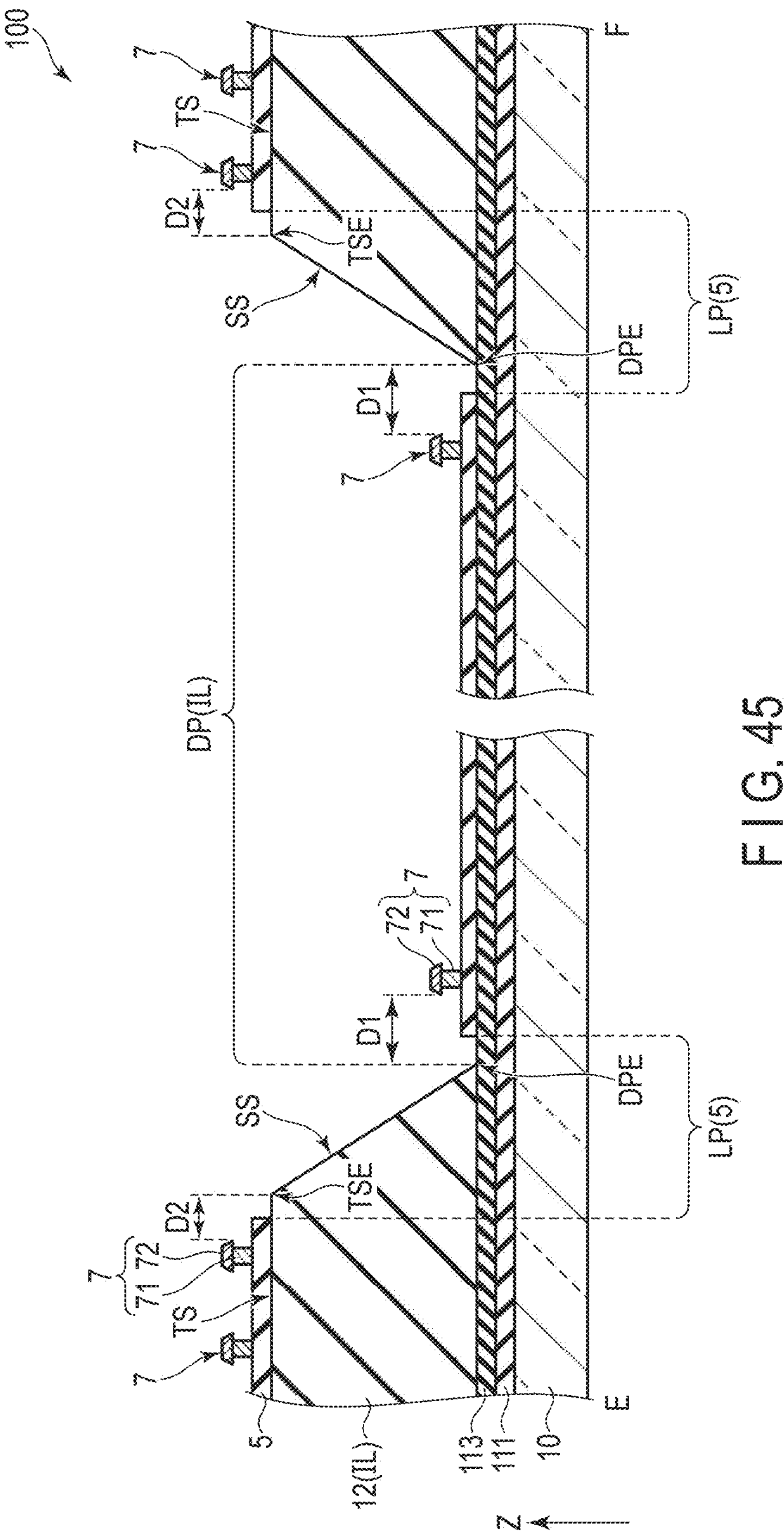
FIG. 45 is a cross-sectional view showing another configuration example of the mother substrate 100.

FIG. 45 is a cross-sectional view showing another configuration example of the mother substrate 100.

The configuration example shown in FIG. 45 is different from that shown in FIG. 22 in respect that the inorganic insulating layer 5 has a removed portion LP which overlaps the slope SS of the organic insulating layer IL. The slope SS is the slope of the insulating layer 12. The removed portion LP exposes the slope SS.

Figure 46:
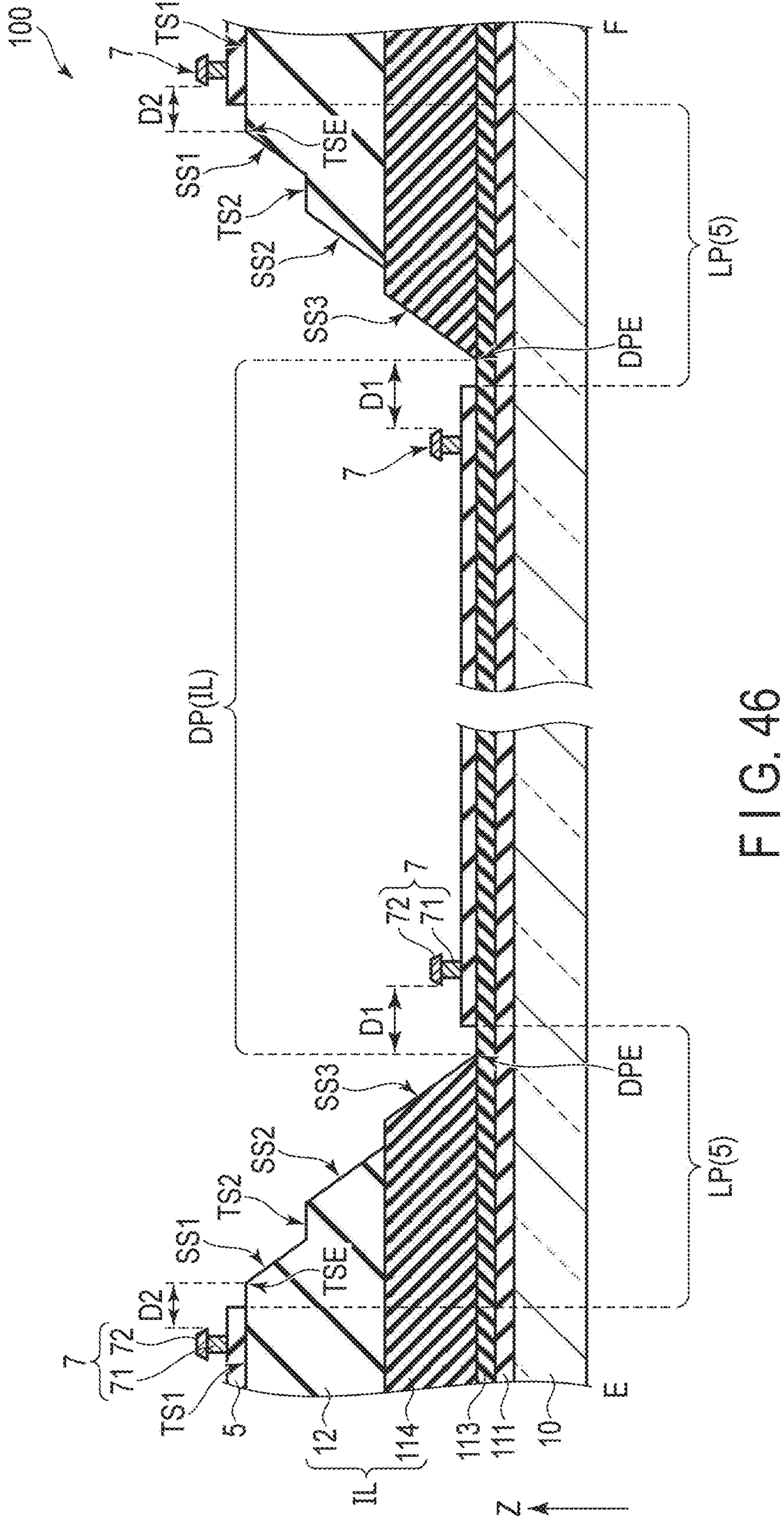
FIG. 46 is a cross-sectional view showing another configuration example of the mother substrate 100.

FIG. 46 is a cross-sectional view showing another configuration example of the mother substrate 100.

The configuration example shown in FIG. 46 is different from that shown in FIG. 23 in respect that the inorganic insulating layer 5 has a removed portion LP which overlaps the slope SS1, the slope SS2 and the slope SS3 of the organic insulating layer IL. The slope SS1 and the slope SS2 are the slopes of the insulating layer 12. The slope SS3 is the slope of the insulating layer 114. The removed portion LP exposes the slope SS1, the slope SS2, the upper surface TS2 and the slope SS3.

Figure 47:
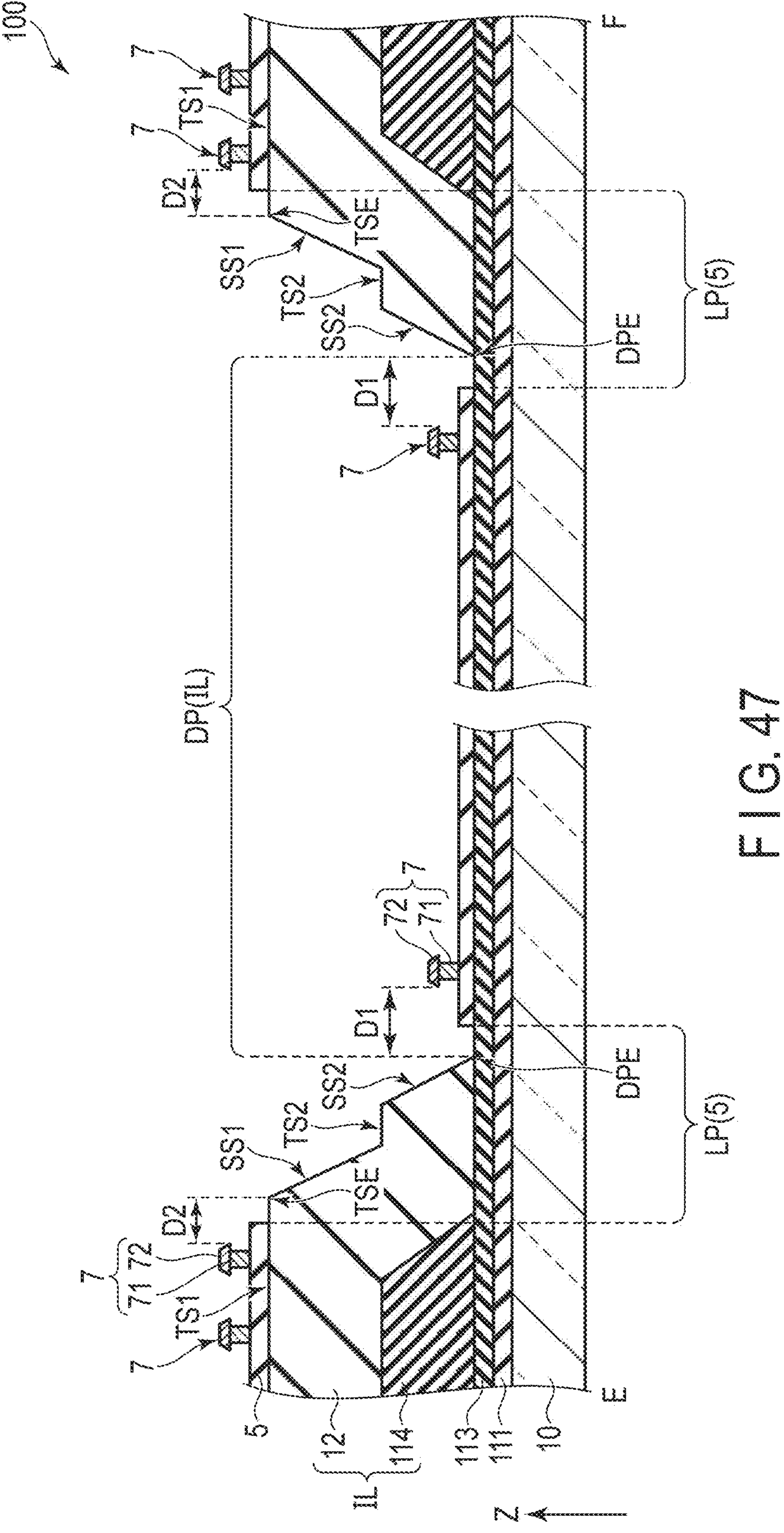
FIG. 47 is a cross-sectional view showing another configuration example of the mother substrate 100.

FIG. 47 is a cross-sectional view showing another configuration example of the mother substrate 100.

The configuration example shown in FIG. 47 is different from that shown in FIG. 24 in respect that the inorganic insulating layer 5 has a removed portion LP which overlaps the slope SS1 and the slope SS2 of the organic insulating layer IL. The slope SS1 and the slope SS2 are the slopes of the insulating layer 12. The removed portion LP exposes the slope SS1, the slope SS2 and the upper surface TS2.

FIG. 48 is a cross-sectional view showing another configuration example of the mother substrate 100.

The configuration example shown in FIG. 48 is different from that shown in FIG. 25 in respect that the inorganic insulating layer 5 has a removed portion LP which overlaps the slope SS1 and the slope SS3 of the organic insulating layer IL. The slope SS1 is the slope of the insulating layer 12. The slope SS3 is the slope of the insulating layer 114. The removed portion LP exposes the slope SS1 and the slope SS3.

FIG. 49 is a cross-sectional view showing another configuration example of the mother substrate 100.

The configuration example shown in FIG. 49 is different from that shown in FIG. 26 in respect that the inorganic insulating layer 5 has a removed portion LP which overlaps the slope SS1 and the slope SS2 of the organic insulating layer IL. The slope SS1 and the slope SS2 are the slopes of the insulating layer 12. The removed portion LP exposes the slope SS1, the slope SS2 and the upper surface TS2.

Figure 50:
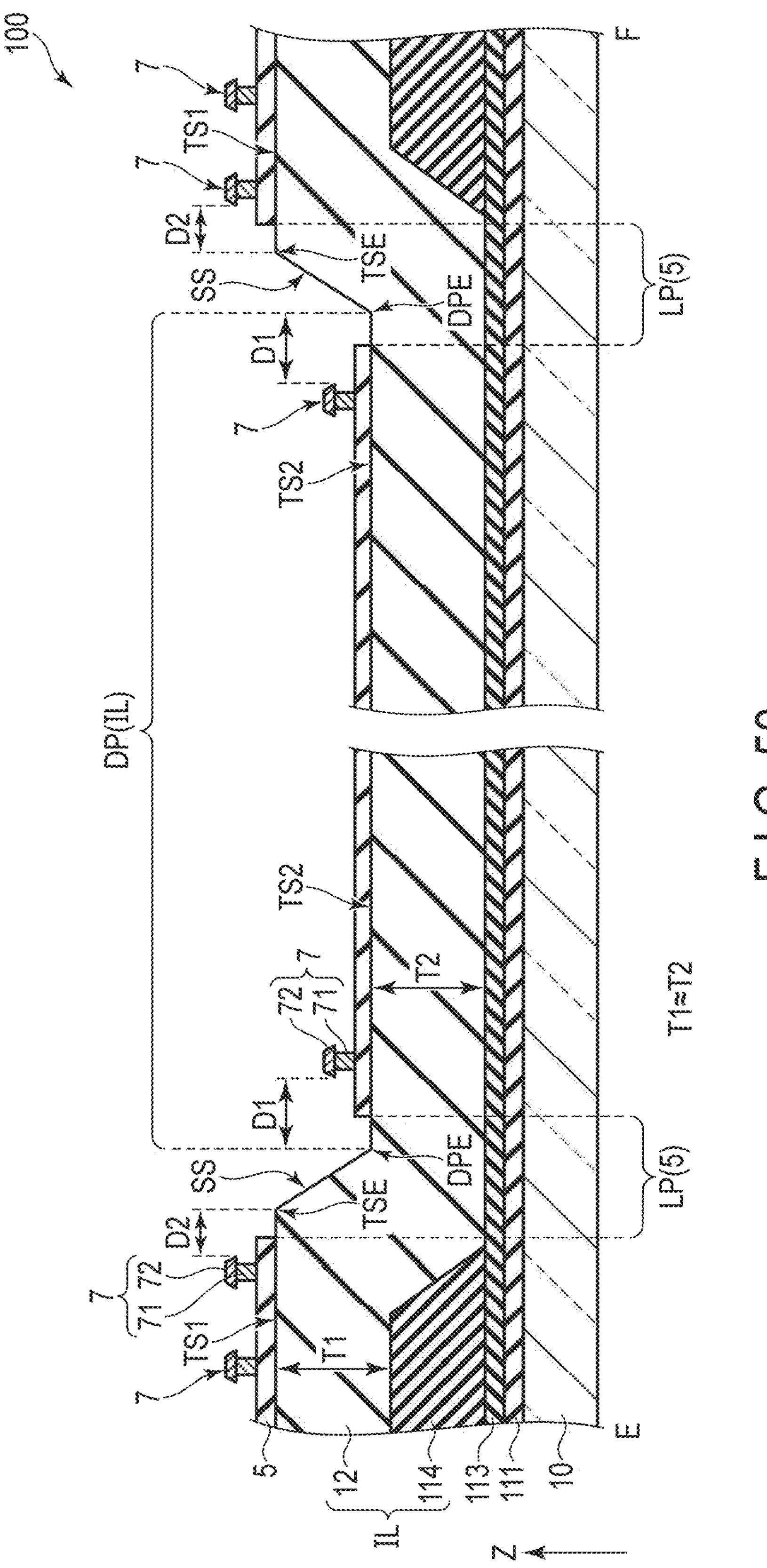
FIG. 50 is a cross-sectional view showing another configuration example of the mother substrate 100.

FIG. 50 is a cross-sectional view showing another configuration example of the mother substrate 100.

The configuration example shown in FIG. 50 is different from that shown in FIG. 27 in respect that the inorganic insulating layer 5 has a removed portion LP which overlaps the slope SS of the organic insulating layer IL. The slope SS is the slope of the insulating layer 12.

The inorganic insulating layer 5 is provided on the upper surface TS1, and is provided on the upper surface TS2 in the recess portion DP. The removed portion LP exposes the slope SS. In the example shown in the figure, the removed portion LP further exposes part of the upper surface TS1, the edge portion TSE and the edge portion DPE, and exposes the upper surface TS2 between the edge portion DPE and the inorganic insulating layer 5 in the recess portion DP. The removed portion LP should overlap at least part of the slope SS.

Figure 51:
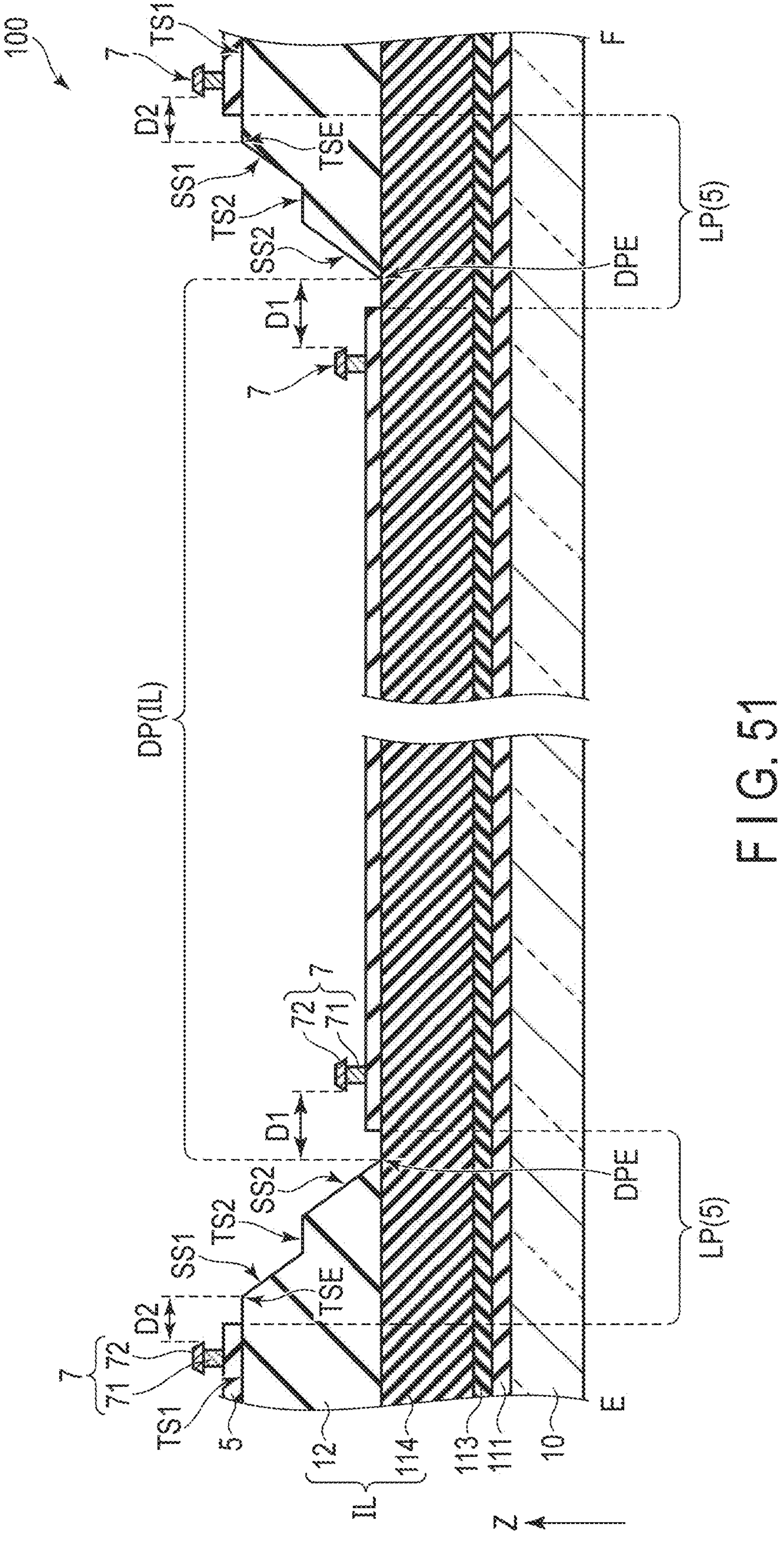
FIG. 51 is a cross-sectional view showing another configuration example of the mother substrate 100.

FIG. 51 is a cross-sectional view showing another configuration example of the mother substrate 100.

The configuration example shown in FIG. 51 is different from that shown in FIG. 28 in respect that the inorganic insulating layer 5 has a removed portion LP which overlaps the slope SS1 and the slope SS2 of the organic insulating layer IL. The slope SS1 and the slope SS2 are the slopes of the insulating layer 12.

The inorganic insulating layer 5 is provided on the upper surface TS1 and is provided on the insulating layer 114 in the recess portion DP. The removed portion LP exposes the slope SS1, the upper surface TS2 and the slope SS2.

Figure 52:
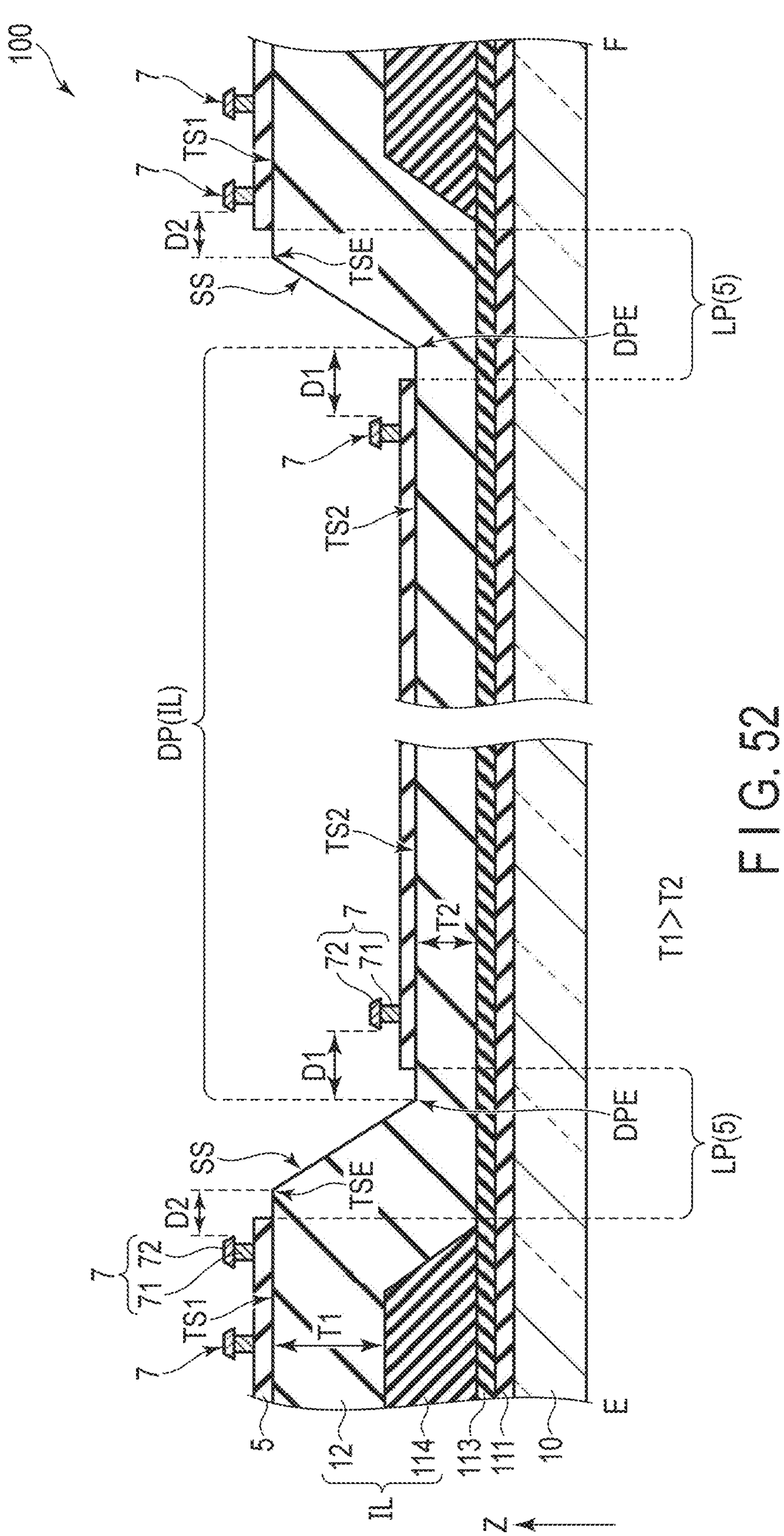
FIG. 52 is a cross-sectional view showing another configuration example of the mother substrate 100.

FIG. 52 is a cross-sectional view showing another configuration example of the mother substrate 100.

The configuration example shown in FIG. 52 is different from that shown in FIG. 29 in respect that the inorganic insulating layer 5 has a removed portion LP which overlaps the slope SS of the organic insulating layer IL. The slope SS is the slope of the insulating layer 12. The removed portion LP exposes the slope SS.

Figure 53:
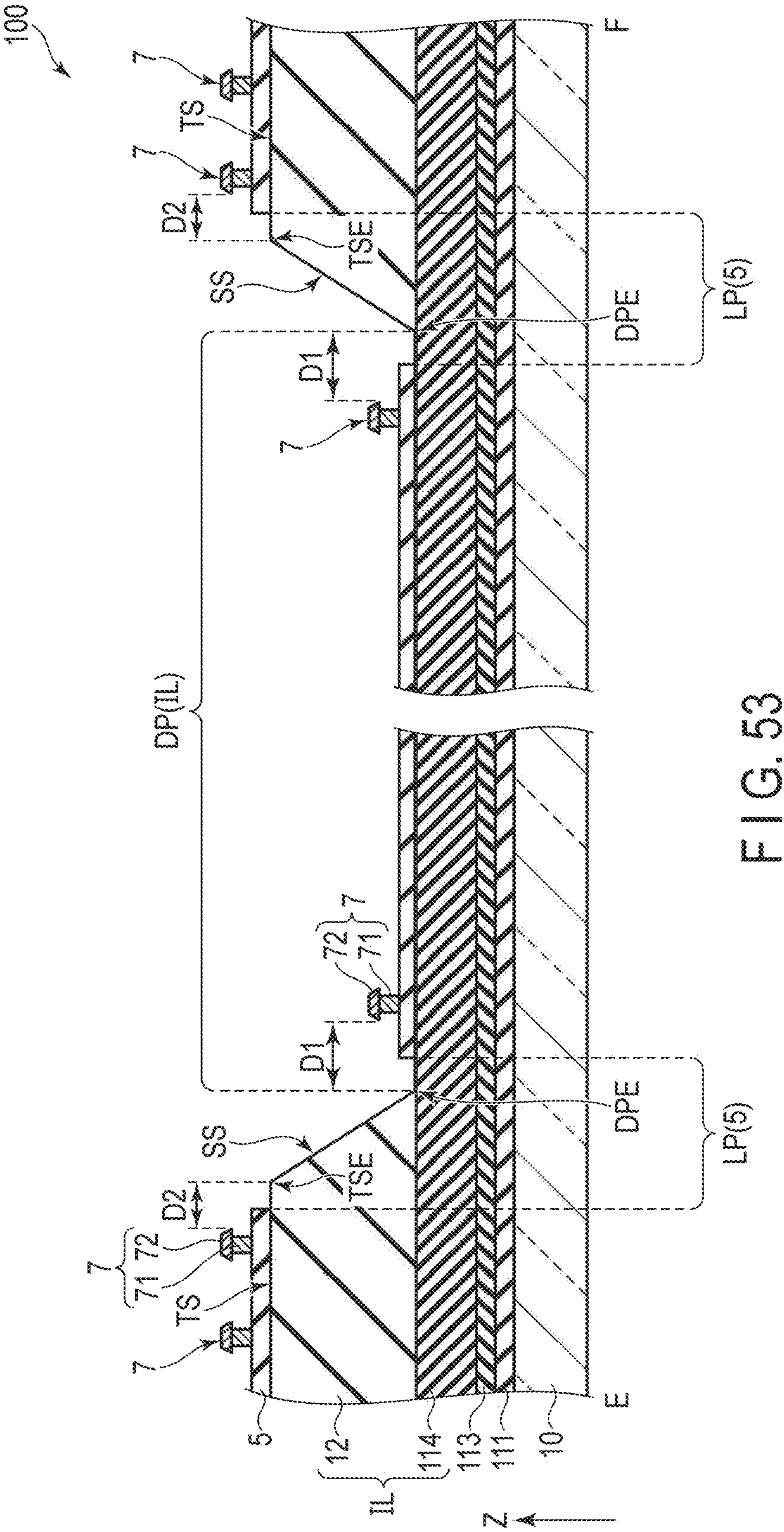
FIG. 53 is a cross-sectional view showing another configuration example of the mother substrate 100.

FIG. 53 is a cross-sectional view showing another configuration example of the mother substrate 100.

The configuration example shown in FIG. 53 is different from that shown in FIG. 30 in respect that the inorganic insulating layer 5 has a removed portion LP which overlaps the slope SS of the organic insulating layer IL. The slope SS is the slope of the insulating layer 12. The removed portion LP exposes the slope SS.

FIG. 54 is a cross-sectional view showing another configuration example of the mother substrate 100.

The configuration example shown in FIG. 54 is different from that shown in FIG. 31 in respect that the inorganic insulating layer 5 has a removed portion LP which overlaps the slope SS of the organic insulating layer IL. The slope SS is the slope of the insulating layer 12. The removed portion LP exposes the slope SS.

Regarding the configuration examples shown in FIG. 43 to FIG. 54, the inorganic insulating layer 5 may have an aperture OP which overlaps the recess portion DP in a manner similar to that of the configuration example shown in FIG. 35.

In each of the configuration examples shown in FIG. 43 to FIG. 54, a plurality of surrounding partitions 7 are provided so as to overlap the upper surface TS or upper surface TS1 of the organic insulating layer IL, are provided so as to overlap the recess portion DP and have overhang shapes. In each configuration example, distance D1 should be preferably greater than or equal to 50 μm, and distance D2 should be preferably greater than or equal to 20 μm.

As explained above, since the inorganic insulating layer 5 has the removed portion LP which overlaps the slope SS, the local concentration of a stress near the edge portion DPE of the recess portion DP can be prevented. This configuration can prevent the inorganic insulating layer 5 from rising from the organic insulating layer IL.

In addition, when the stacked film is formed near the removed portion LP, the rise of the stacked film can be prevented. This effect is explained below.

Figure 55:
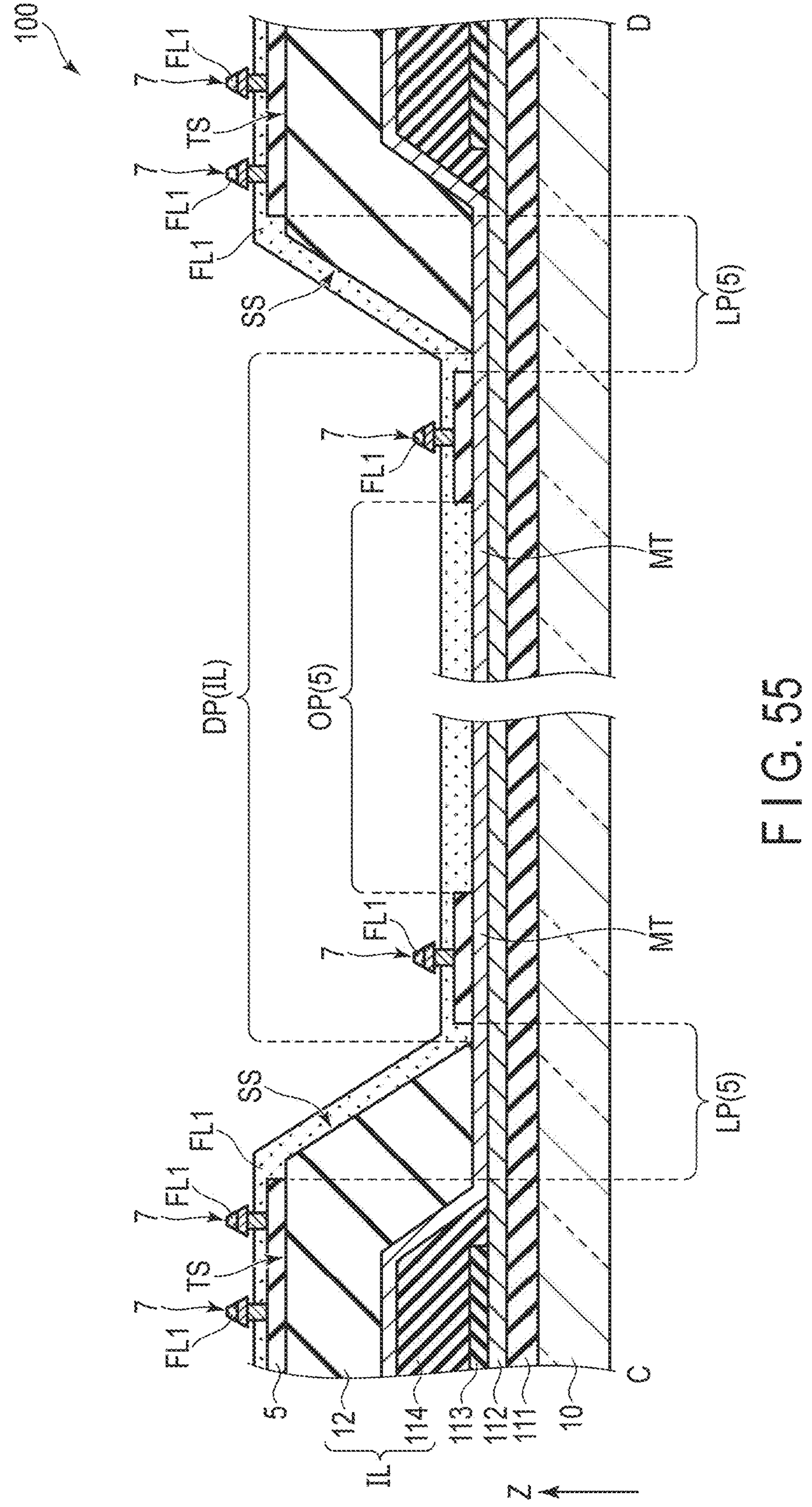
FIG. 55 is a cross-sectional view for explaining a state in which a stacked film FL1 is formed in an area including the removed portion LP shown in FIG. 35.

FIG. 55 is a cross-sectional view for explaining a state in which the stacked film FL1 is formed in an area including the removed portion LP shown in FIG. 35.

For example, in the process of forming the display element DE1 described above, the stacked film FL1 is formed in the margin portion MP and the surrounding area SA in addition to the display area. Here, the stacked film FL1 includes, for example, the organic layer OR1, the upper electrode UE1 and the cap layer CP1 for forming the display element DE1. The stacked film FL1 is formed on the inorganic insulating layer 5 and the surrounding partitions 7, and is further formed on the slope SS of the organic insulating layer IL.

The stacked film FL1 is divided by the surrounding partitions 7 having overhang shapes. The materials which are emitted from evaporation sources when the organic layer OR1, the upper electrode UE1 and the cap layer CP1 are formed by vapor deposition, are blocked by the upper portions 72 of the surrounding partitions 7. Thus, each of the organic layer OR1, the upper electrode UE1 and the cap layer CP1 is partly stacked on the upper portions 72. The organic layer OR1, the upper electrode UE1 and the cap layer CP1 located on the upper portions 72 are spaced apart from the organic layer OR1, the upper electrode UE1 and the cap layer CP1 located around the surrounding partitions 7. By this configuration, the stacked film FL1 is partly divided.

Compared to a case where the stacked film FL1 is not divided by the surrounding partitions 7, the area of the continuous stacked film FL1 is reduced, and a stress which could be generated in the stacked film FL1 is dispersed. Further, the inorganic insulating layer 5 and the stacked film FL1 are pressed by the surrounding partitions 7. This configuration can prevent the rise of the inorganic insulating layer 5 from the organic insulating layer IL and the rise of the stacked film FL1 from the inorganic insulating layer 5. Furthermore, since the concentration of a stress near the edge portion DPE of the recess portion DP is prevented, the rise of the stacked film FL1 from the slope SS can be prevented. In addition, when the sealing layer SE1 is formed on the stacked film FL1, the sealing layer SE1 presses the stacked film FL1 together with the surrounding partitions 7. In this manner, the separation of the stacked film FL1 and the sealing layer SE1 from the inorganic insulating layer 5 can be prevented.

When the organic insulating layer IL has a stepwise cross section in which the thickness decreases toward the recess portion DP, the formation of a steep step is prevented. The elongation of the organic insulating layer IL is less as the organic insulating layer IL is thinner. Thus, when the stacked film FL1 is formed on the organic insulating layer IL, the distortion of the stacked film FL1 is less, and the local concentration of stress can be prevented in the stacked film FL1. By this configuration, the separation of the stacked film FL1 from the inorganic insulating layer 5 or the slope SS can be prevented.

Here, this specification explains problems which could occur when the stacked film FL1 rises from the inorganic insulating layer 5 and is broken. The inorganic insulating layer 5 separated from the organic insulating layer IL and the stacked film FL1 separated from the inorganic insulating layer 5 could float inside the manufacturing device as foreign substances and could be a contaminant source. If the floating foreign substances are attached to the processing substrate, various defects could be caused.

This embodiment can prevent the separation of the inorganic insulating layer 5 and the stacked film FL1. This configuration prevents the contamination of the manufacturing device and the generation of undesired foreign substances. In this manner, the reduction in reliability is prevented.

Even in a case where the stacked film FL1 is replaced by the stacked film FL2 which includes the organic layer OR2, the upper electrode UE2 and the cap layer CP2 for forming the display element DE2, similar effects are obtained.

Further, even in a case where the stacked film FL1 is replaced by the stacked film FL3 which includes the organic layer OR3, the upper electrode UE3 and the cap layer CP3 for forming the display element DE3, similar effects are obtained.

Here, the effect of preventing the separation of the inorganic insulating layer 5 and the stacked film FL1 is explained with respect to the configuration example shown in FIG. 35. In addition, similar effects are obtained with respect to the other configuration examples.

In the above embodiment, for example, in the surrounding partition 7, the lower portion 71 corresponds to a first lower portion, and the upper portion 72 corresponds to a first upper portion. In the partition 6, the lower portion 61 corresponds to a second lower portion, and the upper portion 62 corresponds to a second upper portion. In the organic insulating layer IL, the insulating layer 114 corresponds to a first layer, and the insulating layer 12 corresponds to a second layer.

As explained above, the present embodiment can provide a display device and a mother substrate such that the reduction in reliability can be prevented.

All of the display devices and mother substrates that can be implemented by a person of ordinary skill in the art through arbitrary design changes to the display device and mother substrate described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

Examples of the display device and mother substrate obtained from the configuration disclosed in this specification are additionally described below.

(1)

A display device comprising:

a substrate;

an organic insulating layer provided over a display area displaying an image and a surrounding area on an external side relative to the display area above the substrate;

a lower electrode provided on the organic insulating layer in the display area;

an inorganic insulating layer provided on the organic insulating layer and covering a peripheral portion of the lower electrode;

an organic layer provided on the lower electrode and including a light emitting layer;

an upper electrode provided on the organic layer; and a plurality of surrounding partitions provided in the surrounding area, wherein each of the surrounding partitions has a first lower portion located on the inorganic insulating layer, and a first upper portion located on the first lower portion and protruding from a side surface of the first lower portion, the organic insulating layer has a flat upper surface, a recess portion which is concave relative to the upper surface and a slope which surrounds the recess portion in the surrounding area, the surrounding partitions include a first partition which overlaps the recess portion and a second partition which overlaps the upper surface, and the inorganic insulating layer has a removed portion which overlaps the slope.

(2)

The display device of (1), wherein a distance from the first upper portion of the first partition to an edge portion of the recess portion is greater than or equal to 50 μm, and a distance from the first upper portion of the second partition to an edge portion of the upper surface is greater than or equal to 20 μm.

(3)

The display device of (1), further comprising a metal layer located in the recess portion, wherein the inorganic insulating layer has an aperture which exposes the metal layer.

(4)

A mother substrate comprising:

a panel portion which has a display area displaying an image and a surrounding area on an external side relative to the display area;

a margin portion on an external side relative to the panel portion;

an organic insulating layer provided over the panel portion and the margin portion;

a lower electrode provided on the organic insulating layer in the display area;

an inorganic insulating layer provided on the organic insulating layer and covering a peripheral portion of the lower electrode;

an organic layer provided on the lower electrode and including a light emitting layer;

an upper electrode provided on the organic layer; and a plurality of surrounding partitions provided in the surrounding area and the margin portion, wherein each of the surrounding partitions has a first lower portion located on the inorganic insulating layer and a first upper portion located on the first lower portion and protruding from a side surface of the first lower portion, the organic insulating layer has a flat upper surface, a recess portion which is concave relative to the upper surface and a slope which surrounds the recess portion in the surrounding area or the margin portion, the surrounding partitions include a first partition which overlaps the recess portion and a second partition which overlaps the upper surface, and the inorganic insulating layer has a removed portion which overlaps the slope.

(5)

The mother substrate of (4), wherein a distance from the first upper portion of the first partition to an edge portion of the recess portion is greater than or equal to 50 μm, and a distance from the first upper portion of the second partition to an edge portion of the upper surface is greater than or equal to 20 μm.

(6)

The mother substrate of (4), further comprising a metal layer located in the recess portion, wherein the inorganic insulating layer has an aperture which exposes the metal layer.

What is claimed is:

1. A display device comprising:

a substrate;

an organic insulating layer provided over a display area displaying an image and a surrounding area on an external side relative to the display area above the substrate;

a lower electrode provided on the organic insulating layer in the display area;

an inorganic insulating layer provided on the organic insulating layer and covering a peripheral portion of the lower electrode;

an organic layer provided on the lower electrode and including a light emitting layer;

an upper electrode provided on the organic layer; and a plurality of surrounding partitions provided in the surrounding area, wherein each of the surrounding partitions has a first lower portion located on the inorganic insulating layer, and a first upper portion located on the first lower portion and protruding from a side surface of the first lower portion, the organic insulating layer has a flat upper surface and a recess portion which is concave relative to the upper surface in the surrounding area, the surrounding partitions include a first partition which overlaps the recess portion, and a distance from the first upper portion of the first partition to an edge portion of the recess portion is greater than or equal to 50 μm.

2. The display device of claim 1, wherein the surrounding partitions include a second partition which overlaps the upper surface, and a distance from the first upper portion of the second partition to an edge portion of the upper surface is greater than or equal to 20 μm.

3. The display device of claim 1, wherein the recess portion is a penetration portion in the organic insulating layer.

4. The display device of claim 1, wherein the recess portion is a thin portion in the organic insulating layer.

5. The display device of claim 1, wherein the surrounding partitions include the first partitions which overlaps the recess portion, each of the first partitions is formed into a grating shape in plan view, and the first partitions are spaced apart from each other.

6. The display device of claim 1, further comprising a partition which has a second lower portion provided on the inorganic insulating layer in the display area and formed of a conductive material, and a second upper portion provided on the second lower portion and protruding from a side surface of the second lower portion, wherein the lower electrode, the organic layer and the upper electrode are surrounded by the partition, and the upper electrode is in contact with the second lower portion of the partition.

7. The display device of claim 1, wherein the organic insulating layer has a stepwise cross section in which a thickness decreases toward the recess portion.

8. The display device of claim 1, wherein the organic insulating layer has a first layer and a second layer covering the first layer.

9. The display device of claim 1, wherein the organic insulating layer has a first layer and a second layer provided on the first layer and exposing the first layer which is close to the recess portion.

10. The display device of claim 1, wherein the organic insulating layer is a single-layer body.

11. A mother substrate comprising:

a panel portion which has a display area displaying an image and a surrounding area on an external side relative to the display area;

a margin portion on an external side relative to the panel portion;

an organic insulating layer provided over the panel portion and the margin portion;

a lower electrode provided on the organic insulating layer in the display area;

an inorganic insulating layer provided on the organic insulating layer and covering a peripheral portion of the lower electrode;

an organic layer provided on the lower electrode and including a light emitting layer;

an upper electrode provided on the organic layer; and a plurality of surrounding partitions provided in the surrounding area and the margin portion, wherein each of the surrounding partitions has a first lower portion located on the inorganic insulating layer and a first upper portion located on the first lower portion and protruding from a side surface of the first lower portion, the organic insulating layer has a flat upper surface and a recess portion which is concave relative to the upper surface in the surrounding area or the margin portion, the surrounding partitions include a first partition which overlaps the recess portion, and a distance from the first upper portion of the first partition to an edge portion of the recess portion is greater than or equal to 50 μm.

12. The mother substrate of claim 11, wherein the surrounding partitions include a second partition which overlaps the upper surface, and a distance from the first upper portion of the second partition to an edge portion of the upper surface is greater than or equal to 20 μm.

13. The mother substrate of claim 11, wherein the recess portion is a penetration portion in the organic insulating layer.

14. The mother substrate of claim 11, wherein the recess portion is a thin portion in the organic insulating layer.

15. The mother substrate of claim 11, wherein the surrounding partitions include the first partitions which overlaps the recess portion, each of the first partition is formed into a grating shape in plan view, and the first partitions are spaced apart from each other.

16. The mother substrate of claim 11, further comprising a partition which has a second lower portion provided on the inorganic insulating layer in the display area and formed of a conductive material, and a second upper portion provided on the second lower portion and protruding from a side surface of the second lower portion, wherein the lower electrode, the organic layer and the upper electrode are surrounded by the partition, and the upper electrode is in contact with the second lower portion of the partition.

17. The mother substrate of claim 11, wherein the organic insulating layer has a stepwise cross section in which a thickness decreases toward the recess portion.

18. The mother substrate of claim 11, wherein the organic insulating layer has a first layer and a second layer covering the first layer.

19. The mother substrate of claim 11, wherein the organic insulating layer has a first layer and a second layer provided on the first layer and exposing the first layer which is close to the recess portion.

20. The mother substrate of claim 11, wherein the organic insulating layer is a single-layer body.

* * * * *